(12) United States Patent
Nakano et al.

(10) Patent No.: US 12,080,760 B2
(45) Date of Patent: Sep. 3, 2024

(54) SIC SEMICONDUCTOR DEVICE

(71) Applicant: ROHM CO., LTD., Kyoto (JP)

(72) Inventors: Yuki Nakano, Kyoto (JP); Masatoshi Aketa, Kyoto (JP); Takui Sakaguchi, Kyoto (JP); Yuichiro Nanen, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 463 days.

(21) Appl. No.: 17/263,784

(22) PCT Filed: Aug. 5, 2019

(86) PCT No.: PCT/JP2019/030759
§ 371 (c)(1),
(2) Date: Jan. 27, 2021

(87) PCT Pub. No.: WO2020/031971
PCT Pub. Date: Feb. 13, 2020

(65) Prior Publication Data
US 2021/0305369 A1   Sep. 30, 2021

(30) Foreign Application Priority Data

Aug. 7, 2018 (JP) ................................ 2018-148646

(51) Int. Cl.
*H01L 29/78* (2006.01)
*H01L 29/04* (2006.01)
(Continued)

(52) U.S. Cl.
CPC ........ *H01L 29/0696* (2013.01); *H01L 29/045* (2013.01); *H01L 29/086* (2013.01);
(Continued)

(58) Field of Classification Search
CPC .......... H01L 29/1608; H01L 29/41766; H01L 29/7813
See application file for complete search history.

(56) References Cited

U.S. PATENT DOCUMENTS

2005/0280004 A1   12/2005   Das et al.
2006/0289874 A1   12/2006   Das et al.
(Continued)

FOREIGN PATENT DOCUMENTS

JP   2008503894   2/2008
JP   2008235546   10/2008
(Continued)

OTHER PUBLICATIONS

International Search Report and Written Opinion issued for International Patent Application No. PCT/JP2019/030759, Date of mailing: Nov. 5, 2019, 12 pages including English translation of Search Report.

(Continued)

*Primary Examiner* — Eric A. Ward
(74) *Attorney, Agent, or Firm* — XSENSUS LLP

(57) ABSTRACT

An SiC semiconductor device includes an SiC semiconductor layer having a first main surface and a second main surface, a gate electrode embedded in a trench with a gate insulating layer, a source region of a first conductivity type formed in a side of the trench in a surface layer portion of the first main surface, a body region of a second conductivity type formed in a region at the second main surface side with respect to the source region in the surface layer portion of the first main surface, a drift region of the first conductivity type formed in a region at the second main surface side in the SiC semiconductor layer, and a contact region of the second conductivity type having an impurity concentration (Continued)

of not more than $1.0 \times 10^{20}$ cm$^{-3}$ and formed in the surface layer portion of the first main surface.

18 Claims, 37 Drawing Sheets

(51) Int. Cl.
  *H01L 29/06* (2006.01)
  *H01L 29/08* (2006.01)
  *H01L 29/16* (2006.01)
(52) U.S. Cl.
  CPC ...... *H01L 29/1608* (2013.01); *H01L 29/7805* (2013.01); *H01L 29/7806* (2013.01); *H01L 29/7813* (2013.01)

(56) References Cited

U.S. PATENT DOCUMENTS

| | | | | |
|---|---|---|---|---|
| 2008/0116512 | A1* | 5/2008 | Kawaguchi | H01L 29/66734 257/334 |
| 2008/0230787 | A1 | 9/2008 | Suzuki et al. | |
| 2009/0206924 | A1* | 8/2009 | Zeng | H01L 29/407 257/330 |
| 2011/0121316 | A1* | 5/2011 | Harada | H01L 29/41766 257/77 |
| 2013/0020587 | A1 | 1/2013 | Hino et al. | |
| 2013/0075760 | A1* | 3/2013 | Takaya | H01L 29/407 257/77 |
| 2013/0099251 | A1* | 4/2013 | Hiyoshi | H01L 29/045 257/77 |
| 2013/0137230 | A1* | 5/2013 | Blank | H01L 29/66734 438/270 |
| 2013/0313635 | A1* | 11/2013 | Nakano | H01L 29/0619 257/330 |
| 2015/0221721 | A1* | 8/2015 | Kawakami | H01L 29/872 257/494 |
| 2015/0295048 | A1* | 10/2015 | Hiyoshi | H01L 29/7813 257/77 |
| 2015/0303271 | A1 | 10/2015 | Tanaka et al. | |
| 2016/0071937 | A1 | 3/2016 | Fukui et al. | |
| 2016/0133741 | A1* | 5/2016 | Matsuki | H01L 29/66068 257/77 |
| 2016/0163852 | A1* | 6/2016 | Siemieniec | H01L 29/045 438/237 |
| 2016/0260798 | A1* | 9/2016 | Rupp | H01L 29/4238 |
| 2016/0260829 | A1* | 9/2016 | Aichinger | H01L 29/66719 |
| 2018/0012974 | A1 | 1/2018 | Nakano et al. | |
| 2018/0182886 | A1 | 6/2018 | Kobayashi et al. | |
| 2019/0341308 | A1* | 11/2019 | Urakami | H01L 29/7397 |
| 2019/0386095 | A1* | 12/2019 | Takeuchi | H01L 29/0878 |
| 2019/0386131 | A1* | 12/2019 | Takeuchi | H01L 21/02529 |

FOREIGN PATENT DOCUMENTS

| | | |
|---|---|---|
| JP | 2014082521 | 5/2014 |
| JP | 2015-109474 A | 6/2015 |
| JP | 2015-153960 A | 8/2015 |
| JP | 2018110166 | 7/2018 |
| WO | 2006006964 | 1/2006 |
| WO | 2014103186 | 7/2014 |
| WO | 2014103256 | 7/2014 |
| WO | 2016002083 | 1/2016 |
| WO | 2016080322 | 5/2016 |

OTHER PUBLICATIONS

International Preliminary Report on Patentability issued for International Patent Application No. PCT/JP2019/030759, Date of mailing: Feb. 18, 2021, 22 pages including English translation.
Office Action issued Jul. 13, 2023 in corresponding Japanese Patent Application No. 2020-535763 and English translation thereof, 11 pages.
Notice of Reasons for Refusal issued for Japanese Patent Application No. 2020-535763, Dispatch Date: Mar. 2, 2023, 15 pages including English machine translation.

* cited by examiner

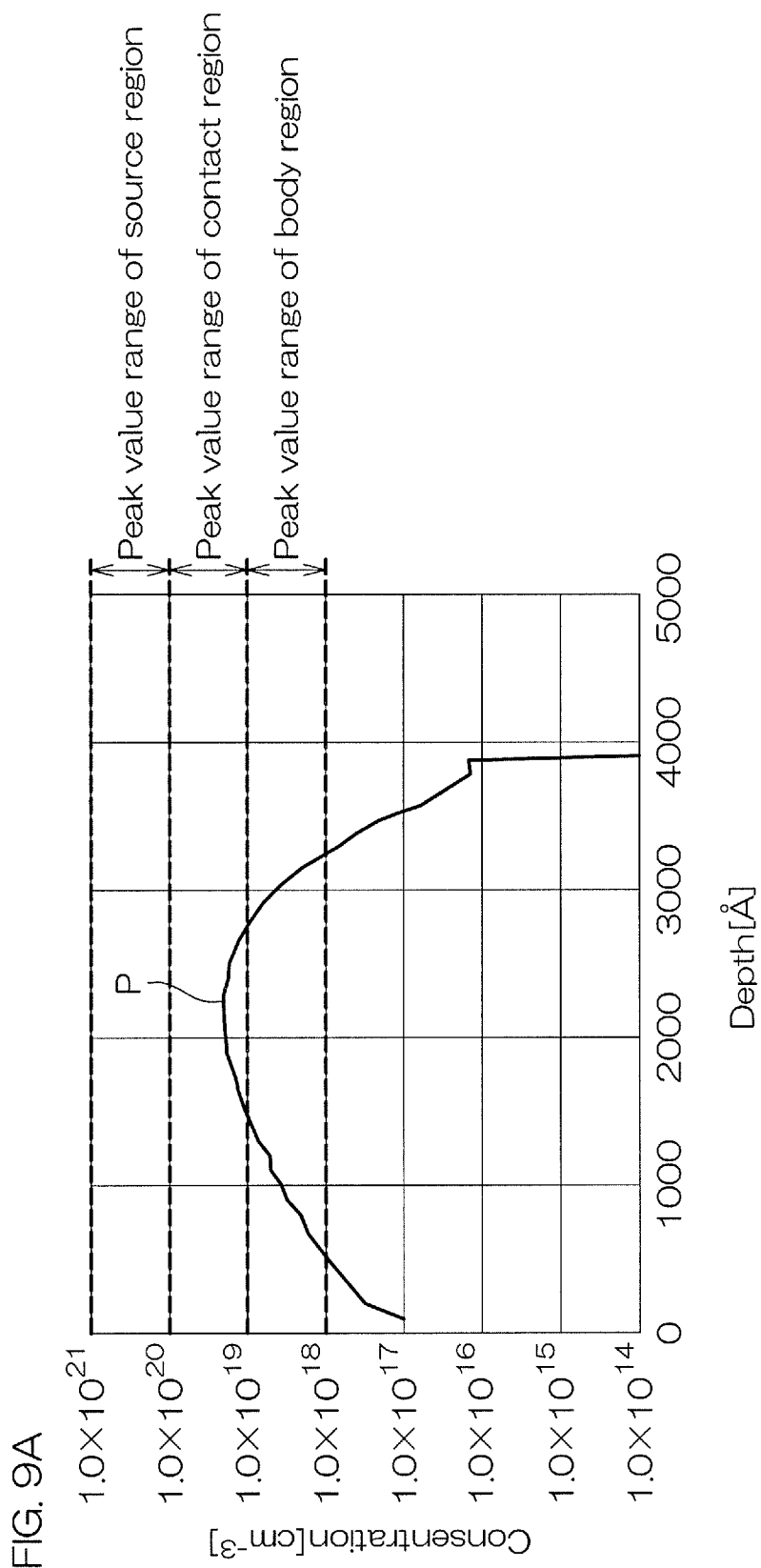

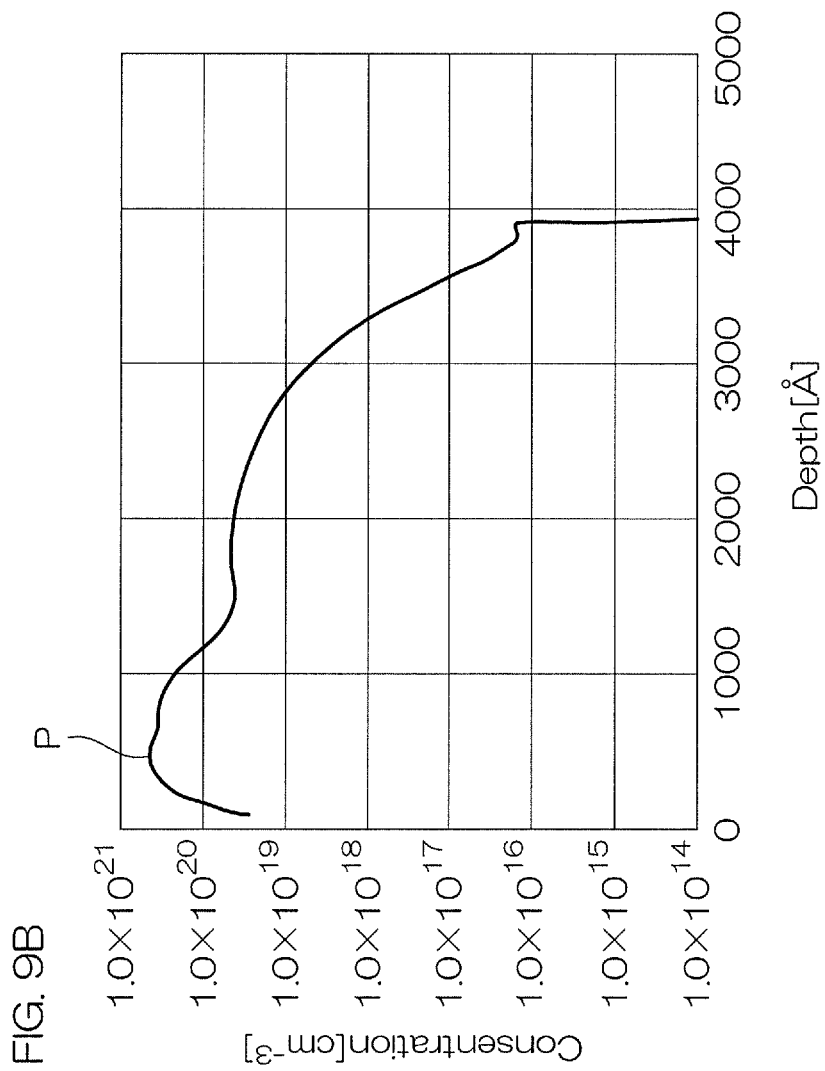

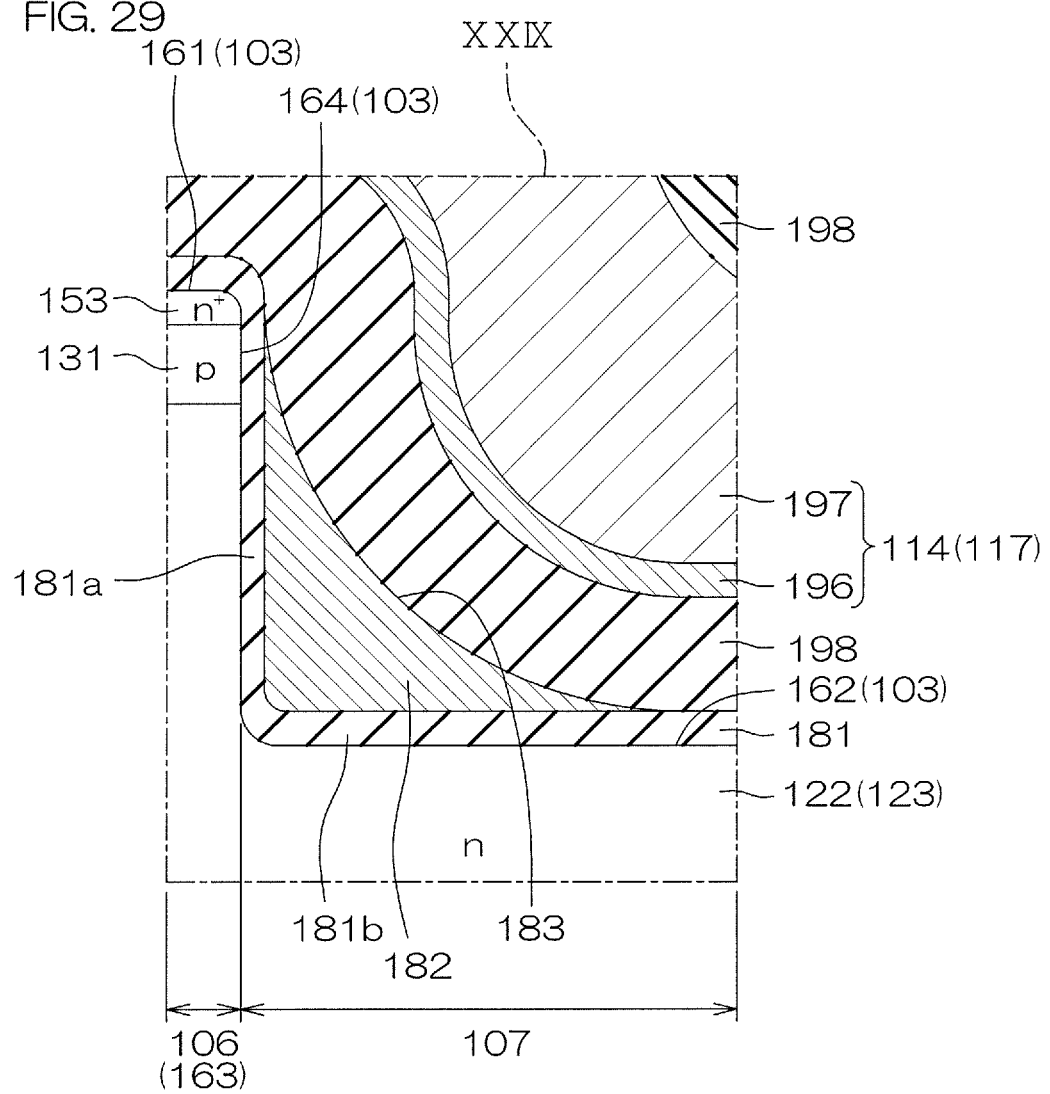

SIC SEMICONDUCTOR DEVICE

TECHNICAL FIELD

The present invention relates to an SiC semiconductor device.

BACKGROUND ART

Patent Literature 1 discloses an SiC semiconductor device including an n type SiC semiconductor layer, a trench, a gate insulating layer, a gate electrode, a p type body region, an $n^+$ type source region, and a $p^+$ type contact region. The trench is formed in the main surface of the SiC semiconductor layer. The gate electrode is embedded in the trench with the gate insulating layer therebetween. The body region is formed in a side of the trench in a surface layer portion of the main surface. The source region is formed in the side of the trench in the surface layer portion of the body region. The contact region is formed in a region at an opposite side of the trench with respect to the source region in the surface layer portion of the body region. The contact region has a p type impurity concentration exceeding the p type impurity concentration of the body region.

CITATION LIST

Patent Literature

Patent Literature 1: Japanese Patent Application Publication No. 2008-235546

SUMMARY OF THE INVENTION

Technical Problem

SiC semiconductor devices suffer from a problem of aging degradation of a gate threshold voltage Vth due to a long-term use. The present inventors have studied the impurity concentration of the contact region and have found that aging characteristics of a gate threshold voltage Vth varies in accordance with the impurity concentration of the contact region.

One preferred embodiment of the present invention provides an SiC semiconductor device that can suppress an aging degradation of a gate threshold voltage Vth.

Solution to Problem

One preferred embodiment of the present invention provides an SiC semiconductor device includes an SiC semiconductor layer having a first main surface on one side and a second main surface on the other side, a trench formed in the first main surface, a gate insulating layer formed on an inner wall of the trench, a gate electrode embedded in the trench with the gate insulating layer therebetween, a source region of a first conductivity type formed in a side of the trench in a surface layer portion of the first main surface, a body region of a second conductivity type formed in a region at the second main surface side with respect to the source region in the surface layer portion of the first main surface, a drift region of the first conductivity type formed in a region at the second main surface side with respect to the body region in the SiC semiconductor layer, and a contact region of the second conductivity type having a second conductivity type impurity concentration of not more than $1.0 \times 10^{20}$ $cm^{-3}$ and formed in a region at an opposite side of the trench with respect to the source region in the surface layer portion of the first main surface.

One preferred embodiment of the present invention provides an SiC semiconductor device having an SiC semiconductor layer having a first main surface on one side and a second main surface on the other side, a trench formed in the first main surface, a gate insulating layer formed on an inner wall of the trench, a gate electrode embedded in the trench with the gate insulating layer therebetween, a source region of a first conductivity type formed in a side of the trench in a surface layer portion of the first main surface, a body region of a second conductivity type formed in a region at the second main surface side with respect to the source region in the surface layer portion of the first main surface, a drift region of the first conductivity type formed in a region at the second main surface side with respect to the body region in the SiC semiconductor layer, and a contact region of the second conductivity type formed in a region at an opposite side of the trench with respect to the source region in a surface layer portion of the first main surface and including first conductivity type impurities and second conductivity type impurities, in which portions of the second conductivity type impurities are cancelled/compensated for by the first conductivity type impurities.

One preferred embodiment of the present invention provides an SiC semiconductor device having an SiC semiconductor layer having a first main surface on one side and a second main surface on the other side, a trench formed in the first main surface, a gate insulating layer formed on an inner wall of the trench, a gate electrode embedded in the trench with the gate insulating layer therebetween, a source region of a first conductivity type formed in a side of the trench in a surface layer portion of the first main surface, a body region of a second conductivity type formed in a region at the second main surface side with respect to the source region in the surface layer portion of the first main surface, a drift region of the first conductivity type formed in a region at the second main surface side with respect to the body region in the SiC semiconductor layer, a contact region of the second conductivity type formed in a region at an opposite side of the trench with respect to the source region in the surface layer portion of the first main surface, and an electrode layer formed on the first main surface to form an Ohmic contact with the source region and form a Schottky junction with the contact region.

According to the SiC semiconductor devices above, an aging degradation of a gate threshold voltage Vth can be suppressed.

The aforementioned as well as other objects, features, and advantageous effects of the present invention will be made clear by the following description of preferred embodiments with reference to the accompanying drawings.

BRIEF DESCRIPTION OF DRAWINGS

FIG. 9A is a graph for describing a first example of a p type impurity concentration of a contact region shown in FIG. 7.

FIG. 9B is a graph for describing a p type impurity concentration of a contact region according to a reference example.

FIG. 28-2 is a variation of the structure depicted in FIG. 28.

FIG. 29-2 is a variation of the structure depicted in FIG. 29.

DESCRIPTION OF EMBODIMENTS

Figure 1:
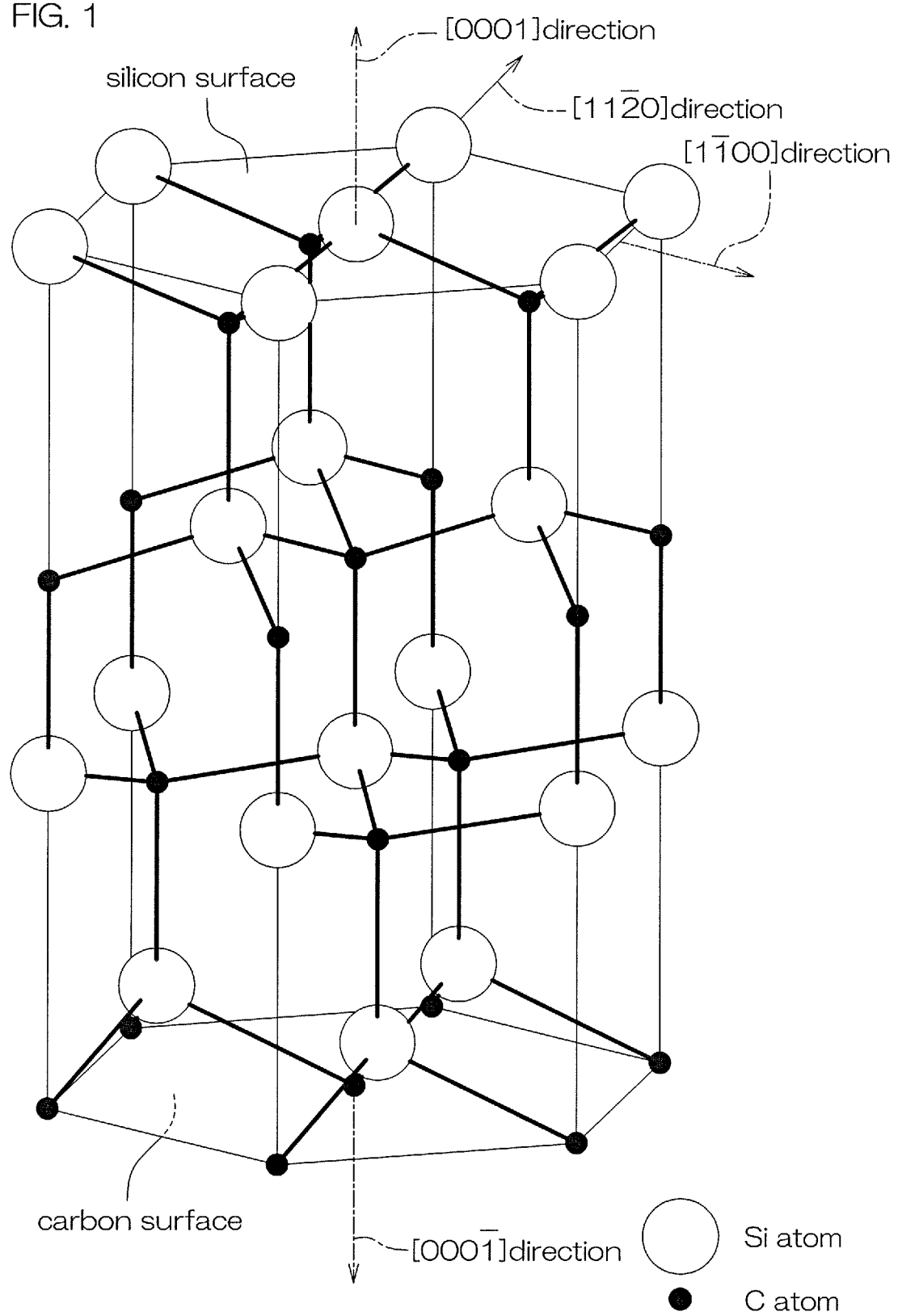
FIG. 1 FIG. 1 shows a unit cell of a 4H—SiC monocrystal.
Figure 2:
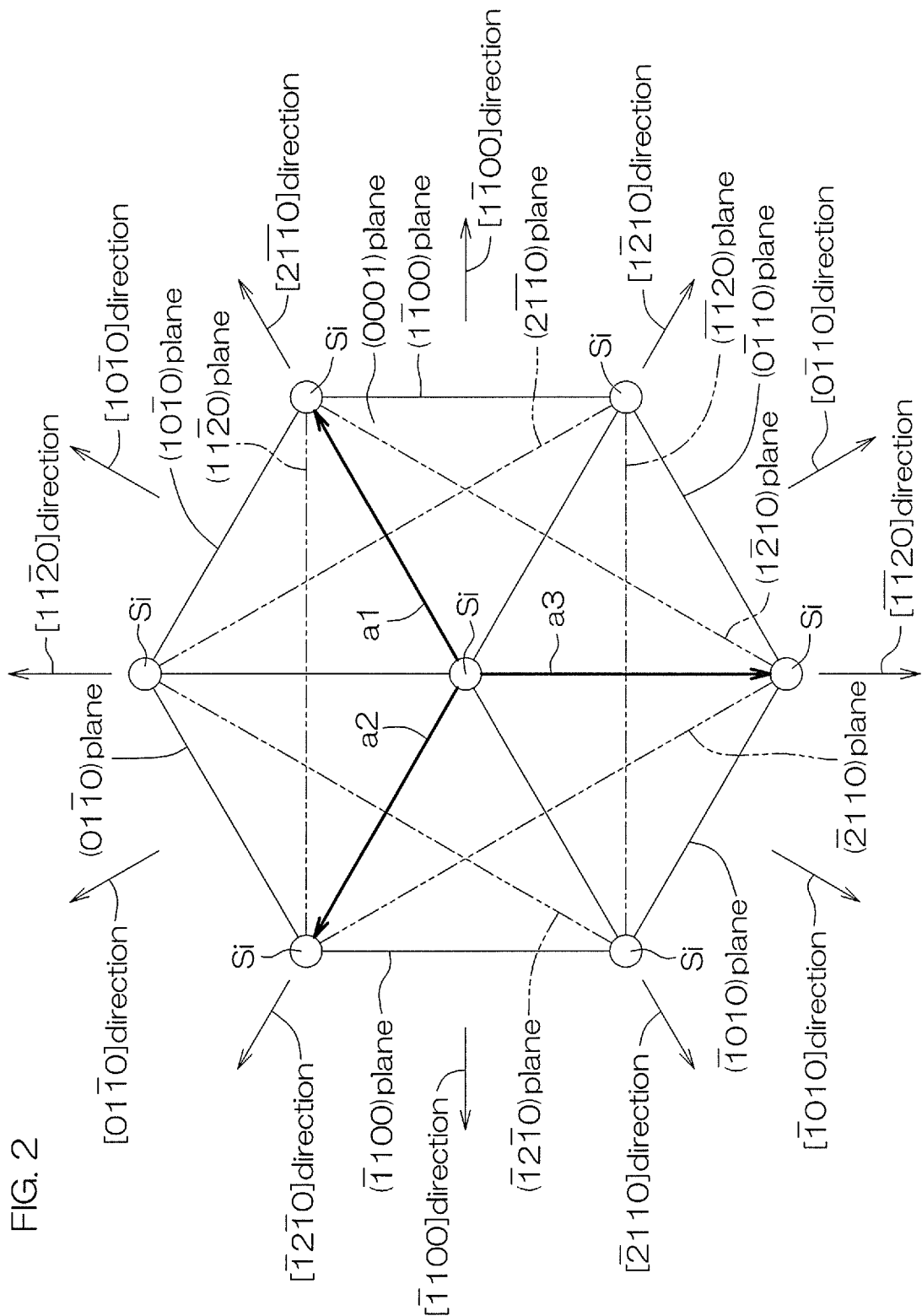
FIG. 2 is a plan view showing a silicon plane of the unit cell shown in FIG. 1.

FIG. 1 shows a unit cell of a 4H—SiC monocrystal (hereinafter simply referred to as "unit cell"). FIG. 2 is a plan view showing a silicon plane of the unit cell shown in FIG. 1.

In the preferred embodiments of the present invention, examples where a 4H—SiC monocrystal as an example of a hexagonal SiC monocrystal is applied shall be described. The hexagonal SiC monocrystal has various polytypes including a 2H (Hexagonal)—SiC monocrystal, a 4H—SiC monocrystal, and a 6H—SiC monocrystal in accordance with a periodic atomic arrangement. The preferred embodiments of the present invention are not intended to exclude polytypes other than the 4H—SiC monocrystal.

With reference to FIG. 1 and FIG. 2, the unit cell includes a tetrahedral structure in which four C atoms are bonded to one S1 atom in a tetrahedrally arranged relationship. The unit cell has an atomic arrangement in which the tetrahedral structures are stacked in a four-layer period. The unit cell has a hexagonal prism structure having a hexagonal silicon plane, a hexagonal carbon plane, and six side planes that connect the silicon plane and the carbon plane.

The silicon plane is a termination plane terminated by S1 atoms. In the silicon plane, a single S1 atom is positioned at each of six vertices of the hexagon and a single Si atom is positioned at a center of the hexagon. The carbon plane is a termination plane terminated by C atoms. In the carbon plane, a single C atom is positioned at each of six vertices of the hexagon and a single C atom is positioned at a center of the hexagon.

Crystal planes of the unit cell are formed by four coordinate axes (a1, a2, a3, c) including a1-axis, a2-axis, a3-axis, and c-axis. The value of a3 among the four coordinate axes takes a value of −(a1+a2). The structure of the 4H-SiC monocrystal will hereinafter be described based on the silicon plane.

The a1-axes, the a2-axes, and the a3-axes are respectively set along directions of arrangement of the nearest neighboring S1 atoms (hereinafter simply referred to as "nearest atom directions") based on the S1 atom positioned at the center in plan view of the silicon plane along the c-axis. The a1-axes, the a2-axes, and the a3-axes are set to be shifted by 120° each in conformance to the arrangement of the S1 atoms.

The c-axis is set in a normal direction of the silicon plane based on the S1 atom positioned at the center. The silicon plane is a (0001) plane. The carbon plane is a (000-1) plane. The side planes of the hexagonal prism include six crystal planes along the nearest atom directions in plan view of the silicon plane along the c-axis. More specifically, the side planes of the hexagonal prism include six crystal planes formed by the nearest S1 atoms.

The side planes of the unit cell include a (1-100) plane, a (0-110) plane, a (-1010) plane, a (-1100) plane, a (01-10) plane, and a (10-10) plane in a clockwise manner from a tip of the a1-axis in plan view of the silicon plane along the c-axis.

The diagonal planes of the unit cell not passing through the center include six crystal planes along the directions of intersection of the nearest atom directions in plan view of the silicon plane along the c-axis. The directions of intersection of the nearest atom directions are orthogonal directions of the nearest atom directions when viewed based on the S1 atom positioned at the center. More specifically, the diagonal planes of the hexagonal prism not passing through the center include six crystal planes formed by S1 atoms that are not nearest neighbors The diagonal planes of the unit cell not passing through the center include a (11-20) plane, a (1-210) plane, a (-2110) plane, a (-1-120) plane, a (-12-10) plane, and a (2-1-10) plane in plan view of the silicon plane along the c-axis.

The crystal directions of the unit cell are defined by normal directions of the crystal planes. The normal direction of the (1-100) plane is a [1-100] direction. The normal direction of the (0-110) plane is a [0-110] direction. The normal direction of the (-1010) plane is a [-1010] direction. The normal direction of the (-1100) plane is a [-1100] direction. The normal direction of the (01-10) plane is a [01-10] direction. The normal direction of the (10-10) plane is a [10-10] direction.

The normal direction of the (11-20) plane is a [11-20] direction. The normal direction of the (1-210) plane is a [1-210] direction. The normal direction of the (-2110) plane is a [-2110] direction. The normal direction of the (-1-120) plane is a [-1-120] direction. The normal direction of the (-12-10) plane is a [-12-10] direction. The normal direction of the (2-1-10) plane is a [2-1-10] direction.

The hexagonal prism is six-fold symmetric and has equivalent crystal planes and equivalent crystal directions every 60 degrees. For example, the (1-100) plane, the (0-110) plane, the (-1010) plane, the (-1100) plane, the (01-10) plane, and the (10-10) plane form equivalent crystal planes. Also, the (11-20) plane, the (1-210) plane, the (-2110) plane, the (-1-120) plane, the (-12-10) plane, and the (2-1-10) plane form equivalent crystal planes.

Also, the [1-100] direction, the [0-110] direction, the [-1010] direction, the [-1100] direction, the [01-10] direction, and the [10-10] direction form equivalent crystal directions. Also, the [11-20] direction, the [1-210] direction, the [-2110] direction, the [-1-120] direction, the [-12-10] direction, and the [2-1-10] direction form equivalent crystal directions.

The [0001] direction and the [000-1] direction are called c-axes. The (0001) plane and the (000-1) plane are called c-planes. The [11-20] direction and the [-1-120] direction are called a-axes. The (11-20) plane and the (-1-120) plane are called a-planes. The [1-100] direction and the [-1100] direction are called m-axes. The (1-100) plane and the (-1100) plane are called m-planes.

Figure 3:
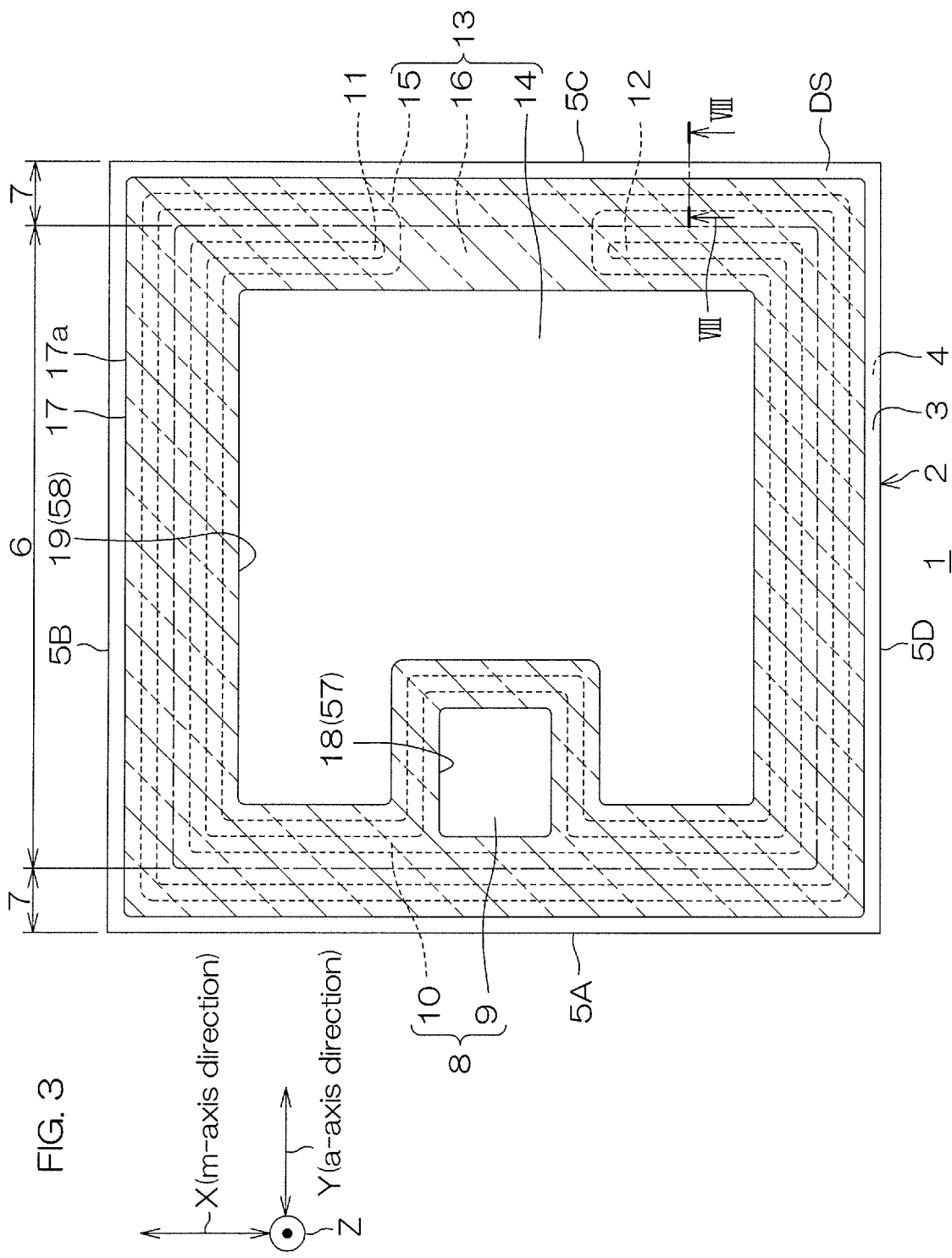
FIG. 3 is a plan view showing an SiC semiconductor device according to a first preferred embodiment of the present invention.
Figure 4:
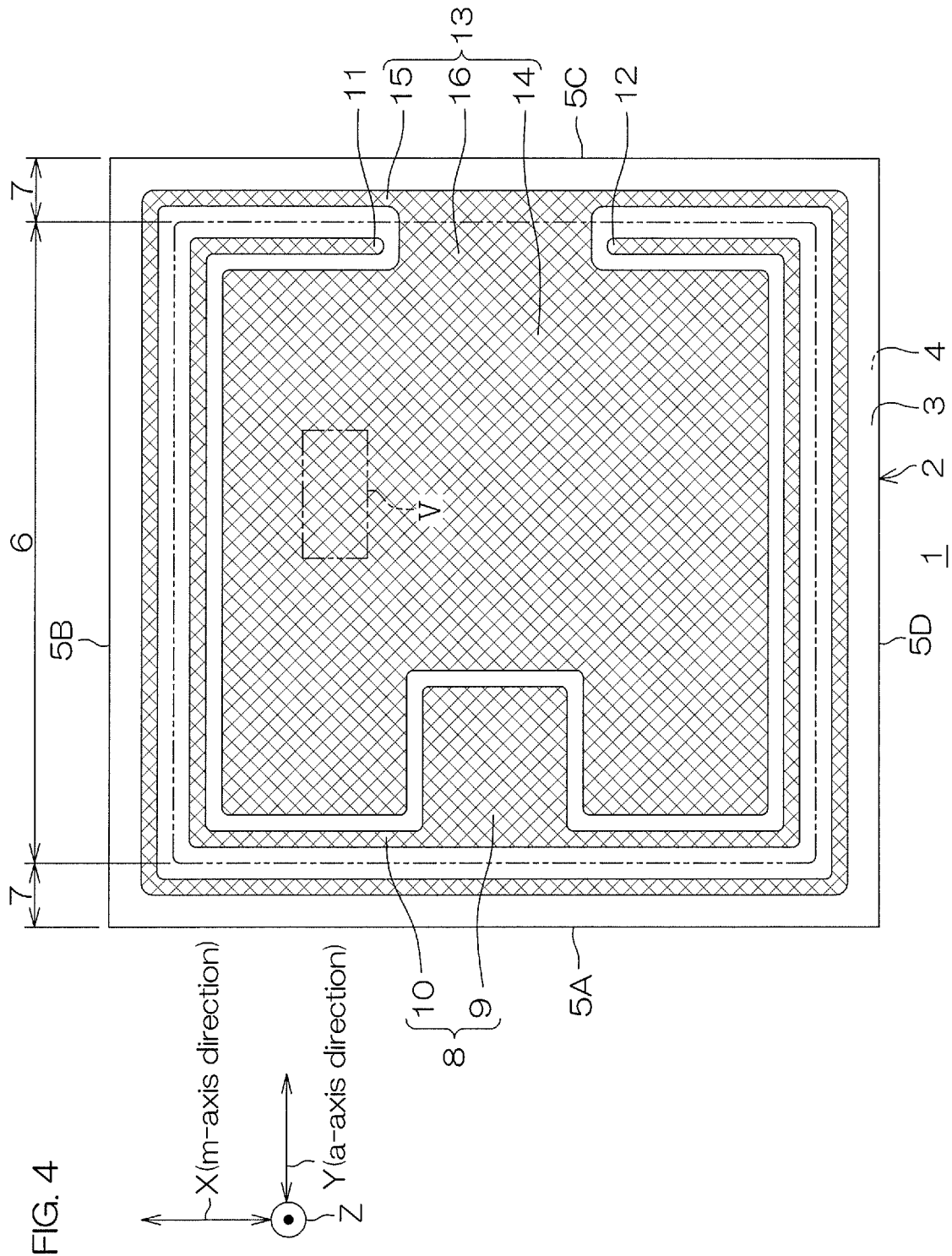
FIG. 4 is a plan view with the resin layer being removed from FIG. 3.

FIG. 3 is a plan view showing an SiC semiconductor device 1 according to a first preferred embodiment of the present invention. FIG. 4 is a plan view with a resin layer 17 being removed from FIG. 3.

With reference to FIG. 3 and FIG. 4, the SiC semiconductor device 1 includes an SiC semiconductor layer 2. The SiC semiconductor layer 2 includes a 4H—SiC monocrystal as an example of the hexagonal SiC monocrystal. The SiC semiconductor layer 2 is formed in a chip shape of rectangular parallelepiped shape.

The SiC semiconductor layer 2 has a first main surface 3 on one side, a second main surface 4 on the other side, and side surfaces 5A, 5B, 5C, 5D connecting the first main surface 3 and the second main surface 4. In this embodiment, the first main surface 3 and the second main surface 4 are each formed in a quadrilateral shape (more specifically, a square shape) in plan view as viewed from normal directions Z thereof (hereinafter simply referred to as "plan view").

The first main surface 3 is an element forming surface in which a semiconductor element is formed. The second main surface 4 may be constituted of a ground surface having grinding marks. In this embodiment, the first main surface 3 and the second main surface 4 face the c-planes of the SiC monocrystal. The first main surface 3 faces the (0001) plane (silicon plane). The second main surface 4 faces the (000-1) plane (carbon plane) of the SiC monocrystal. The first main surface 3 has an off angle θ inclined at an angle not more than 10 degrees in the [11-20] direction with respect to the (0001) plane of the SiC monocrystal. The normal direction Z is inclined by the off angle θ with respect to the c-axis ([0001] direction) of the SiC monocrystal.

The off angle θ may be not less than 0 degrees and not more than 5.0 degrees. The off angle θ may be set within an angular range of not less than 0 degrees and not more than 1.0 degree, not less than 1.0 degree and not more than 1.5 degrees, not less than 1.5 degrees and not more than 2.0 degrees, not less than 2.0 degrees and not more than 2.5 degrees, not less than 2.5 degrees and not more than 3.0 degrees, not less than 3.0 degrees and not more than 3.5 degrees, not less than 3.5 degrees and not more than 4.0 degrees, not less than 4.0 degrees and not more than 4.5 degrees, or not less than 4.5 degrees and not more than 5.0 degrees. The off angle θ may exceed 0 degrees and be less than 4.0 degrees.

The off angle θ may be set within an angular range of not less than 3.0 degrees and not more than 4.5 degrees. In this case, the off angle θ is preferably set within an angular range of not less than 3.0 degrees and not more than 3.5 degrees or not less than 3.5 degrees and not more than 4.0 degrees. The off angle θ may be set within an angular range of not less than 1.5 degrees and not more than 3.0 degrees. In this case, the off angle θ is preferably set within an angular range of not less than 1.5 degrees and not more than 2.0 degrees or not less than 2.0 degrees and not more than 2.5 degrees.

The side surfaces 5A to 5D include, more specifically, a first side surface 5A, a second side surface 5B, a third side surface 5C, and a fourth side surface 5D. In this embodiment, the first side surface 5A and the third side surface 5C extend in a first direction X and oppose each other in a second direction Y intersecting the first direction X. In this embodiment, the second side surface 5B and the fourth side surface 5D extend in the second direction Y and oppose each other in the first direction X. The second direction Y is, more specifically, a direction orthogonal to the first direction X. The length of the side surfaces 5A to 5D may be not less than 1 mm and not more than 10 mm (e.g. not less than 2 mm and not more than 5 mm).

The side surfaces 5A to 5D may each be formed of a smooth cleavage surface facing one of the crystal planes of the SiC monocrystal. The side surfaces 5A to 5D may each be formed of a grinding surface having grinding marks. In this embodiment, the first direction X is set in the m-axis direction ([1-100] direction) of the SiC monocrystal. The second direction Y is set in the a-axis direction ([11-20] direction) of the SiC monocrystal.

That is, the first side surface 5A and the third side surface 5C are formed by the a-planes of the SiC monocrystal and oppose each other in the a-axis direction. The first side surface 5A is formed by the (−1-120) plane of the SiC monocrystal. The third side surface 5C is formed by the (11-20) plane of the SiC monocrystal. Also, the second side surface 5B and the fourth side surface 5D are formed by the m-planes of the SiC monocrystal and oppose each other in the m-axis direction. The second side surface 5B is formed by the (−1100) plane of the SiC monocrystal. The fourth side surface 5D is formed by the (1-100) plane of the SiC monocrystal.

The side surface 5A and the side surface 5C may form inclined surfaces that, when a normal to the first main surface 3 is taken as a basis, are inclined toward the c-axis direction ([0001] direction) of the SiC monocrystal with respect to the normal. That is, the side surface 5A and the side surface 5C may be inclined at an angle in accordance with the off angle θ with respect to the normal to the first main surface 3 when the normal to the first main surface 3 is 0 degrees. The angle in accordance with the off angle θ may be equal to the off angle θ or may be an angle that exceeds 0 degrees and is less than the off angle θ.

The SiC semiconductor layer 2 includes an active region 6 and an outer region 7. The active region 6 is a region in which a vertical MISFET (Metal Insulator Semiconductor Field Effect Transistor) is formed. The active region 6 is formed in a central portion of the SiC semiconductor layer 2 at an interval from the side surfaces 5A to 5D to an inner region in plan view. The active region 6 is formed in a quadrilateral shape having four sides in parallel to the side surfaces 5A to 5D in plan view.

The outer region 7 is a region at an outer side of the active region 6. The outer region 7 is formed in a region between the side surfaces 5A to 5D and the active region 6. The outer region 7 is formed in an endless shape (a quadrilateral annular shape in this embodiment) that surrounds the active region 6 in plan view.

The SiC semiconductor device 1 includes a gate main surface electrode layer 8 as one of first main surface electrode layers formed on the first main surface 3. A gate voltage is applied to the gate main surface electrode layer 8. The gate voltage may be not less than 10 V and not more than 50 V (for example, approximately 30 V). The gate main surface electrode layer 8 includes a gate pad 9 and a gate finger 10. The gate pad 9 and the gate finger 10 are arranged in the active region 6.

The gate pad 9 is formed in a region along the first side surface 5A in plan view. In this embodiment, the gate pad 9 is formed in a region along a central portion of the first side surface 5A in plan view. The gate pad 9 may be formed in a quadrilateral shape in plan view. The gate pad 9 may be formed in a region along a corner portion connecting any two of the side surfaces 5A to 5D in plan view.

The gate finger 10 is led out from the gate pad 9 to extend strip shaped along a peripheral edge of the active region 6. In this embodiment, the gate finger 10 is formed along the three side surfaces 5A, 5B, 5D such as to demarcate an inner region of the active region 6 from three directions. The gate finger 10 has a pair of open end portions 11, 12. The pair of open end portions 11, 12 are formed in a region opposed to the gate pad 9 with the inner region of the active region 6 therebetween. In this embodiment, the pair of open end portions 11, 12 are formed in a region along the third side surface 5C.

The SiC semiconductor device 1 includes a source main surface electrode layer 13 as one of the first main surface electrode layers formed on the first main surface 3. A source voltage is applied to the source main surface electrode layer 13. The source voltage may be a reference voltage (e.g. GND voltage). In this embodiment, the source main surface electrode layer 13 includes a source pad 14, a source routing wiring 15, and a source connection portion 16.

The source pad 14 is formed in the active region 6 at an interval from the gate main surface electrode layer 8. The source pad 14 covers a C-shaped (inverted C-shaped in FIG. 3 and FIG. 4) region demarcated by the gate pad 9 and the gate finger 10. The source pad 14 is formed in a C shape (inverted C shape in FIG. 3 and FIG. 4) in plan view.

The source routing wiring 15 is formed in the outer region 7. The source routing wiring 15 extends in a band shape along the active region 6. In this embodiment, the source routing wiring 15 is formed in an endless shape (a quadrilateral annular shape in this embodiment) that surrounds the active region 6 in plan view. The source routing wiring 15 is electrically connected to the SiC semiconductor layer 2 in the outer region 7.

The source connection portion 16 connects the source pad 14 and the source routing wiring 15. The source connection portion 16 is arranged in a region between the pair of open end portions 11, 12 of the gate finger 10. The source connection portion 16 extends from the source pad 14 across a boundary region between the active region 6 and the outer region 7 and is connected to the source routing wiring 15.

The MISFET formed in the active region 6 structurally includes an npn type parasitic bipolar transistor. When an avalanche current generated in the outer region 7 flows into the active region 6, the parasitic bipolar transistor is turned on. In this case, control of the MISFET may become unstable, for example, due to latchup.

Hence, with the SiC semiconductor device 1, the structure of the source main surface electrode layer 13 is used to form an avalanche current absorbing structure arranged that absorbs the avalanche current generated in the outer region 7. More specifically, the avalanche current generated in the outer region 7 is absorbed by the source routing wiring 15. The avalanche current absorbed by the source routing wiring 15 reaches the source pad 14 through the source connection portion 16.

If a conductive wire (e.g. a bonding wire) for external connection is connected to the source pad 14, the avalanche current is extracted by the conductive wire. Switching of the parasitic bipolar transistor to the on state by an undesirable current generated in the outer region 7 can thereby be suppressed. Latchup can thus be suppressed and therefore stability of control of the MISFET can be improved.

The SiC semiconductor device 1 includes a resin layer 17 formed on the first main surface 3. In FIG. 3, the resin layer 17 is indicated by hatching. The resin layer 17 may include negative-type or positive-type photosensitive resin. In this embodiment, the resin layer 17 includes polybenzoxazole as an example of the positive-type photosensitive resin. The resin layer 17 may include polyimide as an example of the negative-type photosensitive resin.

The resin layer 17 selectively covers the gate main surface electrode layer 8 and the source main surface electrode layer 13. The resin layer 17 includes a gate pad opening 18 and a source pad opening 19. The gate pad opening 18 exposes the gate pad 9. The source pad opening 19 exposes the source pad 14.

A peripheral edge portion 17a of the resin layer 17 is formed at an interval from the side surfaces 5A to 5D to the inner region. The peripheral edge portion 17a of the resin layer 17 thereby demarcates a dicing street DS exposing a peripheral edge portion of the SiC semiconductor layer 2 with the side surfaces 5A to 5D in plan view. The dicing street DS eliminates the need to physically cut the resin layer 17. It is therefore possible to smoothly cut the SiC semiconductor device 1 out of a single SiC semiconductor wafer. The insulation distance from the side surfaces 5A to 5D can also be increased.

The dicing street DS may have a width of not less than 1 μm and not more than 25 μm. The width of the dicing street DS has a direction orthogonal to the direction in which the dicing street DS extends. The dicing street DS may have a width of not less than 1 μm and not more than 5 μm, not less than 5 μm and not more than 10 μm, not less than 10 μm and not more than 15 μm, not less than 15 μm and not more than 20 μm, or not less than 20 μm and not more than 25 μm.

Figure 5:
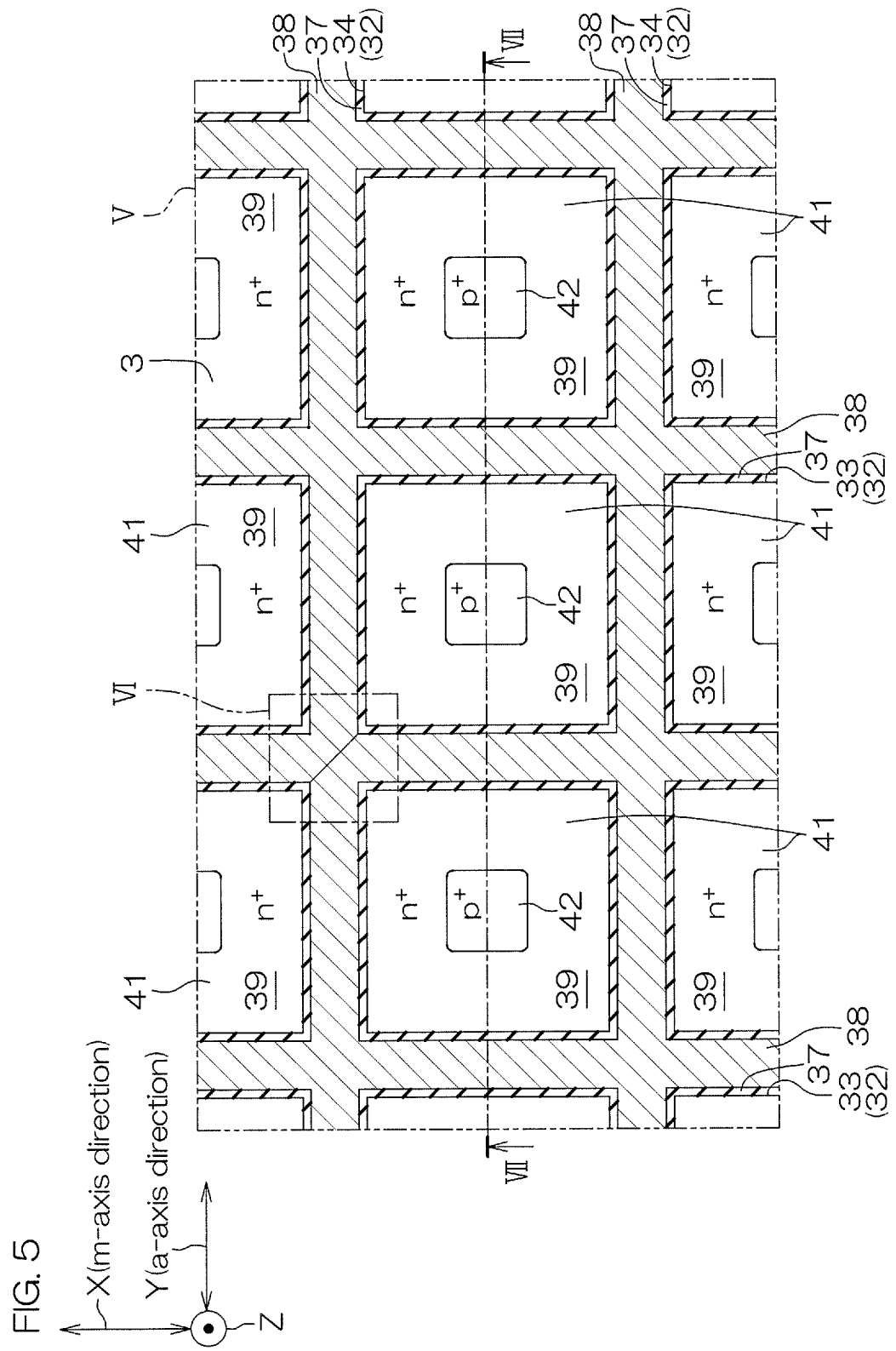
FIG. 5 is an enlarged view of a region V shown in FIG. 4 for describing a structure of a first main surface of an SiC semiconductor layer.
Figure 6:
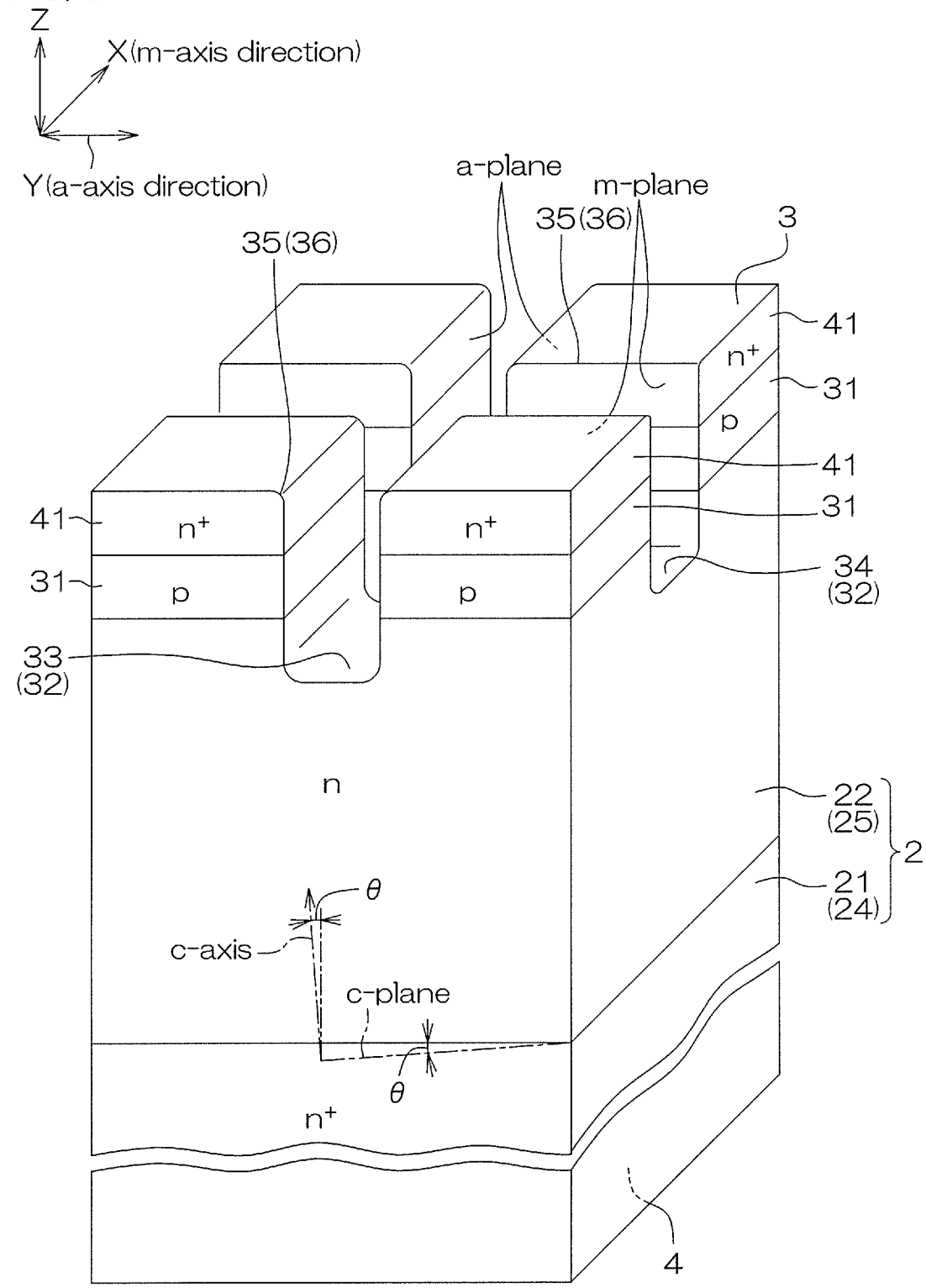
FIG. 6 is a cross-sectional perspective view of a region VI shown in FIG. 5 with structures being removed on the first main surface of the SiC semiconductor layer for describing a structure of a gate trench.
Figure 7:
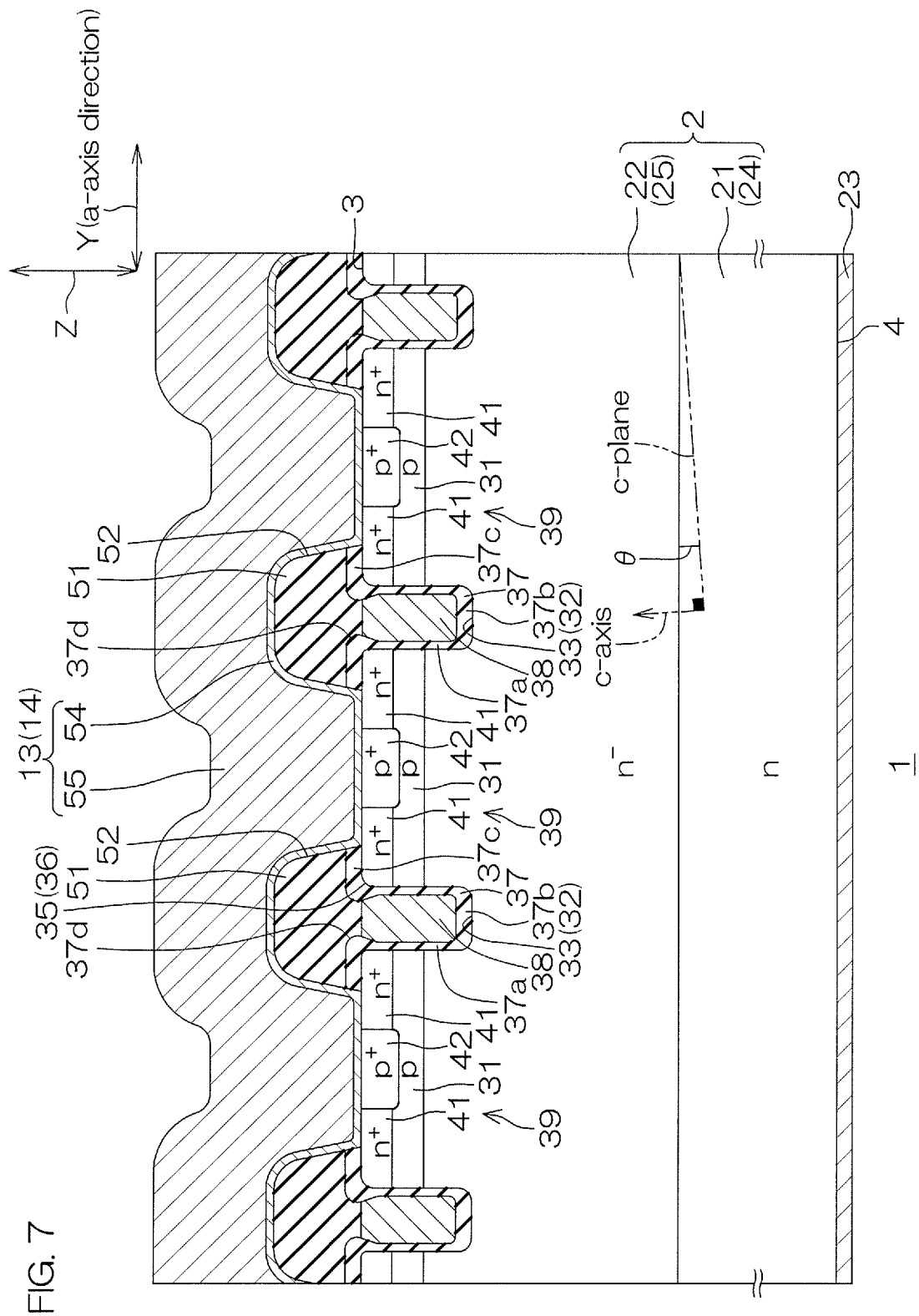
FIG. 7 is a cross-sectional view taken along line VII-VII in FIG. 5.
Figure 8:
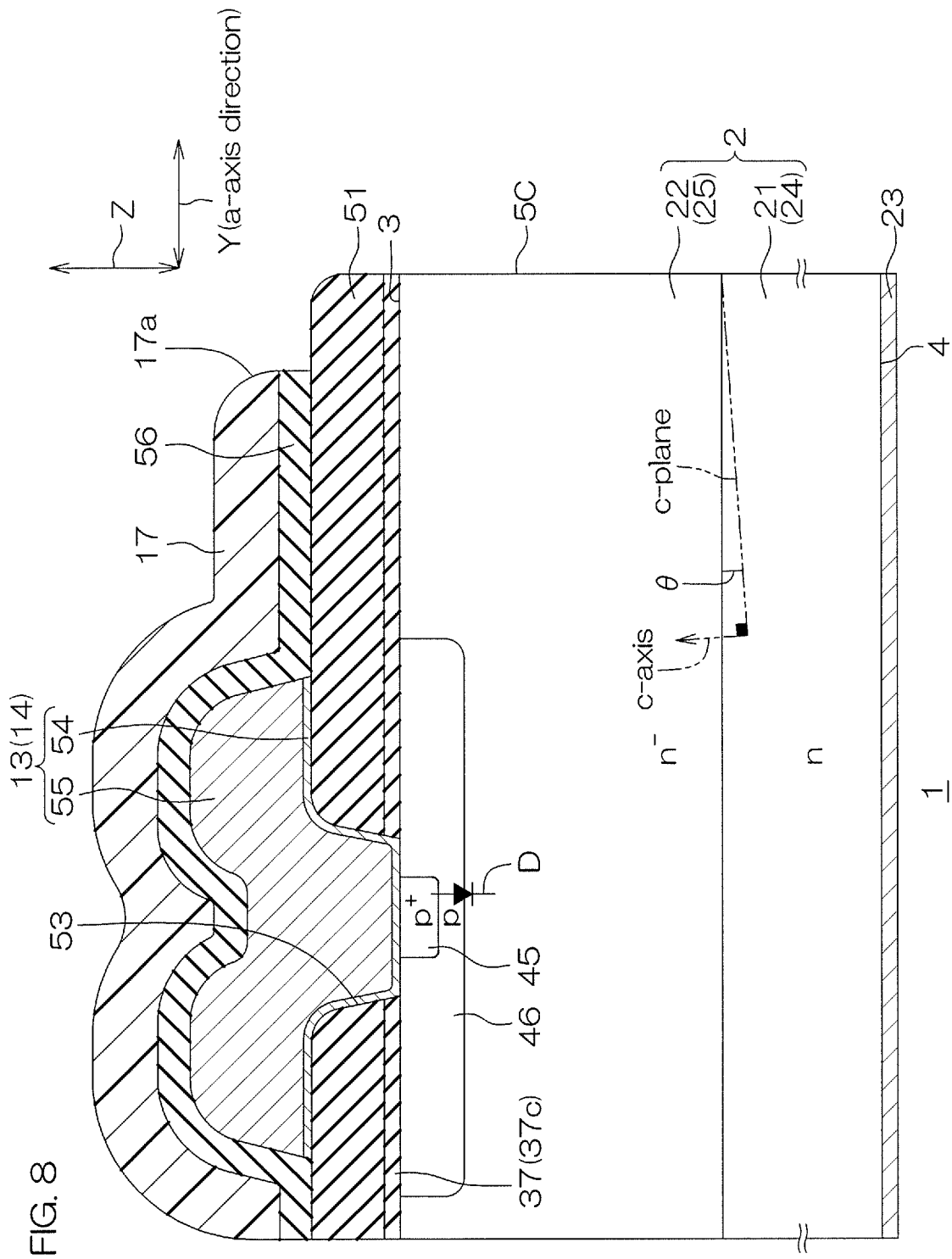
FIG. 8 is a cross-sectional view taken along line VIII-VIII in FIG. 3.

FIG. 5 is an enlarged view of the region V shown in FIG. 4 for describing a structure of the first main surface 3. FIG. 6 is a cross-sectional perspective view with structures being removed on the first main surface 3 for describing the structure of a gate trench 32. FIG. 7 is a cross-sectional view taken along line VII-VII in FIG. 5. FIG. 8 is a cross-sectional view taken along line VIII-VIII in FIG. 3.

With reference to FIG. 5 to FIG. 8, the SiC semiconductor layer 2, in this embodiment, has a layered structure including an n$^+$ type SiC semiconductor substrate 21 and an n type SiC epitaxial layer 22. The SiC semiconductor substrate 21 is formed as a drain region 24 of the MISFET. The SiC epitaxial layer 22 is formed as a drift region 25 of the MISFET. The second main surface 4 is formed by the SiC semiconductor substrate 21. The first main surface 3 is formed by the SiC epitaxial layer 22. The side surfaces 5A to 5D are formed by the SiC semiconductor substrate 21 and the SiC epitaxial layer 22.

The SiC epitaxial layer 22 has an n type impurity concentration not more than an n type impurity concentration of the SiC semiconductor substrate 21. More specifically, the SiC epitaxial layer 22 has the n type impurity concentration less than the n type impurity concentration of the SiC semiconductor substrate 21. The SiC semiconductor substrate 21 may have the n type impurity concentration not less than $1.0\times10^{18}$ cm$^{-3}$ and not more than $1.0\times10^{21}$ cm$^{-3}$. The SiC epitaxial layer 22 may have the n type impurity concentration not less than $1.0\times10^{15}$ cm$^{-3}$ and not more than $1.0\times10^{18}$ cm$^{-3}$.

The SiC semiconductor substrate 21 may have a thickness of not less than 1 μm and less than 1000 μm. The SiC semiconductor substrate 21 may have a thickness of not less than 1 μm and not more than 50 μm, not less than 50 μm and not more than 100 μm, not less than 100 μm and not more than 150 μm, not less than 150 μm and not more than 200 μm, not less than 200 μm and not more than 250 μm, not less than 250 μm and not more than 300 μm, not less than 300 μm and not more than 400 μm, not less than 400 μm and not more than 500 μm, not less than 500 μm and not more than 600 μm, not less than 600 μm and not more than 700 μm, not less than 700 μm and not more than 800 μm, not less than 800 μm and not more than 900 μm, or not less than 900 μm and not more than 1000 μm. The SiC semiconductor substrate 21 preferably has a thickness of not less than 10 μm and not more than 150 μm. By thinning the SiC semiconductor substrate 21, a current path is shortened and reduction of the resistance value can thus be achieved.

The SiC epitaxial layer 22 may have a thickness of not less than 1 μm and not more than 100 μm. The SiC epitaxial layer 22 may have a thickness of not less than 1 μm and not more than 5 μm, not less than 5 μm and not more than 10 μm, not less than 10 μm and not more than 15 μm, not less than 15 μm and not more than 20 μm, not less than 25 μm and not more than 30 μm, not less than 30 μm and not more than 40 μm, not less than 40 μm and not more than 50 μm, not less than 50 μm and not more than 60 μm, not less than 60 μm and not more than 70 μm, not less than 70 μm and not more than 80 μm, not less than 80 μm and not more than 90 μm, or not less than 90 μm and not more than 100 μm. The SiC epitaxial layer 22 preferably has a thickness less than the thickness of the SiC semiconductor substrate 21. The SiC epitaxial layer 22 preferably has a thickness of not less than 5 μm and not more than 15 μm.

The SiC semiconductor device 1 includes a drain electrode layer 23 as a second main surface electrode layer formed on the second main surface 4. The drain electrode layer 23 forms an Ohmic contact with the second main surface 4. A drain voltage is applied to the drain electrode layer 23. The maximum voltage applicable between the source main surface electrode layer 13 and the drain electrode layer 23 in an off state may be not less than 1000 V and not more than 10000 V.

The drain electrode layer 23 may include at least one of Ti layer, Ni layer, Au layer, Ag layer, and Al layer. The drain electrode layer 23 may have a single layer structure including a Ti layer, an Ni layer, an Au layer, an Ag layer, or an Al layer. The drain electrode layer 23 may have a layered structure in which at least two of Ti layer, Ni layer, Au layer, Ag layer, and Al layer are layered in an arbitrary manner. The drain electrode layer 23 may have a layered structure including a Ti layer, an Ni layer, an Au layer, and an Ag layer laminated in this order from the second main surface 4.

The SiC semiconductor device 1 includes a p type body region 31 formed in a surface layer portion of the first main surface 3 in the active region 6. In this embodiment, the body region 31 is formed all over a region in which the active region 6 is formed in the first main surface 3. That is, the body region 31 defines the active region 6.

The body region 31 may have a peak value of a p type impurity concentration of not less than $1.0\times10^{17}$ cm$^{-3}$ and not more than $1.0\times10^{19}$ cm$^{-3}$. The peak value means the maximum value of a concentration gradient (the same will apply hereinafter). If the concentration gradient has a plurality of local maximum values, the peak value means the highest one of the plurality of local maximum values. A lower limit of the peak value of p type impurity concentration of the body region 31 is preferably not less than $1.0\times10^{18}$ cm$^{-3}$.

With reference to FIG. 5 to FIG. 7, the SiC semiconductor device 1 includes a gate trench 32 (trench) formed in the first main surface 3 in the active region 6. In this embodiment, the gate trench 32 is formed in a grid shape in plan view. The gate trench 32 penetrates through the body region 31 and reaches the drift region 25.

The gate trench 32 includes side walls and a bottom wall. The side walls of the gate trench 32 are formed by the m-planes and the a-planes of the SiC monocrystal. That is, the side walls of the gate trench 32 are formed by the (11-20) plane, the (1-100) plane, the (-1-120) plane, and the (-1100) plane.

The gate trench 32 includes, more specifically, a plurality of first gate trenches 33 and a plurality of second gate trenches 34. The plurality of first gate trenches 33 are each formed in a band shape extending in the first direction X (the m-axis direction of the SiC monocrystal) and formed at intervals in the second direction Y (the a-axis direction of the SiC monocrystal). The plurality of first gate trenches 33 are formed in a stripe shape extending in the first direction X in plan view.

The side walls forming long sides of each first gate trench 33 are formed by the a-planes of the SiC monocrystal. The side walls forming short sides of each first gate trench 33 are formed by the m-planes of the SiC monocrystal.

The plurality of second gate trenches 34 are formed at intervals in the first direction X (the m-axis direction of the SiC monocrystal) and each formed in a band shape extending in the second direction Y (the a-axis direction of the SiC monocrystal). The plurality of second gate trenches 34 are formed in a striped shape extending in the second direction Y in plan view.

The side walls forming long sides of each second gate trench 34 are formed by the m-planes of the SiC monocrystal. The side walls forming short sides of each second gate trench 34 are formed by the a-planes of the SiC monocrystal.

The plurality of second gate trenches 34 intersect with the plurality of first gate trenches 33. Thus, the single grid-shaped gate trench 32 is formed in plan view. The gate trench 32 may be formed in a honeycomb shape as an aspect of the grid shape in plan view.

The side walls of the gate trench 32 may extend in the normal direction Z. The side walls of the gate trench 32 may be formed approximately perpendicularly to the first main surface 3. The angle between the side walls of the gate trench 32 and the first main surface 3 inside the SiC semiconductor layer 2 may be not less than 90 degrees and not more than 95 degrees (e.g. not less than 91 degrees and not more than 93 degrees). The gate trench 32 may be formed in a tapered shape with a bottom area being less than an opening area.

The bottom wall of the gate trench 32 is positioned at the drift region 25 (SiC epitaxial layer 22). The bottom wall of the gate trench 32 faces the c-plane of the SiC monocrystal. The bottom wall of the gate trench 32 has the off angle θ inclined in the [11-20] direction with respect to the (0001) plane of the SiC monocrystal. The bottom wall of the gate trench 32 may be formed in parallel to the first main surface 3. The bottom wall of the gate trench 32 may be formed in a convex curved shape toward the second main surface 4.

With reference to FIG. 5 and FIG. 6, an opening edge portion 35 of the gate trench 32 includes an inclined portion 36 that is inclined downwardly from the first main surface 3 toward the inside of the gate trench 32. The opening edge portion 35 of the gate trench 32 is a corner portion connecting the first main surface 3 and the side walls of the gate trench 32. In this embodiment, the inclined portion 36 is formed in a convex curved shape toward the inside of the gate trench 32. The inclined portion 36 may be formed in a concave curved shape toward the inside of the SiC semiconductor layer 2. The inclined portion 36 is arranged to relax a concentration of the electric field in the opening edge portion 35.

Each gate trench 32 may have a depth of not less than 0.5 μm and not more than 3.0 μm in the normal direction Z. The gate trench 32 may have a depth of not less than 0.5 μm and not more than 1.0 μm, not less than 1.0 μm and not more than 1.5 μm, not less than 1.5 μm and not more than 2.0 μm, not less than 2.0 μm and not more than 2.5 μm, or not less than 2.5 μm and not more than 3.0 μm.

The gate trench 32 may have a width of not less than 0.1 μm and not more than 2 μm. The gate trench 32 may have a width of not less than 0.1 μm and not more than 0.5 μm, not less than 0.5 μm and not more than 1.0 μm, not less than 1.0 μm and not more than 1.5 μm, or not less than 1.5 μm and not more than 2 μm.

The SiC semiconductor device 1 includes a gate insulating layer 37 formed on an inner wall of the gate trench 32. The SiC semiconductor device 1 also includes a gate electrode layer 38 (gate electrode) embedded in the gate trench 32 with the gate insulating layer 37 therebetween. In FIG. 5, the gate insulating layer 37 and the gate electrode layer 38 are indicated by hatching.

The gate insulating layer 37 is formed in a film along the inner wall of the gate trench 32 and demarcates a recessed space inside the gate trench 32. The gate insulating layer 37 includes a first region 37a, a second region 37b, and a third region 37c. The first region 37a is formed along the side walls of the gate trench 32. The second region 37b is formed along the bottom wall of the gate trench 32. The third region 37c is formed along the first main surface 3.

The thickness Ta of the first region 37a is less than the thickness Tb of the second region 37b and the thickness Tc of the third region 37c. The ratio of the thickness Tb of the second region 37b to the thickness Ta of the first region 37a (Tb/Ta) may be not less than 2 and not more than 5. The ratio of the thickness Tc of the third region 37c to the thickness Ta of the first region 37a (Tc/Ta) may be not less than 3 and not more than 5. The thickness Ta of the first region 37a may be not less than 0.01 μm and not more than 0.2 μm. The thickness Tb of the second region 37b may be not less than 0.05 μm and not more than 0.5 μm. The thickness Tc of the third region 37c may be not less than 0.05 μm and not more than 0.5 μm.

By making the first region 37a thin, an increase in carriers induced in regions of the body region 31 in vicinities of the side walls of the gate trench 32 can be suppressed. This allows the increase in the channel resistance to be suppressed. Thickening the second region 37b allows the concentration of the electric field to be relaxed in the bottom wall of the gate trench 32.

Thickening the third region 37c allows the withstand voltage of the gate insulating layer 37 to be increased in the vicinity of the opening edge portion 35 of the gate trench 32. Thickening the third region 37c also allows the disappearance of the third region 37c due to an etching method to be suppressed. This further allows the disappearance of the first region 37a due to an etching method to be suppressed. It is therefore possible to make the gate electrode layer 38 appropriately opposed to the SiC semiconductor layer 2 (the body region 31) with the gate insulating layer 37 therebetween.

The gate insulating layer 37 further includes a bulging portion 37d bulging toward the inside of the gate trench 32 at the opening edge portion 35. The bulging portion 37d is formed at a corner portion connecting the first region 37a and the third region 37c. The bulging portion 37d is overhung in a convex curved shape toward the inside of the gate trench 32.

The bulging portion 37d narrows the opening of the gate trench 32 at the opening edge portion 35. The bulging portion 37d increases the dielectric withstand voltage of the gate insulating layer 37 at the opening edge portion 35. The gate insulating layer 37 not having the bulging portion 37d may be formed. The gate insulating layer 37 having a uniform thickness may also be formed.

The gate insulating layer 37 includes at least one of a silicon oxide ($SiO_2$) layer, a silicon nitride (SiN) layer, an aluminum oxide ($Al_2O_3$) layer, a zirconium oxide ($ZrO_2$) layer, and a tantalum oxide ($Ta_2O_3$) layer. The gate insulating layer 37 may have a layered structure including an SiN layer and an $SiO_2$ layer laminated in this order from the first main surface 3 side.

The gate insulating layer 37 may have a layered structure including an $SiO_2$ layer and an SiN layer laminated in this order from the first main surface 3 side. The gate insulating layer 37 may have a single layer structure consisting of an $SiO_2$ layer or an SiN layer. In this embodiment, the gate insulating layer 37 has a single layer structure consisting of an $SiO_2$ layer.

The gate electrode layer 38 is embedded in the recessed space demarcated by the gate insulating layer 37 in the gate trench 32. The gate electrode layer 38 is arranged to be controlled under a gate voltage.

The gate electrode layer 38 may include conductive polysilicon. The gate electrode layer 38 may include n type polysilicon or p type polysilicon as an example of the conductive polysilicon. Alternatively or additionally to the conductive polysilicon, the gate electrode layer 38 may include at least one of tungsten, aluminum, copper, aluminum alloy, and copper alloy.

With reference to FIG. 5 to FIG. 7, the SiC semiconductor device 1 includes a plurality of cell regions 39 demarcated in regions surrounded by the gate trench 32. The plurality of cell regions 39 are arranged in a matrix form at intervals in the first direction X and the second direction Y in plan view. The plurality of cell regions 39 are each formed in a quadrilateral shape in plan view.

If the gate trench 32 is formed in the honeycomb shape in plan view, the plurality of cell regions 39 may each be formed in a hexagonal shape in plan view. In this case, the plurality of cell regions 39 may be arranged in a staggered form at intervals in the first direction X and the second direction Y.

In each cell region 39, the body region 31 is exposed from the side walls of the gate trench 32. In each cell region 39, the body region 31 is exposed from the side walls of the gate trench 32 that is formed by the m-planes and the a-planes of the SiC monocrystal.

The SiC semiconductor device 1 includes an $n^+$ type source region 41 formed in a surface layer portion of the body region 31 in each cell region 39. The source region 41 is formed in a region along the side walls of the gate trench 32 in the surface layer portion of the body region 31. The source region 41 is formed in a band shape extending along the side walls of the gate trench 32 in plan view. More specifically, the source region 41 is formed in an endless shape (a quadrilateral annular shape in this embodiment) that surrounds an inner region of each cell region 39 in plan view.

The source region 41 is exposed from the side walls of the gate trench 32. The source region 41 is exposed from the side walls of the gate trench 32 that is formed by the m-planes and the a-planes of the SiC monocrystal. The source region 41 may have a peak value of an n type impurity concentration of not less than $1.0 \times 10^{18}$ cm$^{-3}$ and not more than $1.0 \times 10^{21}$ cm$^{-3}$. A lower limit of the peak value of the n type impurity concentration of the source region 41 is preferably not less than $1.0 \times 10^{20}$ cm$^{-3}$. The n type impurities of the source region 41 may be phosphorus (P).

The source region 41, the body region 31, and the drift region 25 are thus formed in this order from the first main surface 3 toward the second main surface 4 in a region along the side wall of the gate trench 32 in a surface layer portion of the first main surface 3. A channel of the MISFET is formed in a region along the side wall of the gate trench 32 in the body region 31. The channel is formed along the side wall of the gate trench 32 that is formed by the m-plane and the a-plane of the SiC monocrystal in the body region 31. The ON/OFF of the channel is arranged to be controlled by the gate electrode layer 38.

The SiC semiconductor device 1 includes a $p^+$ type contact region 42 formed in the surface layer portion of the body region 31 in each cell region 39. Each contact region 42 is formed in a region on an opposite side of the gate trench 32 with respect to the source region 41 in each cell region 39. In other words, each contact region 42 is formed in a region opposed to the gate trench 32 with the source region 41 therebetween in each cell region 39.

Each contact region 42 is formed in a central portion of each cell region 39 in plan view. More specifically, each contact region 42 is formed in an inner region surrounded by the source region 41 in each cell region 39. Each contact region 42 is electrically connected to the body region 31 and the source region 41.

In this embodiment, a bottom portion of each contact region 42 is formed in a region between a bottom portion of the body region 31 and a bottom portion of the source region 41. The bottom portion of each contact region 42 may be formed in a region between the first main surface 3 and the bottom portion of the source region 41. Hereinafter, the p type impurity concentration of the contact region 42 will be specifically described with reference to FIG. 9A.

FIG. 9A is a graph for describing a first example of the p type impurity concentration of the contact region 42 shown in FIG. 7. In FIG. 9A, a vertical axis represents the p type impurity concentration, while a horizontal axis represents a distance from the first main surface 3.

FIG. 9A shows the p type impurity concentration of the contact region 42 when p type impurities are introduced into the SiC epitaxial layer 22 (the drift region 25) to form the contact region 42. In this example, the contact region 42 is formed by introducing the p type impurities only once into the SiC epitaxial layer 22 (the drift region 25). The p type impurities of the contact region 42 may be aluminum (Al).

In this embodiment, the p type impurity concentration of the contact region 42 has one peak value P in an intermediate portion in the thickness direction of the SiC semiconductor layer 2. The peak value P is not more than $1.0 \times 10^{20}$ cm$^{-3}$. The peak value P is preferably less than $1.0 \times 10^{20}$ cm$^{-3}$. The peak value P is preferably within a range of not less than $1.0 \times 10^{17}$ cm$^{-3}$ and not more than $1.0 \times 10^{20}$ cm$^{-3}$. The peak value P is further preferably within a range of more than $1.0 \times 10^{17}$ cm$^{-3}$ and less than $1.0 \times 10^{20}$ cm$^{-3}$. The peak value P preferably has a lower limit of not less than $1.0 \times 10^{18}$ cm$^{-3}$. The peak value P further preferably has a lower limit of not less than $1.0 \times 10^{19}$ cm$^{-3}$.

The peak value P may be not less than $1.0 \times 10^{17}$ cm$^{-3}$ and not more than $5.0 \times 10^{17}$ cm$^{-3}$, not less than $5.0 \times 10^{17}$ cm$^{-3}$ and not more than $1.0 \times 10^{18}$ cm$^{-3}$, not less than $1.0 \times 10^{18}$ cm$^{-3}$ and not more than $5.0 \times 10^{18}$ cm$^{-3}$, not less than $5.0 \times 10^{18}$ cm$^{-3}$ and not more than $1.0 \times 10^{19}$ cm$^{-3}$, not less than $1.0 \times 10^{19}$ cm$^{-3}$ and not more than $5.0 \times 10^{19}$ cm$^{-3}$, or not less than $5.0 \times 10^{19}$ cm$^{-3}$ and less than $1.0 \times 10^{20}$ cm$^{-3}$.

In this embodiment, the peak value P is within a range of more than $1.0 \times 10^{19}$ cm$^{-3}$ and less than $3.0 \times 10^{19}$ cm$^{-3}$. In this embodiment, the peak value P is also within a range of more than the peak value of the p type impurity concentration of the body region 31 and less than the peak value of the n type impurity concentration of the source region 41.

The number of introductions of the p type impurities merely adjusting the number of local maximum values, the depth range of the peak value P of the p type impurity concentration of the contact region 42 and/or the like. The contact region 42 may be formed by introducing the p type impurities more than once into the surface layer portion of the SiC epitaxial layer 22 (the drift region 25). In this case, the p type impurities may be introduced into different regions in the thickness direction in the surface layer portion of the SiC epitaxial layer 22 (the drift region 25). That is, the p type impurity concentration of the contact region 42 may have a plurality (two or more) of the peak values P in an intermediate portion in the thickness direction of the SiC semiconductor layer 2.

With reference to FIG. 8, the SiC semiconductor device 1 includes a p⁺ type diode region 45 (impurity region) formed in the surface layer portion of the first main surface 3 in the outer region 7. The diode region 45 is formed at an interval from the active region 6 and the side surfaces 5A to 5D. The diode region 45 extends in a band shape along the active region 6 in plan view. More specifically, the diode region 45 is formed in an endless shape (a quadrilateral annular shape in this embodiment) that surrounds the active region 6 in plan view.

The diode region 45 forms a pn junction with the SiC semiconductor layer 2. More specifically, the diode region 45 is positioned at the SiC epitaxial layer 22 and forms the pn junction with the SiC epitaxial layer 22. A pn junction diode D having the diode region 45 as an anode and the SiC semiconductor layer 2 as a cathode is thereby formed.

The diode region 45 overlaps the source routing wiring 15 in plan view. The diode region 45 is electrically connected to the source routing wiring 15. The diode region 45 forms a part of the avalanche current absorbing structure.

The diode region 45 has a peak value of a p type impurity concentration not more than $1.0 \times 10^{20}$ cm⁻³. The diode region 45 preferably has the peak value of the p type impurity concentration within a range of not less than $1.0 \times 10^{17}$ cm⁻³ and not more than $1.0 \times 10^{20}$ cm⁻³.

The thickness (depth) of the diode region 45 is preferably approximately equal to the thickness (depth) of the contact region 42. The diode region 45 preferably has the p type impurity concentration equal to the p type impurity concentration of the contact region 42. This structure allows the contact region 42 and the diode region 45 to be formed using the same mask.

The diode region 45 may have the p type impurity concentration exceeding the p type impurity concentration of the contact region 42. The diode region 45 may have the p type impurity concentration not more than $1.0 \times 10^{20}$ cm⁻³ and exceeding the p type impurity concentration of the contact region 42.

The diode region 45 may have the p type impurity concentration having the peak value exceeding $1.0 \times 10^{20}$ cm⁻³. The diode region 45 may have the peak value of the p type impurity concentration within a range of more than $1.0 \times 10^{20}$ cm⁻³ and not more than $1.0 \times 10^{21}$ cm⁻³. In this case, while the contact region 42 and the diode region 45 cannot be formed simultaneously, design focusing on characteristics of the pn junction diode D can be made.

In this case, the diode region 45 may have the thickness (depth) different from the thickness (depth) of the contact region 42. The thickness (depth) of the diode region 45 may be not less than the thickness (depth) of the contact region 42 or may be may be less than the thickness (depth) of the contact region 42.

The SiC semiconductor device 1 includes a p type well region 46 formed in the surface layer portion of the first main surface 3 in the outer region 7. The well region 46 is formed at an interval from the active region 6 and the side surfaces 5A to 5D. In this embodiment, the well region 46 is formed in a region overlapping the diode region 45 in plan view. The well region 46 extends in a band shape along the active region 6 in plan view.

More specifically, the well region 46 is formed in an endless shape (a quadrilateral annular shape in this embodiment) that surrounds the active region 6 in plan view. A bottom portion of the well region 46 is positioned at the second main surface 4 side with respect to a bottom portion of the diode region 45. In this embodiment, the well region 46 covers the diode region 45 from the second main surface 4 side.

The well region 46 is electrically connected to the source routing wiring 15 via the diode region 45. The well region 46 overlaps the source routing wiring 15 in plan view. The well region 46 may form a part of the pn junction diode D. The well region 46 may form a part of the avalanche current absorbing structure.

The well region 46 may have a width of not less than a width of the diode region 45. The well region 46 preferably has the width exceeding the width of the diode region 45. The well region 46 may further have a width of not less than the width of the source routing wiring 15. The well region 46 preferably has the width exceeding the width of the source routing wiring 15.

The width of the well region 46 is a width in a direction orthogonal to a direction in which the well region 46 extends. The width of the diode region 45 is a width in a direction orthogonal to a direction in which the diode region 45 extends. The width of the source routing wiring 15 is a width in a direction orthogonal to a direction in which the source routing wiring 15 extends.

The thickness (depth) of the well region 46 is approximately equal to the thickness (depth) of the body region 31. The well region 46 has a peak value of a p type impurity concentration of not less than $1.0 \times 10^{17}$ cm⁻³ and not more than $1.0 \times 10^{19}$ cm⁻³. A lower limit of the peak value of the p type impurity concentration of the well region 46 preferably is not less than $1.0 \times 10^{18}$ cm⁻³. The well region 46 may have the p type impurity concentration equal to the p type impurity concentration of the body region 31. This structure allows the body region 31 and the well region 46 to be formed using the same mask.

With reference to FIG. 7 and FIG. 8, the SiC semiconductor device 1 includes an interlayer insulating layer 51 formed on the first main surface 3. The interlayer insulating layer 51 selectively covers the active region 6 and the outer region 7. The interlayer insulating layer 51 is formed in a film along the first main surface 3. The peripheral edge portion of the interlayer insulating layer 51 may be formed in a manner flush with the side surfaces 5A to 5D.

The interlayer insulating layer 51 may include silicon oxide or silicon nitride. The interlayer insulating layer 51 may include PSG (Phosphor Silicate Glass) and/or BPSG (Boron Phosphor Silicate Glass) as an example of the silicon oxide. The interlayer insulating layer 51 may have a layered structure including a PSG layer and a BPSG layer laminated in this order from the first main surface 3 side. The interlayer insulating layer 51 may have a layered structure including a BPSG layer and a PSG layer laminated in this order from the first main surface 3 side.

The interlayer insulating layer 51 includes a plurality of source contact holes 52. The plurality of source contact holes 52 expose the plurality of cell regions 39 in a one-to-one correspondence relationship. Each source contact hole 52 selectively exposes the source region 41 and the contact region 42 in each cell region 39. The opening edge portion of each source contact hole 52 is formed in a convex curved shape toward the inside of the source contact hole 52.

The interlayer insulating layer 51 includes a diode contact hole 53. The diode contact hole 53 exposes the diode region 45 in the outer region 7. The diode contact hole 53 may be formed in a band shape (more specifically, an endless shape) extending along the diode region 45 in plan view. The diode contact hole 53 may expose the well region 46. The opening edge portion of the diode contact hole 53 is formed in a convex curved shape toward the inside of the diode contact hole 53.

The interlayer insulating layer 51 further includes a gate contact hole, though not shown. The gate contact hole exposes the gate electrode layer 38. The gate contact hole may be formed in a band shape extending along the gate finger 10 in plan view. The opening edge portion of the gate contact hole is formed in a convex curved shape toward the inside of the gate contact hole.

The gate main surface electrode layer 8 and the source main surface electrode layer 13 aforementioned are formed on the interlayer insulating layer 51. The gate main surface electrode layer 8 and the source main surface electrode layer 13 each have a layered structure including a barrier electrode layer 54 and a main electrode layer 55 laminated in this order from the first main surface 3 side.

The barrier electrode layer 54 may have a single layer structure including a titanium layer or a titanium nitride layer. The barrier electrode layer 54 may have a layered structure including a titanium layer and a titanium nitride layer laminated in this order from the first main surface 3 side.

The main electrode layer 55 has a thickness exceeding the thickness of the barrier electrode layer 54. The main electrode layer 55 includes conductive material having a resistance value less than a resistance value of the barrier electrode layer 54. The main electrode layer 55 may include at least one of aluminum, copper, aluminum alloy, and copper alloy. The main electrode layer 55 may include at least one of AlSi alloy, AlSiCu alloy, and AlCu alloy. In this embodiment, the main electrode layer 55 includes AlSiCu alloy.

The gate main surface electrode layer 8 (the gate finger 10) enters the gate contact hole (not shown) from on the interlayer insulating layer 51. The gate main surface electrode layer 8 is electrically connected to the gate electrode layer 38 inside the gate contact hole.

The source main surface electrode layer 13 (the source pad 14) enters the source contact hole 52 from on the interlayer insulating layer 51. The source main surface electrode layer 13 is electrically connected to the source region 41 and the contact region 42 inside the source contact hole 52. More specifically, the source main surface electrode layer 13 forms an Ohmic contact with the source region 41. In this embodiment, the source main surface electrode layer 13 also forms a Schottky junction with the contact region 42.

The source main surface electrode layer 13 (the source routing wiring 15) enters the diode contact hole 53 from on the interlayer insulating layer 51. The source main surface electrode layer 13 is electrically connected to the diode region 45 inside the diode contact hole 53.

The source main surface electrode layer 13 may form a Schottky junction with the diode region 45. That is, the diode region 45 may have the p type impurity concentration in which the Schottky junction is formed with the source main surface electrode layer 13. In this case, the diode region 45 may have the p type impurity concentration having the peak value not more than $1.0 \times 10^{20}$ cm$^{-3}$.

The source main surface electrode layer 13 may form an Ohmic contact with the diode region 45. That is, the diode region 45 may have the p type impurity concentration in which an Ohmic contact is formed with the source main surface electrode layer 13. In this case, the diode region 45 may have the p type impurity concentration having the peak value exceeding $1.0 \times 10^{20}$ cm$^{-3}$.

With reference to FIG. 8, the SiC semiconductor device 1 includes a passivation layer 56 formed on the interlayer insulating layer 51. The passivation layer 56 may have a single layer structure consisting of a silicon oxide layer or a silicon nitride layer. The passivation layer 56 may have a layered structure including a silicon oxide layer and a silicon nitride layer. The silicon oxide layer may be formed on the silicon nitride layer. The silicon nitride layer may be formed on the silicon oxide layer. The passivation layer 56 preferably includes insulating material different from that of the interlayer insulating layer 51. In this embodiment, the passivation layer 56 has a single layer structure consisting of a silicon nitride layer.

The passivation layer 56 is formed in a film along the interlayer insulating layer 51. The passivation layer 56 selectively covers the active region 6 and the outer region 7 via the interlayer insulating layer 51. The passivation layer 56 includes a gate sub pad opening 57 and a source sub pad opening 58 (see also FIG. 3). The gate sub pad opening 57 exposes the gate pad 9. The source sub pad opening 58 exposes the source pad 14.

A peripheral edge portion of the passivation layer 56 may be formed in a manner flush with the side surfaces 5A to 5D. The peripheral edge portion of the passivation layer 56 may be formed at an interval from the side surfaces 5A to 5D to the inner region. The peripheral edge portion of the passivation layer 56 may expose the first main surface 3 (the interlayer insulating layer 51) in plan view. The peripheral edge portion of the passivation layer 56 may continue to the peripheral edge portion 17a of the resin layer 17.

The peripheral edge portion of the passivation layer 56 may demarcate a part of the dicing street DS. The passivation layer 56 does not need to be physically cut by exposing the first main surface 3 from the peripheral edge portion of the passivation layer 56. It is therefore possible to smoothly cut the SiC semiconductor device 1 out of a single SiC semiconductor wafer.

The resin layer 17 aforementioned is formed on the passivation layer 56. The resin layer 17 is formed in a film along the passivation layer 56. The resin layer 17 selectively covers the active region 6 and the outer region 7 with the passivation layer 56 and the interlayer insulating layer 51 therebetween.

The gate pad opening 18 is in communication with the gate sub pad opening 57. An inner wall of the gate pad opening 18 may be positioned outside the inner wall of the gate sub pad opening 57. The inner wall of the gate pad opening 18 may be positioned inside the inner wall of the gate sub pad opening 57. That is, the resin layer 17 may cover the inner wall of the gate sub pad opening 57.

The source pad opening 19 is in communication with the source sub pad opening 58. An inner wall of the source pad opening 19 may be positioned outside the inner wall of the source sub pad opening 58. The inner wall of the source pad opening 19 may be positioned inside the inner wall of the source sub pad opening 58. That is, the resin layer 17 may cover the inner wall of the source sub pad opening 58.

FIG. 9B is a graph for describing a p type impurity concentration of the contact region 42 according to a reference example. In FIG. 9B, a vertical axis represents a p type impurity concentration, while a horizontal axis represents a distance from the first main surface 3.

FIG. 9B shows the p type impurity concentration of the contact region 42 according to the reference example when a p type impurities are introduced into the SiC epitaxial layer 22 (the drift region 25) to form the contact region 42. The contact region 42 according to the reference example has a peak value P of the p type impurity concentration within a range of more than $1.0 \times 10^{20}$ cm$^{-3}$ and not more than $1.0 \times 10^{21}$ cm$^{-3}$.

The contact region 42 according to the reference example is formed by introducing the p type impurities more than once (four or more in this example) into the surface layer portion of the SiC epitaxial layer 22 (the drift region 25). The p type impurities are introduced into different regions in the thickness direction in the surface layer portion of the SiC epitaxial layer 22 (the drift region 25).

The p type impurity concentration of the contact region 42 according to the reference example has one peak value P in an intermediate portion in the thickness direction of the SiC semiconductor layer 2. The number of introductions of the p type impurities merely controls, for example, the number of local maximum values, the depth range of the peak value P of the p type impurity concentration of the contact region 42 according to the reference example, and/or the like. While in this example, the contact region 42 according to the reference example is formed by introducing the p type impurities more than once, the number of introductions of the p type impurities may be once.

Figure 10:
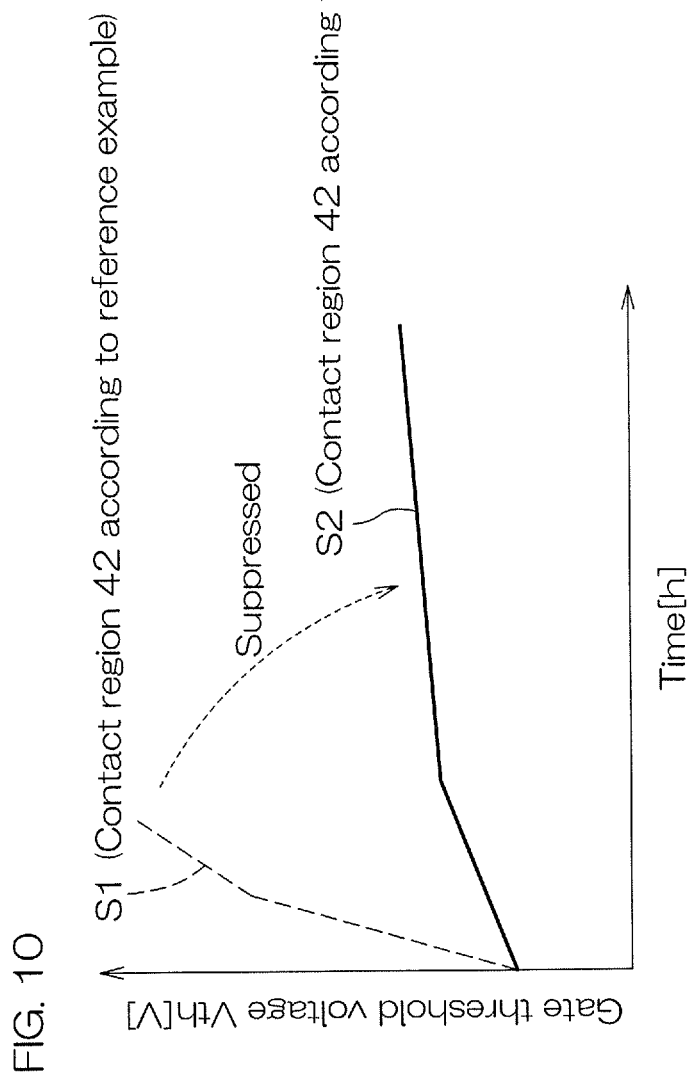
FIG. 10 is a graph for describing aging characteristics of a gate threshold voltage Vth.

FIG. 10 is a graph for describing aging characteristics of a gate threshold voltage Vth. In FIG. 10, a vertical axis represents a gate threshold voltage Vth [V], while the horizontal axis represents the time [h]. FIG. 10 is a graph obtained by simulating and examining the aging characteristics of the gate threshold voltage Vth when the SiC semiconductor device 1 is operated for hundreds to thousands of hours.

FIG. 10 shows first characteristics S1 (see the dashed-line) and second characteristics S2 (see the solid line). The first characteristics S1 show the aging characteristics of the gate threshold voltage Vth when the contact region 42 according to the reference example having the peak value P exceeding $1.0 \times 10^{20}$ cm$^{-3}$ is employed. The second characteristics S2 show the aging characteristics of the gate threshold voltage Vth when the contact region 42 according to this preferred embodiment having the peak value P not more than $1.0 \times 10^{20}$ cm$^{-3}$.

With reference to the first characteristics S1, when the contact region 42 according to the reference example is employed, the gate threshold voltage Vth increases over time. In contrast, with reference to the second characteristics S2, when the contact region 42 according to this preferred embodiment is employed, the increase in the gate threshold voltage Vth over time is suppressed compared to the first characteristics S1.

An aging degradation of the gate threshold voltage Vth is suppressed as the peak value P is reduced. The lower limit of the peak value P is preferably set at a value exceeding the peak value of the p type impurity concentration of the body region 31 in view of the significance of existence of the contact region 42.

The inventors of this application have diligently studied, also for an S1 semiconductor device formed of Si (silicon), whether the gate threshold voltage Vth varies over time in accordance with the p type impurity concentration of the contact region 42. However, in the S1 semiconductor device, they have found that the aging characteristics of the gate threshold voltage Vth do not vary due to increase/decrease in the p type impurity concentration of the contact region 42 even if the p type impurity concentration of the contact region 42 is changed.

That is, it has been found that a phenomenon of variation in the aging characteristics of the gate threshold voltage Vth due to increase/decrease in the p type impurity concentration of the contact region 42 is specific to an SiC semiconductor device. It has also been found that there is a specific problem of the SiC semiconductor device including the contact region 42, in the background of an increase in the gate threshold voltage Vth over time.

As described above, according to the SiC semiconductor device 1, the aging degradation of the gate threshold voltage Vth can be suppressed.

Figure 11:
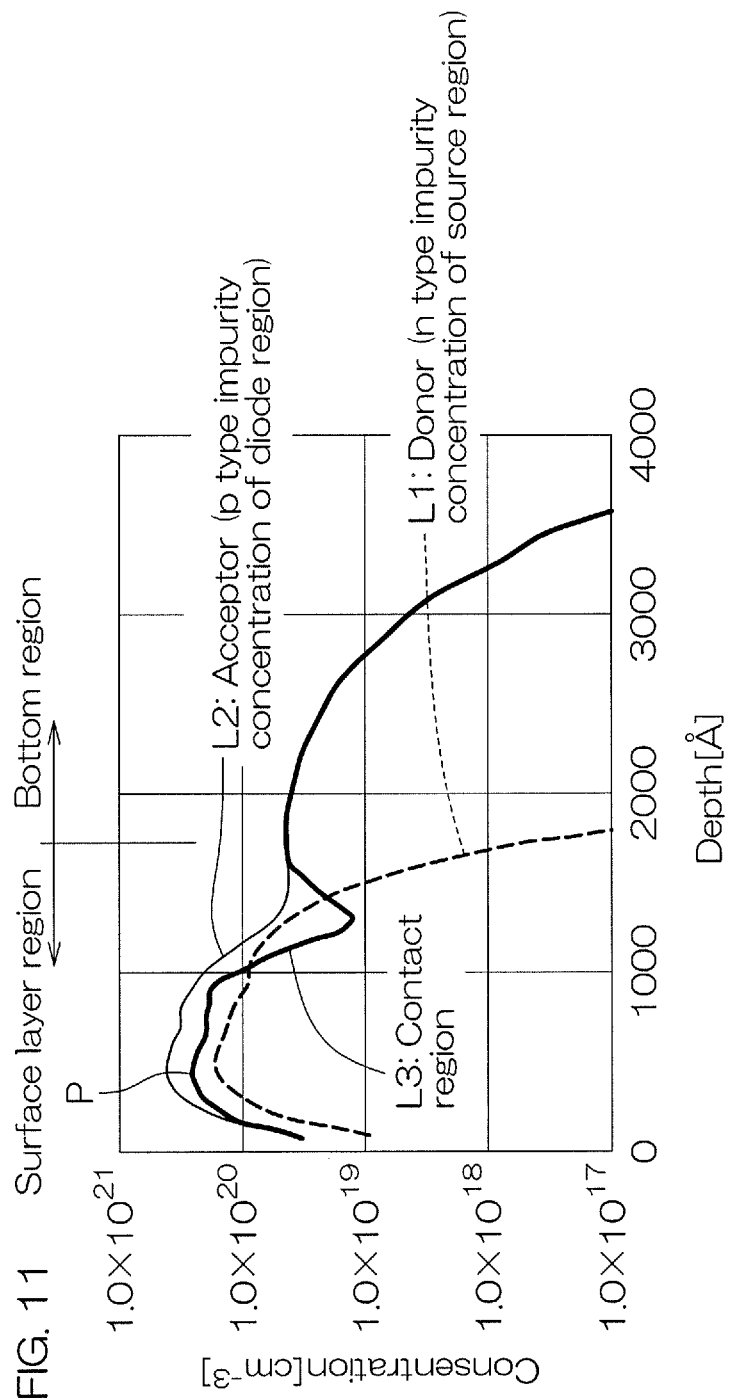
FIG. 11 is a graph for describing a second example of a p type impurity concentration of the contact region shown in FIG. 7.

FIG. 11 is a graph for describing a second example of the p type impurity concentration of the contact region 42 shown in FIG. 7. In FIG. 11, a vertical axis represents the p type impurity concentration of the contact region 42, while a horizontal axis represents a distance from the first main surface 3.

FIG. 9A above shows the p type impurity concentration of the contact region 42 when the p type impurities are introduced into the SiC epitaxial layer 22 (the drift region 25) to form the contact region 42.

In contrast, FIG. 11 shows the p type impurity concentration of the contact region 42 in which n type impurities and p type impurities are included, and portions of the p type impurities are cancelled/compensated for by the n type impurities. Hereinafter, the contact region 42 according to the second example will be referred to as "cancellation/compensation type contact region 42." "Cancellation/compensation" will also be referred to as "cancellation," "compensation," "carrier cancellation," or "carrier compensation."

For convenience of explanation, the n type impurities and the p type impurities before cancellation/compensation will hereinafter be referred to, respectively, as "donors" and "acceptors." The n type impurities of the same type as the n type impurities forming the SiC epitaxial layer 22 may be applied as the donors. The n type impurities of a different type from the n type impurities forming the SiC epitaxial layer 22 may be applied as the donors.

The donors are further introduced into the SiC epitaxial layer 22 (the drift region 25) and exists independently of the n type impurities defining the conductivity type of the SiC epitaxial layer 22. The region in which the donors are introduced in the SiC epitaxial layer 22 has an n type impurity concentration exceeding the n type impurity concentration of the SiC epitaxial layer 22 (the drift region 25).

FIG. 11 shows a first line L1 (see the dashed line), a second line L2 (see the thin solid line), and a third line L3 (see the thick solid line). The first line L1 indicates a donor concentration. The second line L2 indicates an acceptor concentration. The third line L3 indicates a p type impurity concentration of the cancellation/compensation type contact region 42. The cancellation/compensation type contact region 42 is formed by introducing donors all over the cell regions 39 to form the source region 41 and then introducing acceptors into the source region 41.

With reference to the first line L1, the donor concentration has a peak value within a range of not less than $1.0 \times 10^{20}$ cm$^{-3}$ and not more than $5.0 \times 10^{20}$ cm$^{-3}$ in this example. The donor concentration is equal to the n type impurity concentration of the source region 41. The source region 41 may have a peak value of the n type impurity concentration within a range of not less than $1.0×10^{20}$ cm$^{-3}$ and not more than $1.0×10^{21}$ cm$^{-3}$.

With reference to the second line L2, the acceptor concentration exceeds the donor concentration. In this example, the acceptor concentration has a peak value within a range of not less than $5.0×10^{20}$ cm$^{-3}$ and not more than $1.0×10^{21}$ cm$^{-3}$. The acceptor concentration may be equal to the p type impurity concentration of the diode region 45. The diode region 45 may have a peak value of the p type impurity concentration within a range of more than $1.0×10^{20}$ cm$^{-3}$ and not more than $1.0×10^{21}$ cm$^{-3}$, under a condition that it is more than the peak value of the n type impurity concentration of the source region 41.

With reference to the third line L3, in this example, the cancellation/compensation type contact region 42 is formed by introducing the p type impurities more than once (four in this example) into a surface layer portion of the SiC epitaxial layer 22 (the drift region 25). The p type impurities are introduced into different regions in the thickness direction in the surface layer portion of the SiC epitaxial layer 22 (the drift region 25). The p type impurity concentration of the cancellation/compensation type contact region 42 has a plurality of local maximum values in an intermediate portion in the thickness direction of the SiC epitaxial layer 22.

The number of introductions of the p type impurities merely controls, for example, the number of local maximum values, the depth range of the peak value P of the p type impurity concentration of the cancellation/compensation type contact region 42, and/or the like. The p type impurities are introduced more than once in this example, but the p type impurities may be introduced only once to form the cancellation/compensation type contact region 42 as shown in FIG. 9A.

In this example, the p type impurity concentration of the cancellation/compensation type contact region 42 has a peak value P within a range exceeding the donor concentration and less than the acceptor concentration. The p type impurity concentration of the cancellation/compensation type contact region 42 may have the peak value P within a range exceeding the n type impurity concentration of the source region 41 and less than the p type impurity concentration of the diode region 45.

In this example, the peak value P is within a range of not less than $1.0×10^{20}$ cm$^{-3}$ and not more than $5.0×10^{20}$ cm$^{-3}$. The peak value P may be within a range of not less than $1.0×10^{20}$ cm$^{-3}$ and not more than $1.0×10^{21}$ cm$^{-3}$, under a condition that it is more than the peak value of the n type impurity concentration of the source region 41 and less than the peak value of the p type impurity concentration of the diode region 45.

The peak value P may be within a range of not less than $1.0×10^{20}$ cm$^{-3}$ and not more than $2.5×10^{20}$ cm$^{-3}$, not less than $2.5×10^{20}$ cm$^{-3}$ and not more than $5.0×10^{20}$ cm$^{-3}$, not less than $5.0×10^{20}$ cm$^{-3}$ and not more than $7.5×10^{20}$ cm$^{-3}$, or not less than $7.5×10^{20}$ cm$^{-3}$ and not more than $1.0×10^{21}$ cm$^{-3}$.

With reference to the first to third lines L1 to L3, the bottom portion of the cancellation/compensation type contact region 42 is positioned at the second main surface 4 side with respect to the bottom portion of the source region 41. More specifically, the bottom portion of the cancellation/compensation type contact region 42 is formed in a region between the bottom portion of the body region 31 and the bottom portion of the source region 41 in this example.

The cancellation/compensation type contact region 42 includes a surface layer region and a bottom portion region. The surface layer region is positioned at a region at the first main surface 3 side with respect to the bottom portion of the source region 41. The bottom portion region is positioned at a region at the second main surface 4 side with respect to the bottom portion of the source region 41.

In the surface layer region, portions of the acceptors are cancelled/compensated for by the donors. In the surface layer region, the p type impurity concentration is thereby lowered than the acceptor concentration. On the other hand, in the bottom portion region, since the acceptors does not contact with the donors, it is suppressed that the acceptors are cancelled/compensated for by the donors. The cancellation/compensation type contact region 42 is thus formed having the surface layer region in which portions of the acceptors are cancelled/compensated for by the donors and the bottom portion region in which the acceptors are not cancelled/compensated for by the donors.

The source main surface electrode layer 13 (the source pad 14) aforementioned may form an Ohmic contact with the source region 41 and may also form an Ohmic contact with the cancellation/compensation type contact region 42. The source main surface electrode layer 13 (the source pad 14) may also form an Ohmic contact with the diode region.

The cancellation/compensation type contact region 42 may have the p type impurity concentration less than $1.0×10^{20}$ cm$^{-3}$, under a condition that it is more than the peak value of the n type impurity concentration (donors concentration) of the source region 41 and less than the peak value of the p type impurity concentration (acceptors concentration) of the diode region 45. In this case, the p type impurity concentration of the contact region 42 according to the first example may be applied to the cancellation/compensation type contact region 42 (see also FIG. 9A).

In this case, the source main surface electrode layer 13 (the source pad 14) aforementioned may form an Ohmic contact with the source region 41 and may form a Schottky junction with the cancellation/compensation type contact region 42. The source main surface electrode layer 13 (the source pad 14) may also form an Ohmic contact or a Schottky junction with the diode region.

Figure 12:
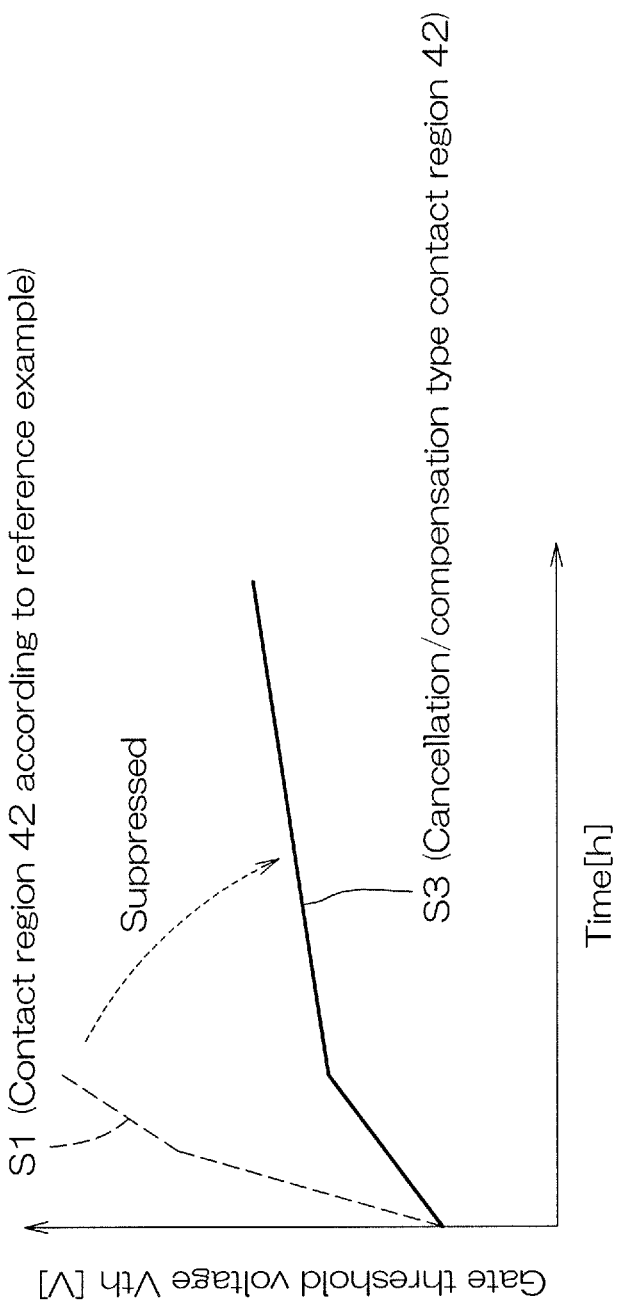
FIG. 12 is a graph for describing aging characteristics of a gate threshold voltage Vth.

FIG. 12 is a graph for describing aging characteristics of a gate threshold voltage Vth when the cancellation/compensation type contact region 42 according to the second example is employed. In FIG. 12, a vertical axis represents a gate threshold voltage Vth [V], while a horizontal axis represents time [h].

FIG. 12 is a graph obtained by simulating and examining the aging characteristics of the gate threshold voltage Vth when the SiC semiconductor device 1 is operated for hundreds to thousands of hours. FIG. 12 shows third characteristics S3 (see the solid line) as well as the first characteristics S1 (see the dashed line) aforementioned. The third characteristics S3 show the aging characteristics of the gate threshold voltage Vth when the cancellation/compensation type contact region 42 is employed.

With reference to the third characteristics S3, it is confirmed that when the cancellation/compensation type contact region 42 is employed, the increase in the gate threshold voltage Vth over time is suppressed compared to the first characteristics S1. The aging degradation of the gate threshold voltage Vth is suppressed as the peak value P of the p type impurity concentration of the contact region 42 is reduced. The lower limit of the peak value P of the p type impurity concentration of the contact region 42 is preferably set at a value exceeding the peak value of the p type impurity concentration of the body region 31 in view of the significance of existence of the contact region 42.

While the cancellation/compensation type contact region 42 shown in FIG. 11 has a higher p type impurity concentration (not less than $1.0 \times 10^{20}$ cm$^{-3}$) relative to the non-cancellation/compensation type contact region 42 shown in FIG. 9A, the aging degradation of the gate threshold voltage Vth is suppressed.

In the cancellation/compensation type contact region 42, crystal defects are to be formed due to cancellation/compensation between the donors (n type impurities) and the acceptors (p type impurities). It may be considered that in the cancellation/compensation type contact region 42, the crystal defects also contribute to the suppression in the aging degradation of the gate threshold voltage Vth in addition to the cancellation/compensation.

The SiC semiconductor device 1 employing the cancellation/compensation type contact region 42 can thus also suppress the aging degradation of the gate threshold voltage Vth. Also, when the cancellation/compensation type contact region 42 is employed, design focusing on the characteristics of the pn junction diode D can be made at the same time of forming the contact region 42 and the diode region 45. This allows the diode characteristics in the outer region 7 to be improved while suppressing the aging degradation of the gate threshold voltage Vth.

Figure 13:
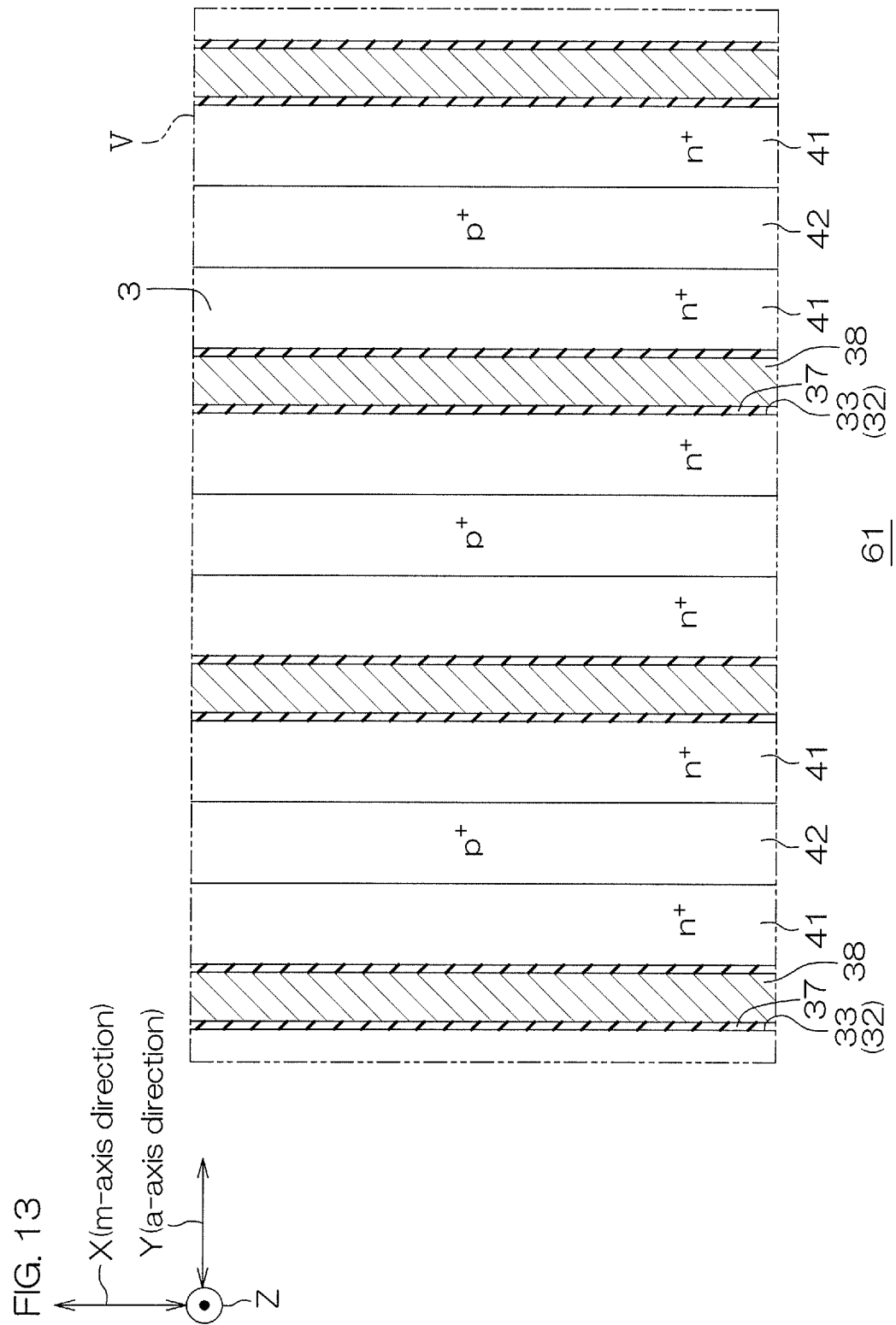
FIG. 13 is a plan view of a region corresponding to FIG. 5, showing an SiC semiconductor device according to a second preferred embodiment of the present invention.

FIG. 13 is a plan view of a region corresponding to FIG. 5, showing an SiC semiconductor device 61 according to a second preferred embodiment of the present invention. The structures corresponding to those described for the SiC semiconductor device 1 will hereinafter be designated by the same reference signs to omit the description thereof.

With reference to FIG. 13, the SiC semiconductor device 61 includes gate trenches 32 formed in a striped manner in plan view. That is, the gate trenches 32 include any one the plurality of first gate trenches 33 or the plurality of second gate trenches 34. In this embodiment, the gate trenches 32 include not the second gate trenches 34 but only the plurality of first gate trenches 33.

In this embodiment, the body region 31 extends in a band shape along the gate trenches 32 in a region between two adjacent ones of the gate trenches 32. The source region 41 is formed in the surface layer portion of the body region 31 in the region between two adjacent ones of the gate trenches 32. The source region 41 extends in a band shape along the side walls of the corresponding gate trench 32. The channel of the MISFET is formed in a region along the side walls of the gate trench 32 that are formed by the a-planes of the SiC monocrystal in the body region 31.

The contact region 42 is formed in the surface layer portion of the body region 31 in the region between two adjacent ones of the gate trenches 32. The contact region 42 shown in FIG. 9A or the cancellation/compensation type contact region 42 shown in FIG. 11 may be formed. The contact region 42 is formed in a central portion of the body region 31 at intervals from the gate trenches 32 in plan view. In this embodiment, the contact region 42 is formed in a band shape extending along the gate trenches 32.

A Plurality of the contact regions 42 may be formed in the region between two adjacent ones of the gate trenches 32. In this case, the plurality of contact regions 42 may be formed at intervals along the gate trenches 32. The source region 41 may be interposed in a region between the adjacent contact regions 42 in the surface layer portion of the body region 31.

As described above, the SiC semiconductor device 61 can exhibit the same advantageous effects as those described for the SiC semiconductor device 1.

Figure 14:
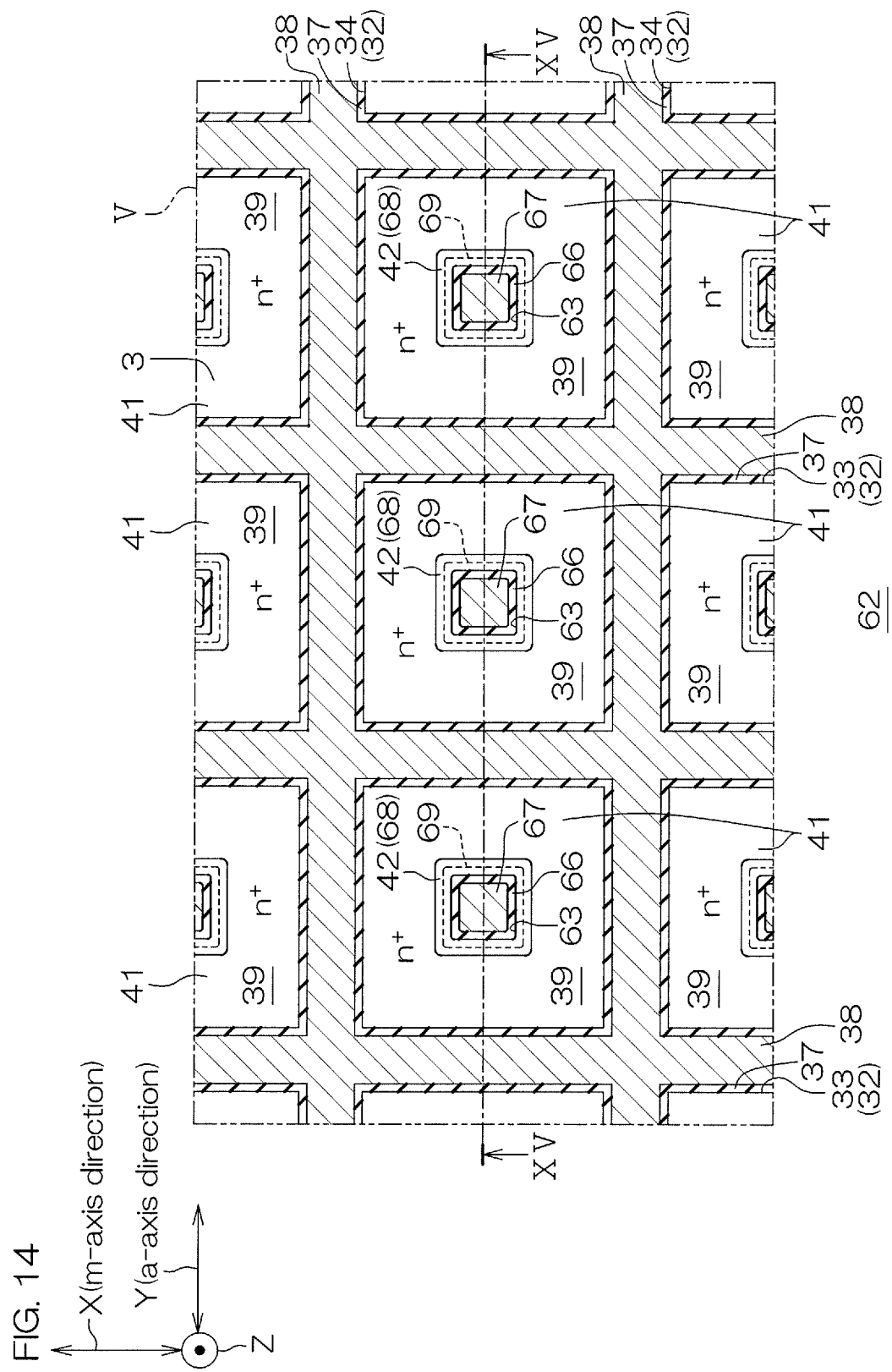
FIG. 14 is a plan view of a region corresponding to FIG. 5, showing an SiC semiconductor device according to a third preferred embodiment of the present invention.
Figure 15:
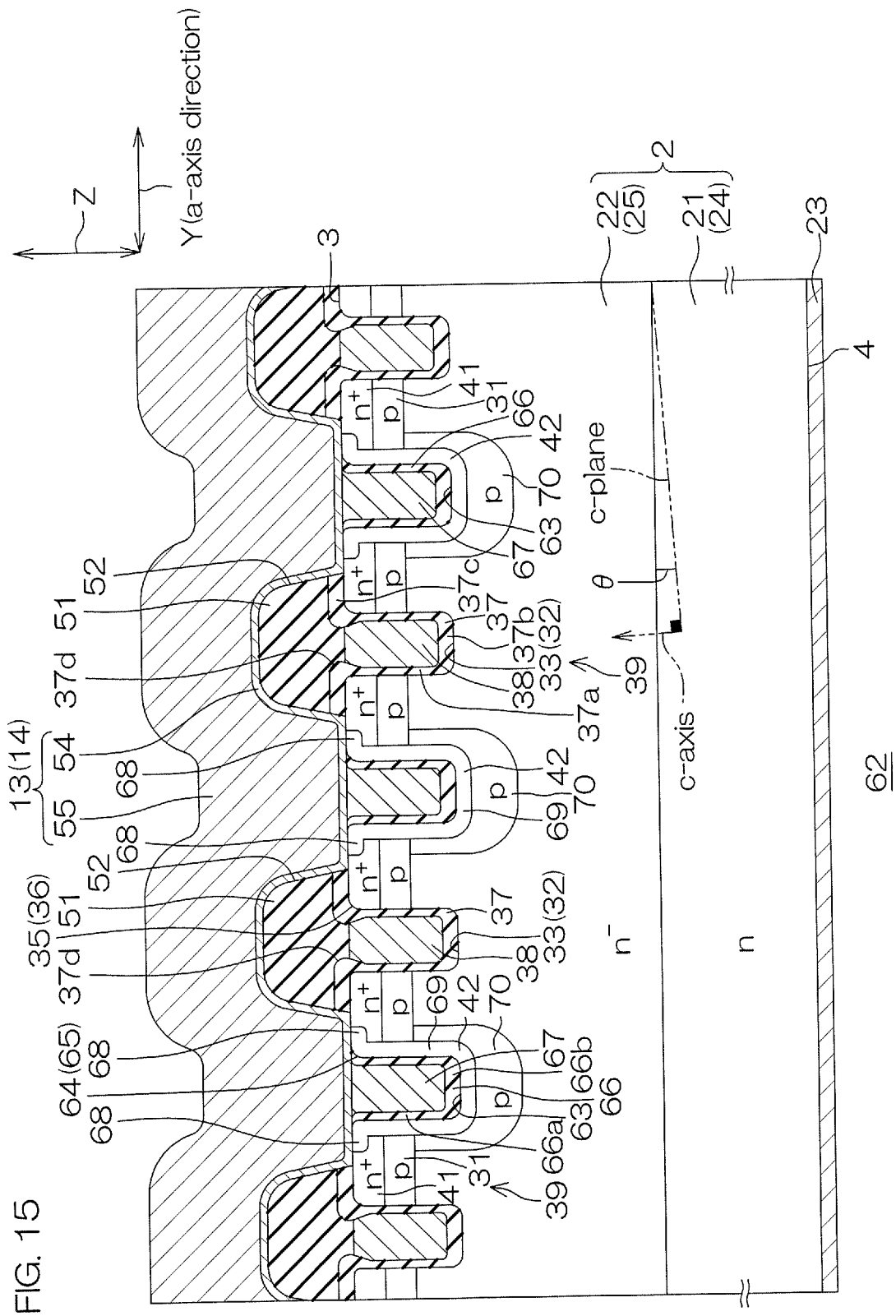
FIG. 15 is a cross-sectional view taken along line XV-XV in FIG. 14.

FIG. 14 is a plan view of a region corresponding to FIG. 5, showing an SiC semiconductor device 62 according to a third preferred embodiment of the present invention. FIG. 15 is a cross-sectional view taken along line XV-XV in FIG. 14. The structures corresponding to those described for the SiC semiconductor device 1 will hereinafter be designated by the same reference signs to omit the description thereof.

With reference to FIG. 14 and FIG. 15, the SiC semiconductor device 62 includes a source trench 63 (second trench) formed in each cell region 39. Each source trench 63 is formed in a central portion of each cell region 39 in plan view. Each source trench 63 is formed in a pattern in which a single source trench 63 appears in a cross-section along the first direction X of each cell region 39. Each source trench 63 is also formed in a pattern in which a single source trench 63 appears in a cross-section along the second direction Y of each cell region 39.

More specifically, each source trench 63 is formed in a quadrilateral shape in plan view. The planar shape of each source trench 63 is arbitrary. Each source trench 63 may be formed in a polygonal shape such as a triangular shape, a pentagonal shape, and a hexagonal shape, or a circular shape or an elliptical shape in plan view.

Each source trench 63 penetrates through the body region 31 and reaches the drift region 25 (the SiC epitaxial layer 22). Each source trench 63 includes side walls and a bottom wall. The side walls of each source trench 63 are formed by the m-planes and the a-planes of the SiC monocrystal.

The side walls of each source trench 63 may extend in the normal direction Z. The side walls of each source trench 63 may be formed approximately perpendicularly to the first main surface 3. The angle between the side walls of each source trench 63 and the first main surface 3 inside the SiC semiconductor layer 2 may be not less than 90 degrees and not more than 95 degrees (e.g. not less than 91 degrees and not more than 93 degrees). That is, each source trench 63 may be formed in a tapered shape with a bottom area being less than an opening area.

The bottom wall of each source trench 63 is positioned at the SiC epitaxial layer 22 side with respect to the boundary between the SiC semiconductor substrate 21 and the SiC epitaxial layer 22. The bottom wall of each source trench 63 is positioned at the drift region 25 (the SiC epitaxial layer 22). The bottom wall of each source trench 63 faces the c-plane of the SiC monocrystal. The bottom wall of each source trench 63 has the off angle θ inclined in the [11-20] direction with respect to the (0001) plane of the SiC monocrystal. The bottom wall of each source trench 63 may be formed in parallel to the first main surface 3. The bottom wall of each source trench 63 may be formed in a convex curved shape toward the second main surface 4.

An opening edge portion 64 of each source trench 63 includes an inclined portion 65 that is inclined downwardly from the first main surface 3 toward the inside of each source trench 63. The opening edge portion 64 of each source trench 63 is a corner portion connecting the first main surface 3 and the side walls of each source trench 63. In this embodiment, the inclined portion 65 is formed in a convex curved shape toward the inside of the source trench 63. The inclined portion 65 may be formed in a concave curved shape toward the inside of the SiC semiconductor layer 2. The inclined portion 65 is arranged to relax the concentration of the electric field in the opening edge portion 64.

Each source trench 63 may have a depth of not less than 0.5 μm and not more than 3.0 μm in the normal direction Z. Each source trench 63 may have a depth of not less than 0.5 μm and not more than 1.0 μm, not less than 1.0 μm and not more than 1.5 μm, not less than 1.5 μm and not more than 2.0 μm, not less than 2.0 μm and not more than 2.5 μm, or not less than 2.5 µm and not more than 3.0 µm. Each source trench 63 preferably has a depth approximately equal to the depth of the gate trenches 32. In accordance with this structure, the gate trenches 32 and the respective source trenches 63 can be formed simultaneously.

Each source trench 63 may have a width of not less than 0.1 µm and not more than 2 µm. Each source trench 63 may have a width of not less than 0.1 µm and not more than 0.5 µm, not less than 0.5 µm and not more than 1.0 µm, not less than 1.0 µm and not more than 1.5 µm, or not less than 1.5 µm and not more than 2 µm. Each source trench 63 preferably has a width equal to the width of the gate trenches 32.

The SiC semiconductor device 62 includes a source insulating layer 66 formed on the inner wall of each source trench 63. The SiC semiconductor device 62 also includes a source electrode layer 67 embedded in each source trench 63 with the source insulating layer 66 therebetween. In FIG. 14, the source insulating layer 66 and the source electrode layer 67 are indicated by hatching.

The source insulating layer 66 is formed in a film along an inner wall of each source trench 63 and demarcates a recessed space inside each source trench 63. The source insulating layer 66 includes a first region 66a and a second region 66b. The first region 66a is formed along the side walls of each source trench 63. The second region 66b is formed along the bottom wall of each source trench 63.

The thickness Tsa of the first region 66a is less than the thickness Tsb of the second region 66b. The ratio of the thickness Tsb of the second region 66b to the thickness Tsa of the first region 66a (Tsb/Tsa) may be not less than 2 and not more than 5. The thickness Tsa of the first region 66a may be not less than 0.01 µm and not more than 0.2 µm. The thickness Tsb of the second region 66b may be not less than 0.05 µm and not more than 0.5 µm.

The thickness Tsa of the first region 66a may be approximately equal to the thickness Ta of the first region 37a of the gate insulating layer 37. The thickness Tsb of the second region 66b may be approximately equal to the thickness Tb of the second region 37b of the gate insulating layer 37. The source insulating layer 66 may be formed to have a uniform thickness.

The source insulating layer 66 includes at least one of a silicon oxide ($SiO_2$) layer, a silicon nitride (SiN) layer, an aluminum oxide ($Al_2O_3$) layer, a zirconium oxide ($ZrO_2$) layer, and a tantalum oxide ($Ta_2O_3$) layer. The source insulating layer 66 may have a layered structure including an SiN layer and an $SiO_2$ layer laminated in this order from the first main surface 3 side.

The source insulating layer 66 may have a layered structure including an $SiO_2$ layer and an SiN layer laminated in this order from the first main surface 3 side. The source insulating layer 66 may have a single layer structure consisting of an $SiO_2$ layer or an SiN layer. The source insulating layer 66 may include the same insulating material as the gate insulating layer 37. In this embodiment, the source insulating layer 66 has a single layer structure consisting of an $SiO_2$ layer.

The source electrode layer 67, more specifically, is embedded in a recessed space demarcated by the source insulating layer 66 inside each source trench 63. The source electrode layer 67 is arranged to be controlled under the source voltage. The source electrode layer 67 may include at least one of conductive polysilicon, tungsten, aluminum, copper, aluminum alloy, and copper alloy.

The source electrode layer 67 preferably includes conductive polysilicon having properties close to SiC in terms of material properties. This allows stress generated inside the SiC semiconductor layer 2 to be reduced. The source electrode layer 67 may include n type polysilicon or p type polysilicon as an example of the conductive polysilicon. The source electrode layer 67 may include the same conducting material as the gate electrode layer 38.

In each cell region 39, the contact region 42 is formed in a region along the inner wall of each source trench 63 in the surface layer portion of the SiC semiconductor layer 2. The contact region 42 shown in FIG. 9A or the cancellation/compensation type contact region 42 shown in FIG. 11 may be formed.

Each contact region 42 covers the side walls of each source trench 63. More specifically, each contact region 42 covers the side walls and the bottom wall of each source trench 63. Each contact region 42 has a bottom portion positioned at the second main surface 4 side with respect to the bottom wall of each gate trench 32. The bottom portion of each contact region 42 may be formed in parallel to the bottom wall of each source trench 63.

Each contact region 42, more specifically, includes a surface layer region 68 and an inner wall region 69 (bottom portion region) integrally. The surface layer region 68 is formed in a region along the side walls of each source trench 63 in the surface layer portion of the body region 31. The surface layer region 68 is electrically connected to the body region 31 and the source region 41.

The surface layer region 68 extends in a band shape along the side walls of each source trench 63 in plan view. More specifically, the surface layer region 68 is formed in an endless shape (a quadrilateral annular shape in this embodiment) that surrounds the side walls of each source trench 63 in plan view.

In this embodiment, the surface layer region 68 has a bottom portion extending in parallel to the first main surface 3. The surface layer region 68 is positioned at a region at the first main surface 3 side with respect to the bottom portion of the source region 41. In this embodiment, the bottom portion of the surface layer region 68 is positioned at a region between the first main surface 3 and the bottom portion of the source region 41. The bottom portion of the surface layer region 68 may be positioned at a region between the bottom portion of the body region 31 and the bottom portion of the source region 41.

The surface layer region 68 is led out from the side walls of each source trench 63 toward the gate trench 32. The surface layer region 68 may be led out to an intermediate region between each source trench 63 and each gate trench 32. The end portion of the surface layer region 68 is positioned at a region between the source trench 63 and the gate trench 32.

The inner wall region 69 is formed in a region along the inner wall of each source trench 63 in the SiC semiconductor layer 2. The inner wall region 69 is positioned at a region at the second main surface 4 side with respect to the surface layer region 68 (the bottom portion of the source region 41).

The inner wall region 69 covers the side walls of each source trench 63. The inner wall region 69 covers a corner portion connecting the side walls and the bottom wall of each source trench 63. The inner wall region 69 covers the side walls of each source trench 63 from the corner portion to the bottom wall of each source trench 63. The bottom portion of each contact region 42 is formed by the inner wall region 69.

When a cancellation/compensation type contact region 42 (see also FIG. 11) is employed, portions of the p type impurities (acceptors) of the surface layer region 68 are cancelled/compensated for by the n type impurities (donors)

of the source region 41. This causes the surface layer region 68 of each contact region 42 to be cancellation/compensation type.

On the other hand, since the inner wall region 69 of each contact region 42 is not in contact with the source region 41, the p type impurities (acceptors) of the inner wall region 69 are not cancelled/compensated for by the n type impurities (donors) of the source region 41. Each contact region 42 thereby has a cancelled/compensated region (the surface layer region 68) in a region at the surface layer portion side and a non-cancelled/compensated region (the inner wall region 69) in a region at the bottom portion side.

The SiC semiconductor device 62 further includes a p type deep well region 70 formed in a region along the inner wall of each source trench 63 in the SiC semiconductor layer 2. Each deep well region 70 is also referred to as a withstand voltage adjusting region (withstand voltage maintaining region) arranged to adjust a withstand voltage of the SiC semiconductor layer 2 in the active region 6.

Each deep well region 70 is formed along the inner wall of each source trench 63 such as to cover each contact region 42. Each deep well region 70 is electrically connected to each contact region 42.

Each deep well region 70 covers the side walls of each source trench 63. Each deep well region 70 covers the corner portion connecting the side walls and the bottom wall of each source trench 63. Each deep well region 70 covers the side walls of each source trench 63 from the corner portion to the bottom wall of each source trench 63. Each deep well region 70 continues to the body region 31 at the side walls of each source trench 63.

Each deep well region 70 has a bottom portion positioned at the second main surface 4 side with respect to the bottom wall of the gate trench 32. The bottom portion of each deep well region 70 may be formed in parallel to the bottom wall of each source trench 63. The distance between the bottom wall of the source trench 63 and the bottom portion of the deep well region 70 may be equal to a distance between the first main surface 3 and the bottom portion of the body region 31.

Each deep well region 70 may have a peak value of a p type impurity concentration approximately equal to the p type impurity concentration of the body region 31. Each deep well region 70 may have the peak value of the p type impurity concentration exceeding the peak value of the p type impurity concentration of the body region 31. Each deep well region 70 may have the peak value of the p type impurity concentration less than the peak value of the p type impurity concentration of the body region 31.

Each deep well region 70 may have the peak value of the p type impurity concentration not more than the peak value P of the p type impurity concentration of the contact region 42. Each deep well region 70 preferably has the peak value of the p type impurity concentration less than the peak value P of the p type impurity concentration of the contact region 42.

Each deep well region 70 may have the peak value of the p type impurity concentration of not less than $1.0 \times 10^{17}$ cm$^{-3}$ and not more than $1.0 \times 10^{19}$ cm$^{-3}$. A lower limit of the peak value of the p type impurity concentration of each deep well region 70 is preferably not less than $1.0 \times 10^{18}$ cm$^{-3}$.

Each deep well region 70 forms a pn junction with the SiC semiconductor layer 2 (the drift region 25). A depletion layer spreads from the pn junction toward the gate trench 32. The depletion layer spreads toward a region at the second main surface 4 side with respect to the bottom wall of the gate trench 32. The depletion layer spreading from each deep well region 70 may overlap the bottom wall of each gate trench 32. The depletion layer spreading from the bottom portion of each deep well region 70 may overlap the bottom wall of each gate trench 32.

With an SiC semiconductor device that includes just a pn junction diode, due to the structure being free from trenches, a problem of concentration of electric field inside the SiC semiconductor layer 102 rarely occurs. The respective deep well regions 70 make the trench gate type MISFET approach the structure of a pn junction diode. This allows the trench gate type MISFET to relax the electric field inside the SiC semiconductor layer 2.

Narrowing a pitch between the plurality of mutually adjacent deep well regions 70 is thus effective in terms of relaxing the concentration of electric field. Also, with the respective deep well regions 70 having the bottom portions at the second main surface 4 side with respect to the bottom wall of the gate trench 32, concentration of electric field with respect to the gate trench 32 can be relaxed appropriately by the depletion layer.

Preferably, distances between the bottom portions of the plurality of deep well regions 70 and the second main surface 4 are substantially equal. Occurrence of variation in the distances between the bottom portions of the plurality of deep well regions 70 and the second main surface 4 can thereby be suppressed. The withstand voltage (for example, a breakdown strength) of the SiC semiconductor layer 2 can thus be suppressed from being restricted by a configuration of the respective deep well regions 70 and therefore improvement of the withstand voltage can be appropriately achieved.

The source main surface electrode layer 13 (the source pad 14) aforementioned is electrically connected to the source region 41, the contact region 42, and the source electrode layer 67 inside each source contact hole 52. The source main surface electrode layer 13 (the source pad 14) forms an Ohmic contact with the source region 41.

When the contact region 42 shown in FIG. 9A is formed, the source main surface electrode layer 13 may form a Schottky junction with the contact region 42. When the contact region 42 shown in FIG. 11 is formed, the source main surface electrode layer 13 may form an Ohmic contact or a Schottky junction with the contact region 42.

As described above, the SiC semiconductor device 62 can exhibit the same advantageous effects as those described for the SiC semiconductor device 1.

Figure 16:
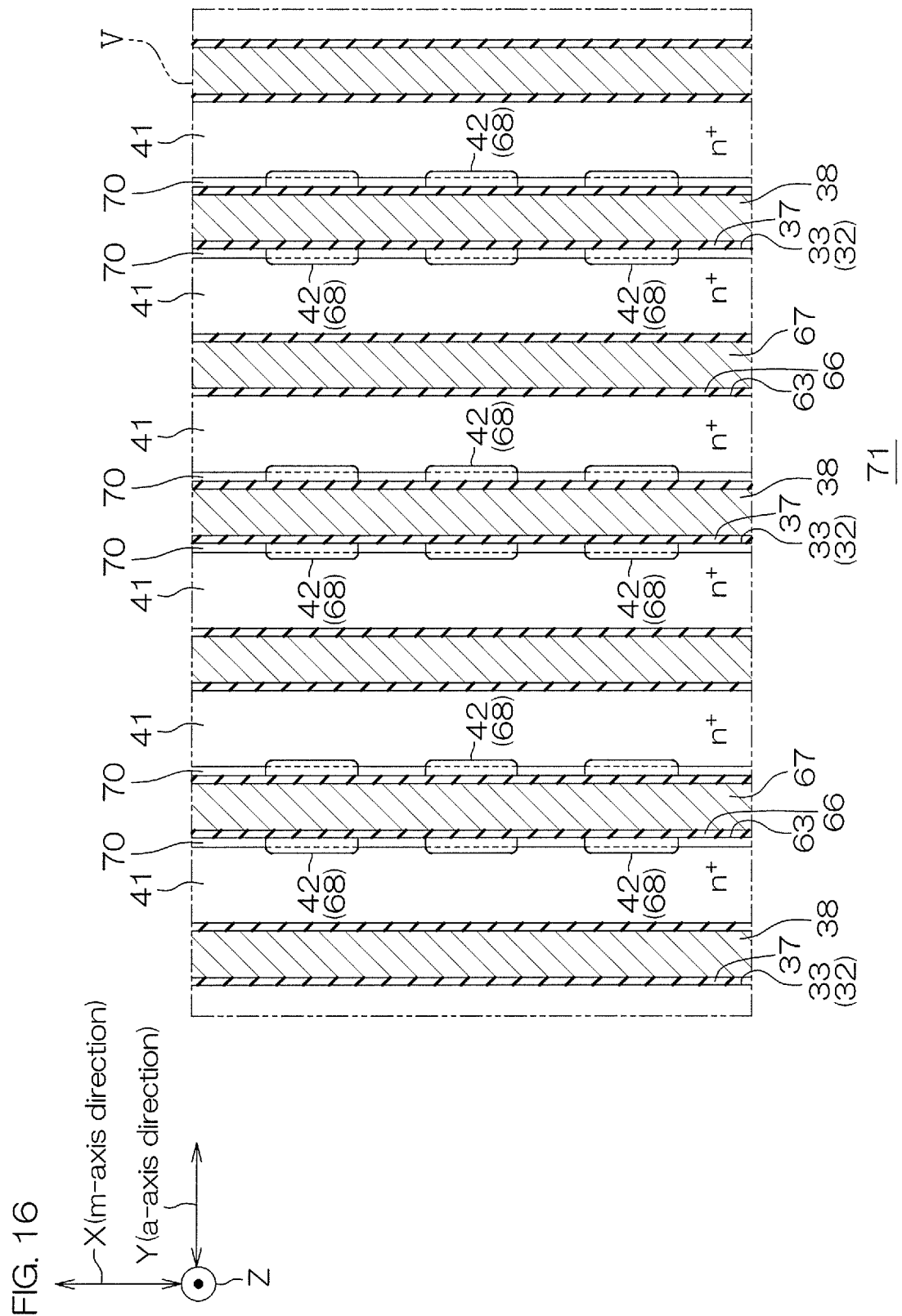
FIG. 16 is a plan view of a region corresponding to FIG. 14, showing an SiC semiconductor device according to a fourth preferred embodiment of the present invention.

FIG. 16 is a plan view of a region corresponding to FIG. 14, showing an SiC semiconductor device 71 according to a fourth preferred embodiment of the present invention. The structures corresponding to those described for the SiC semiconductor device 62 according to the third preferred embodiment will hereinafter be designated by the same reference signs to omit the description thereof.

With reference to FIG. 16, the SiC semiconductor device 71 includes gate trenches 32 formed in a striped manner in plan view. That is, the gate trenches 32 include any one of the plurality of first gate trenches 33 or the plurality of second gate trenches 34. In this embodiment, the gate trenches 32 include not the second gate trenches 34 but only the plurality of first gate trenches 33.

In this embodiment, the body region 31 extends in a band shape along the gate trenches 32 in a region between two adjacent ones of the gate trenches 32. In this embodiment, each source trench 63 is formed in the region between two adjacent ones of the gate trenches 32.

In this embodiment, each source trench 63 is formed in a band shape extending along the gate trenches 32. The plurality of source trenches 63 are formed in a striped manner extending in the first direction X in plan view.

Each source region 41 is formed in a region between the gate trench 32 and the source trench 63 in the surface layer portion of the body region 31. Each source region 41 is formed in a band shape extending along the gate trenches 32. The plurality of source regions 41 are formed in a striped manner extending in the first direction X in plan view.

Each source region 41 is exposed from the side walls of the gate trench 32 and the side walls of the source trench 63. The channel of the MISFET is formed in a region along the side walls of the gate trench 32 that is formed by the a-planes of the SiC monocrystal in the body region 31.

In this embodiment, each contact region 42 is formed in a region along the side walls of each source trench 63 in the surface layer portion of the body region 31. The contact region 42 shown in FIG. 9A or the cancellation/compensation type contact region 42 shown in FIG. 11 may be formed. In this embodiment, a plurality of contact regions 42 are formed at intervals with respect to each source trench 63. Each contact region 42 includes a surface layer region 68 and an inner wall region 69 (bottom portion region) integrally, though not specifically shown.

In this embodiment, each deep well region 70 is formed in a region along the side walls of each source trench 63 in the surface layer portion of the body region 31. In this embodiment, the plurality of deep well regions 70 are formed in a one-to-one correspondence relationship with the plurality of source trenches 63. That is, each of the deep well regions 70 is formed for each source trench 63.

Each deep well region 70 is formed in a band shape extending along the each source trench 63 in plan view. Each deep well region 70 may be exposed from the first main surface 3 in a region between adjacent contact regions 42.

As described above, the SiC semiconductor device 71 can exhibit the same advantageous effects as those described for the SiC semiconductor device 1.

Figure 17:
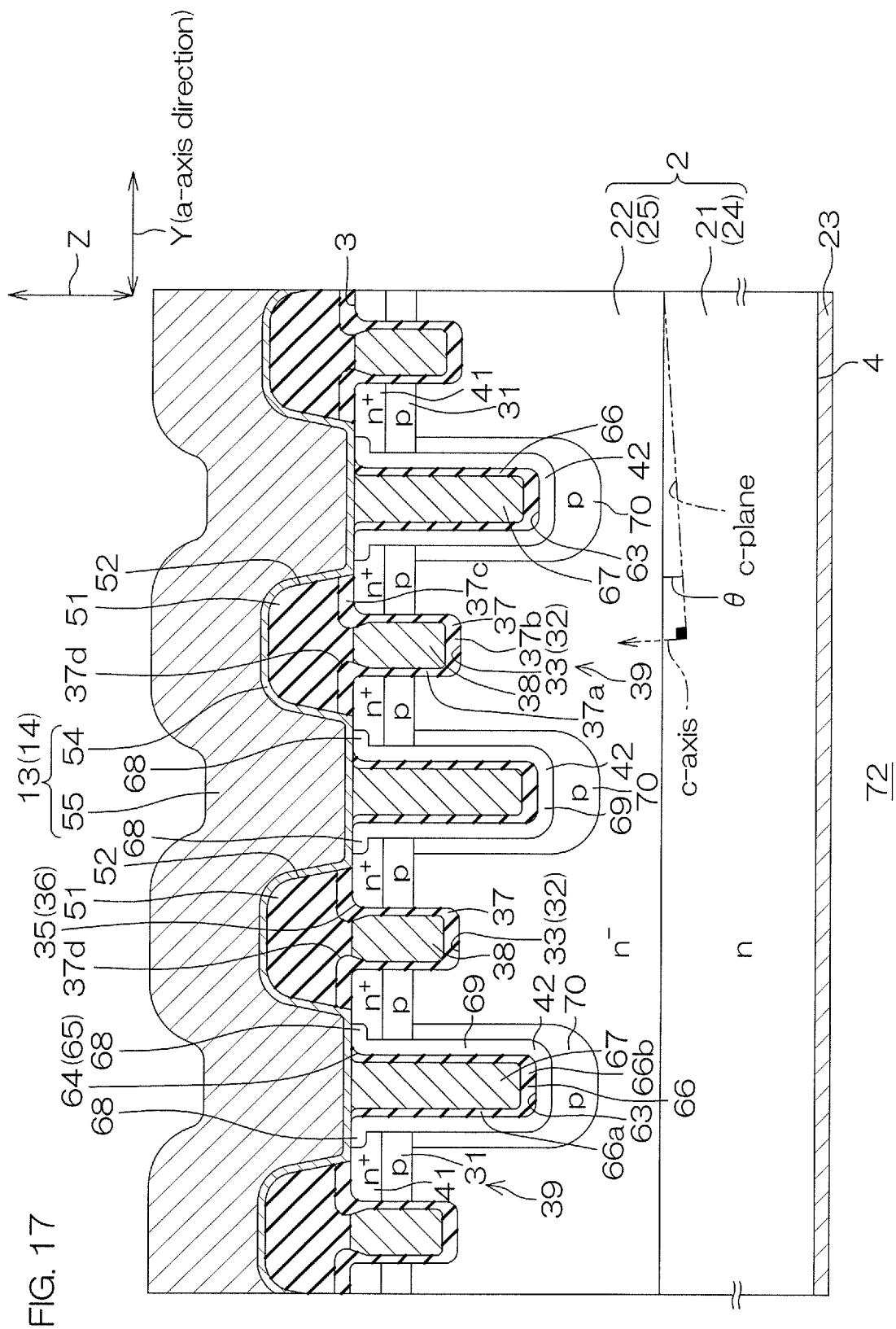
FIG. 17 is a cross-sectional view of a region corresponding to FIG. 15, showing an SiC semiconductor device according to a fifth preferred embodiment of the present invention.

FIG. 17 is a cross-sectional view of a region corresponding to FIG. 15, showing an SiC semiconductor device 72 according to a fifth preferred embodiment of the present invention. The structures corresponding to those described for the SiC semiconductor device 62 according to the third preferred embodiment will hereinafter be designated by the same reference signs to omit the description thereof.

With reference to FIG. 17, in this embodiment, the depth of each source trench 63 of the SiC semiconductor device 72 is not less than the depth of each gate trench 32. More specifically, the depth of each source trench 63 is more than the depth of each gate trench 32. The bottom wall of each source trench 63 is positioned at the second main surface 4 side with respect to the bottom wall of the gate trench 32. The bottom wall of each source trench 63 is positioned at the SiC epitaxial layer 22 side with respect to the boundary between the SiC semiconductor substrate 21 and the SiC epitaxial layer 22.

Each source trench 63 may have a depth of not less than 0.5 µm and not more than 10 µm in the normal direction Z. The ratio of the depth of each source trench 63 to the depth of the gate trench 32 may be not less than 1.5. The ratio of the depth of each source trench 63 to the depth of the gate trench 32 is preferably not less than 2.

As described above, the SiC semiconductor device 72 can exhibit the same advantageous effects as those described for the SiC semiconductor device 1. The structure of the source trench 63 of the SiC semiconductor device 72 may be applied to the SiC semiconductor device 71 according to the fourth preferred embodiment (see FIG. 16).

Figure 18:
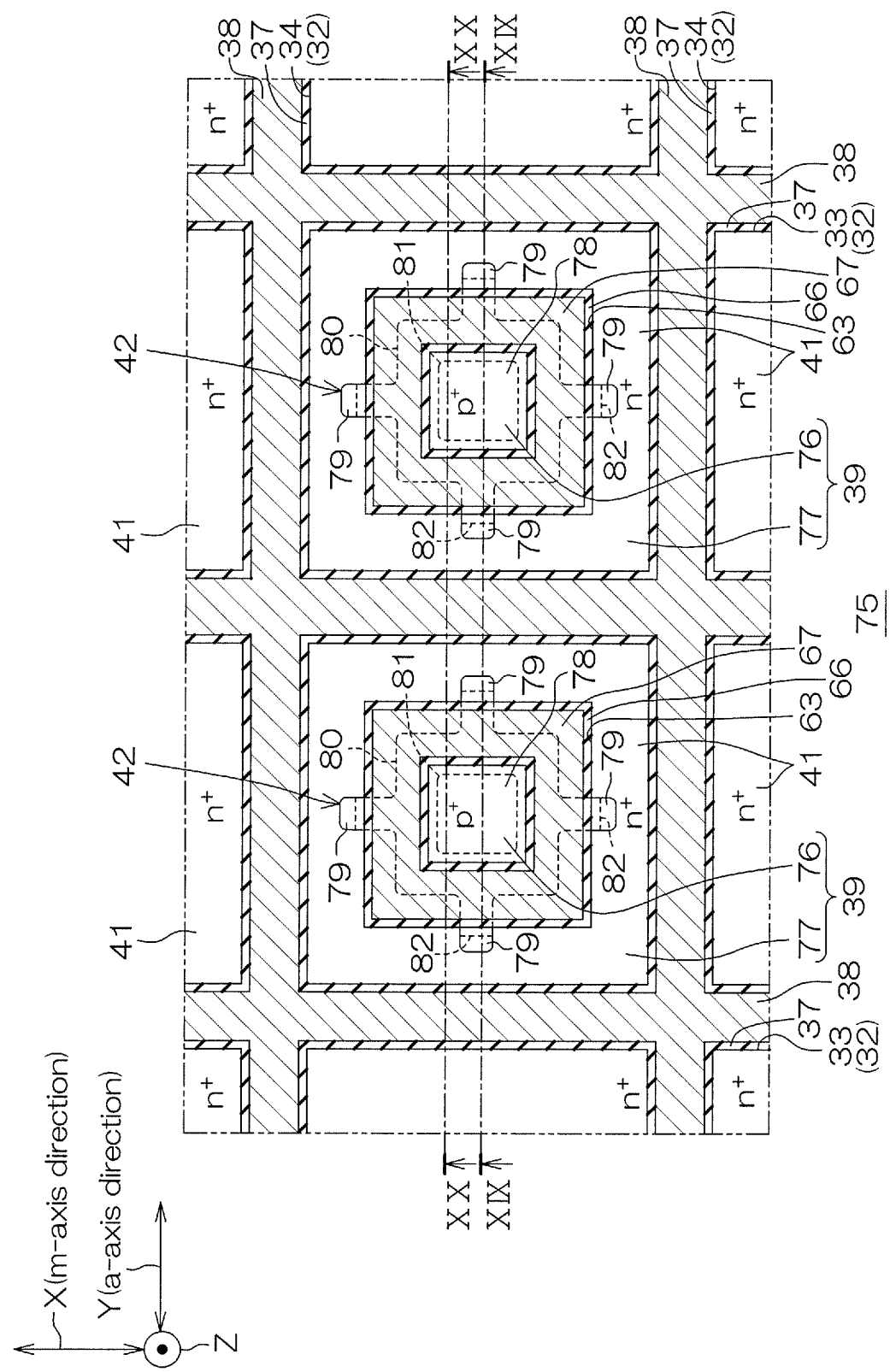
FIG. 18 is a plan view of a region corresponding to FIG. 14, showing an SiC semiconductor device according to a sixth preferred embodiment of the present invention.
Figure 19:
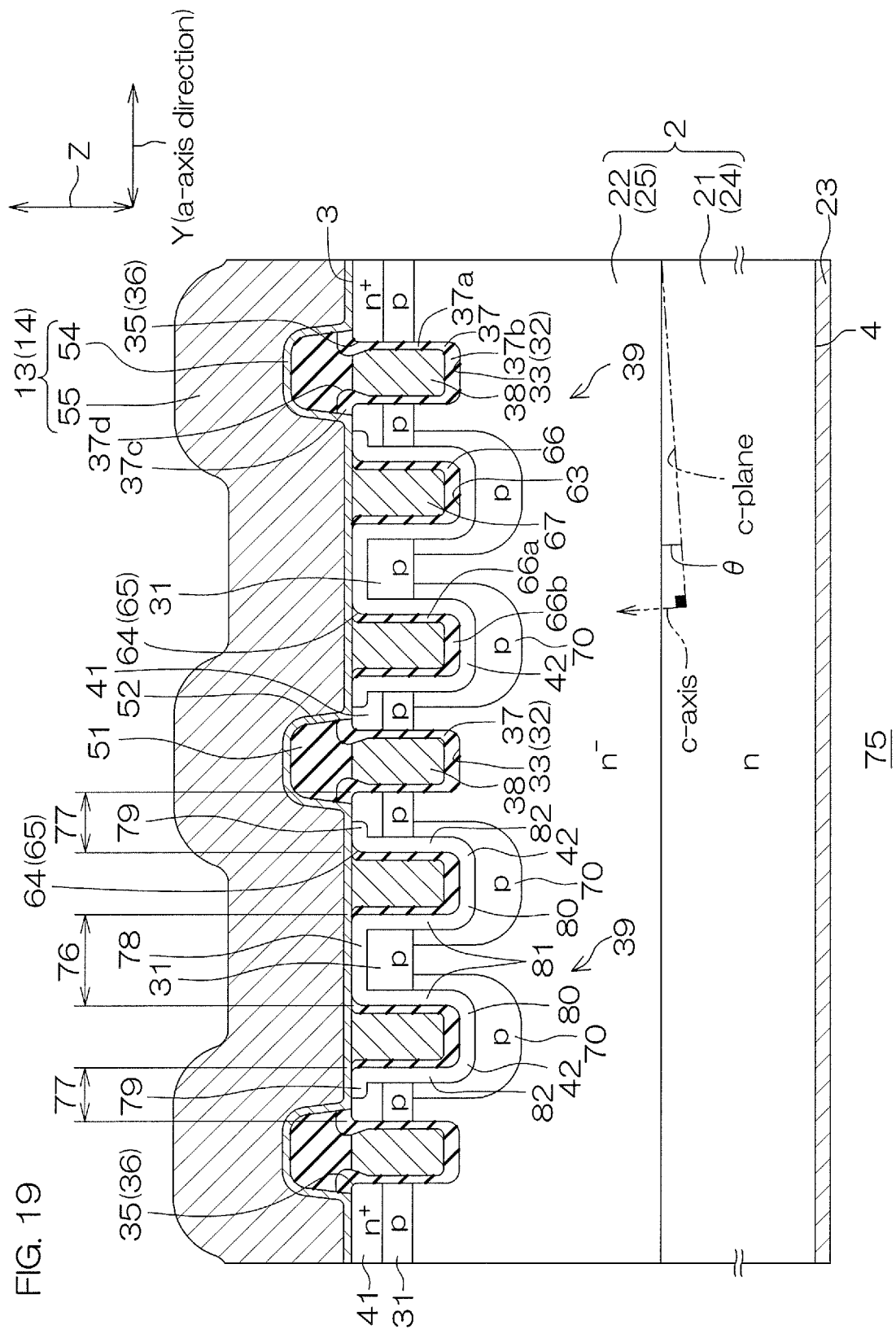
FIG. 19 is a cross-sectional view taken along line XIX-XIX in FIG. 18.
Figure 20:
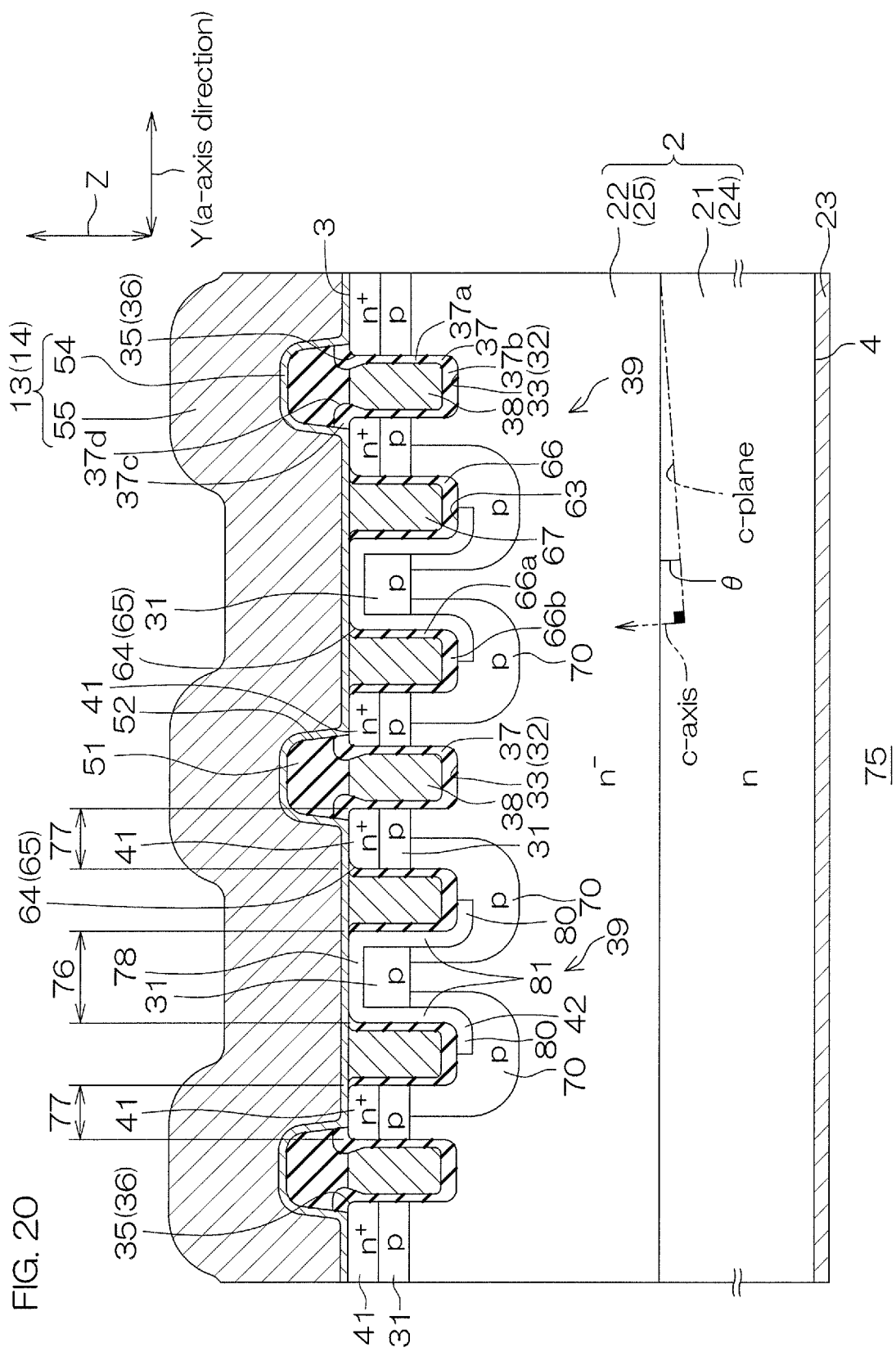
FIG. 20 is a cross-sectional view taken along line XX-XX in FIG. 18.

FIG. 18 is a plan view of a region corresponding to FIG. 14, showing an SiC semiconductor device 75 according to a sixth preferred embodiment of the present invention. FIG. 19 is a cross-sectional view taken along line XIX-XIX in FIG. 18. FIG. 20 is a cross-sectional view taken along line XX-XX in FIG. 18. The structures corresponding to those described for the SiC semiconductor device 71 will hereinafter be designated by the same reference signs to omit the description thereof.

The SiC semiconductor device 62 according to the third preferred embodiment aforementioned includes the source trenches 63 each formed in a pattern in which the single source trenches 63 appears in the cross-section along the first direction X and the second direction Y of each cell region 39. In contrast, with reference to FIG. 18 to FIG. 20, the SiC semiconductor device 75 includes source trenches 63 formed in a pattern in which two of source trenches 63 appear in a cross-section along the first direction X of each cell region 39. The source trenches 63 are further formed in a pattern in which two of source trenches 63 appear in a cross-section along the second direction Y of each cell region 39.

More specifically, each source trench 63 is formed in an endless shape (e.g. a quadrilateral annular shape) extending in the first direction X and the second direction Y such as to demarcate an inner region of each cell region 39 in plan view. The side walls forming inner peripheral walls of each source trench 63 are formed by the m-planes and the a-planes of the SiC monocrystal. The side walls forming outer peripheral walls of each source trench 63 are also formed by the m-planes and the a-planes of the SiC monocrystal.

The planar shape of each source trench 63 is arbitrary. Each source trench 63 may be formed in a polygonal annular shape such as a triangular annular shape, a pentagonal annular shape, and a hexagonal annular shape, or a circularly annular shape or an elliptically annular shape in plan view.

Each cell region 39 includes a mesa portion 76 and an annular portion 77 demarcated by each gate trench 32 and each source trench 63. The mesa portion 76 and the annular portion 77 each form the first main surface 3. Each mesa portion 76 is demarcated by the inner peripheral walls of each source trench 63. In this embodiment, each mesa portion 76 is demarcated in a quadrilateral shape in plan view. Each mesa portion 76 may have various planar shapes in accordance with the planar shape of each source trench 63.

Each annular portion 77 is demarcated by the outer peripheral walls of each source trench 63 and the side walls of the gate trench 32. Each annular portion 77 is demarcated in an endless shape (e.g. a quadrilateral annular shape) in plan view. Each mesa portion 76 may have various planar shapes in accordance with the planar shape of the gate trench 32 and the planar shape of each source trench 63.

The body region 31 is formed in a surface layer portion of the mesa portion 76 and a surface layer portion of the annular portion 77 in each cell region 39. The body region 31 is exposed from the side walls of the gate trench 32 and the inner peripheral walls and the outer peripheral walls of the source trench 63 in each cell region 39.

Each source region 41 is formed in the surface layer portion of the annular portion 77 in each cell region 39. The source region 41 is exposed from the side walls of the gate trench 32 and the outer peripheral walls of the source trench 63 in each cell region 39.

Each contact region 42 is formed in a region along the inner walls of each source trench 63 in the surface layer portion of the SiC semiconductor layer 2. The contact region 42 shown in FIG. 9A or the cancellation/compensation type contact region 42 shown in FIG. 11 may be formed.

Each contact region 42 is formed in the surface layer portion of the mesa portion 76 in each cell region 39. Each contact region 42 is formed in the surface layer portion of the annular portion 77 in each cell region 39. Each contact region 42 is formed in a region covering the inner wall of each source trench 63 in the SiC semiconductor layer 2. The bottom portion of each contact region 42 may be formed in parallel to the bottom wall of each source trench 63.

Each contact region 42, more specifically, includes an inner surface layer region 78, an outer surface layer region 79, and an inner wall region 80 (bottom portion region) integrally. The inner surface layer region 78 is formed in the surface layer portion of the body region 31 in the mesa portion 76. The inner surface layer region 78 is formed in the entire surface layer portion of the body region 31 in the mesa portion 76. The inner surface layer region 78 is electrically connected to the body region 31.

In this embodiment, the inner surface layer region 78 has a bottom portion extending in parallel to the first main surface 3. The inner surface layer region 78 is exposed from the inner peripheral walls of the source trench 63. An exposed portion of the mesa portion 76 exposed from the first main surface 3 is entirely formed by the contact region 42.

The inner surface layer region 78 may extend in a band shaped along the inner peripheral walls of the source trench 63 in plan view and exposes the body region 31 from the mesa portion 76. The inner surface layer region 78 may be formed in an endless shape (e.g. a quadrilateral annular shape) along the inner peripheral walls of the source trench 63 in plan view. In this case, the inner surface layer region 78 may expose the body region 31 from a central portion of the mesa portion 76.

The outer surface layer region 79 is formed in the surface layer portion of the body region 31 in the annular portion 77. The outer surface layer region 79 is electrically connected to the body region 31 and the source region 41. The outer surface layer region 79 is formed selectively in a region along the outer peripheral walls of the source trench 63 in a surface layer portion of the body region 31.

In this embodiment, the outer surface layer region 79 has a bottom portion extending in parallel to the first main surface 3. The outer surface layer region 79 has a depth approximately equal to the depth of the inner surface layer region 78. The outer surface layer region 79 is positioned at a region at the first main surface 3 side with respect to the bottom portion of the source region 41. In this embodiment, the bottom portion of the outer surface layer region 79 is positioned at a region between the first main surface 3 and the bottom portion of the source region 41. The bottom portion of the outer surface layer region 79 may be positioned at a region between the bottom portion of the body region 31 and the bottom portion of the source region 41.

In this embodiment, the outer surface layer region 79 is led out from the outer peripheral walls of the source trench 63 toward the gate trench 32. The outer surface layer region 79 is formed at an interval from the gate trench 32 toward the source trench 63 side. An end portion of the outer surface layer region 79 is positioned at a region between the gate trench 32 and the source trench 63.

In this embodiment, a plurality of outer surface layer regions 79 are formed selectively in regions along the outer peripheral walls of the source trench 63 in the surface layer portion of the body region 31. The plurality of outer surface layer regions 79 are formed at intervals along the outer peripheral walls of the source trench 63. In this embodiment, the outer surface layer regions 79 are formed, respectively, for the two outer peripheral walls extending in the first direction X and the two outer peripheral walls extending in the second direction Y in each source trench 63.

The two outer surface layer regions 79 formed along the two outer peripheral walls extending in the first direction X in the source trench 63 are orthogonal to the second direction Y. The two outer surface layer regions 79 formed along the two outer peripheral walls extending in the first direction X in the source trench 63 may be displaced in the first direction X so as not to be orthogonal to the second direction Y.

The two outer surface layer regions 79 formed along the two outer peripheral walls extending in the second direction Y in the source trench 63 are orthogonal to the first direction X. The two outer surface layer regions 79 formed along the two outer peripheral walls extending in the second direction Y in the source trench 63 may be displaced in the second direction Y so as not to be orthogonal to the first direction X.

The plurality of outer surface layer regions 79 may be formed in the outer peripheral walls of the source trench 63, respectively. Also, the outer surface layer region 79 extending in a band shape along the outer peripheral walls of the source trench 63 may be formed. Also, the outer surface layer region 79 of an endless shape (e.g. a quadrilateral annular shape) surrounding the outer peripheral walls of the source trench 63 may be formed.

The inner wall region 80 is positioned at a region at the second main surface 4 side with respect to the inner surface layer region 78 and the outer surface layer region 79 (the bottom portion of the source region 41). The inner wall region 80 includes a first region 81 and a second region 82. The first region 81 is connected to the inner surface layer region 78 and covers the inner peripheral wall of the source trench 63. The second region 82 is connected to the outer surface layer region 79 and covers the outer peripheral wall of the source trench 63.

The first region 81 covers a corner portion connecting the inner peripheral wall and the bottom wall of the source trench 63. The first region 81 covers the inner peripheral wall of the source trench 63 from the corner portion to the bottom wall of the source trench 63. The first region 81 has a first end portion positioned at the bottom wall of the source trench 63.

The second region 82 covers a corner portion connecting the outer peripheral wall and the bottom wall of the source trench 63. The second region 82 covers the outer peripheral wall of the source trench 63 from the corner portion to the bottom wall of the source trench 63. The second region 82 has a second end portion positioned at the bottom wall of each source trench 63. The second end portion of the second region 82 continues to the first end portion of the first region 81 in the bottom wall of the source trench 63.

When a cancellation/compensation type contact region 42 (see also FIG. 11) is employed, since the inner surface layer region 78 is not in contact with the source region 41, the p type impurities (acceptors) of the inner surface layer region 78 are not cancelled/compensated for by the n type impurities (donors) of the source region 41. Also, since the inner wall region 80 is not in contact with the source region 41, the p type impurities (acceptors) of the inner wall region 80 are not cancelled/compensated for by the n type impurities (donors) of the source region 41.

On the other hand, portions of the p type impurities (acceptors) of the outer surface layer region 79 are cancelled/compensated for by the n type impurities (donors) of the source region 41. This causes the outer surface layer region 79 of the contact region 42 to be a cancellation/compensation type. Each contact region 42 thereby has a cancelled/compensated region (the outer surface layer region 79) in a region at the surface layer portion side and a non-cancelled/compensated region (the inner wall region 80) in a region at the bottom portion side.

Each deep well region 70 is formed along the inner walls of each source trench 63 such as to cover each contact region 42 as is the case with the SiC semiconductor device 62 according to the third preferred embodiment.

As described above, the SiC semiconductor device 75 can exhibit the same advantageous effects as those described for the SiC semiconductor device 1.

Figure 21:
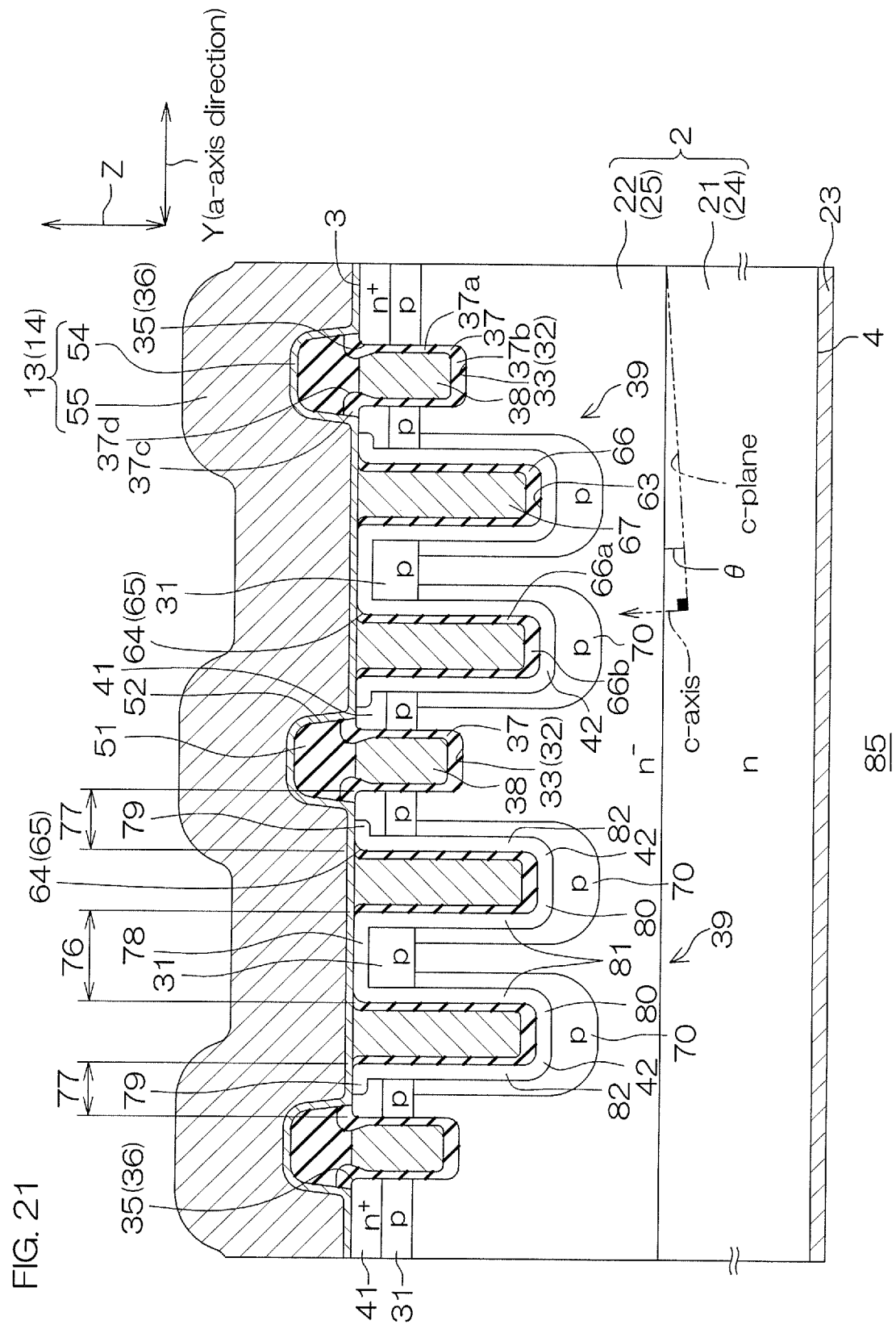
FIG. 21 is a cross-sectional view of a region corresponding to FIG. 19, showing an SiC semiconductor device according to a seventh preferred embodiment of the present invention.

FIG. 21 is a cross-sectional view of a region corresponding to FIG. 19, showing an SiC semiconductor device 85 according to a seventh preferred embodiment of the present invention. The structures corresponding to those described for the SiC semiconductor device 75 according to the sixth preferred embodiment will hereinafter be designated by the same reference signs to omit the description thereof.

With reference to FIG. 21, in this embodiment, the depth of each source trench 63 according to the SiC semiconductor device 85 is not less than the depth of the gate trench 32. More specifically, the depth of each source trench 63 is more than the depth of the gate trench 32. The bottom wall of each source trench 63 is positioned at the second main surface 4 side with respect to the bottom wall of the gate trench 32. The bottom wall of each source trench 63 is positioned at the SiC epitaxial layer 22 side with respect to the boundary between the SiC semiconductor substrate 21 and the SiC epitaxial layer 22.

Each source trench 63 may have a depth of not less than 0.5 μm and not more than 10 μm in the normal direction Z. The ratio of the depth of each source trench 63 to the depth of the gate trench 32 may be not less than 1.5. The ratio of the depth of each source trench 63 to the depth of the gate trench 32 is preferably not less than 2.

As described above, the SiC semiconductor device 85 can exhibit the same advantageous effects as those described for the SiC semiconductor device 1.

Figure 22:
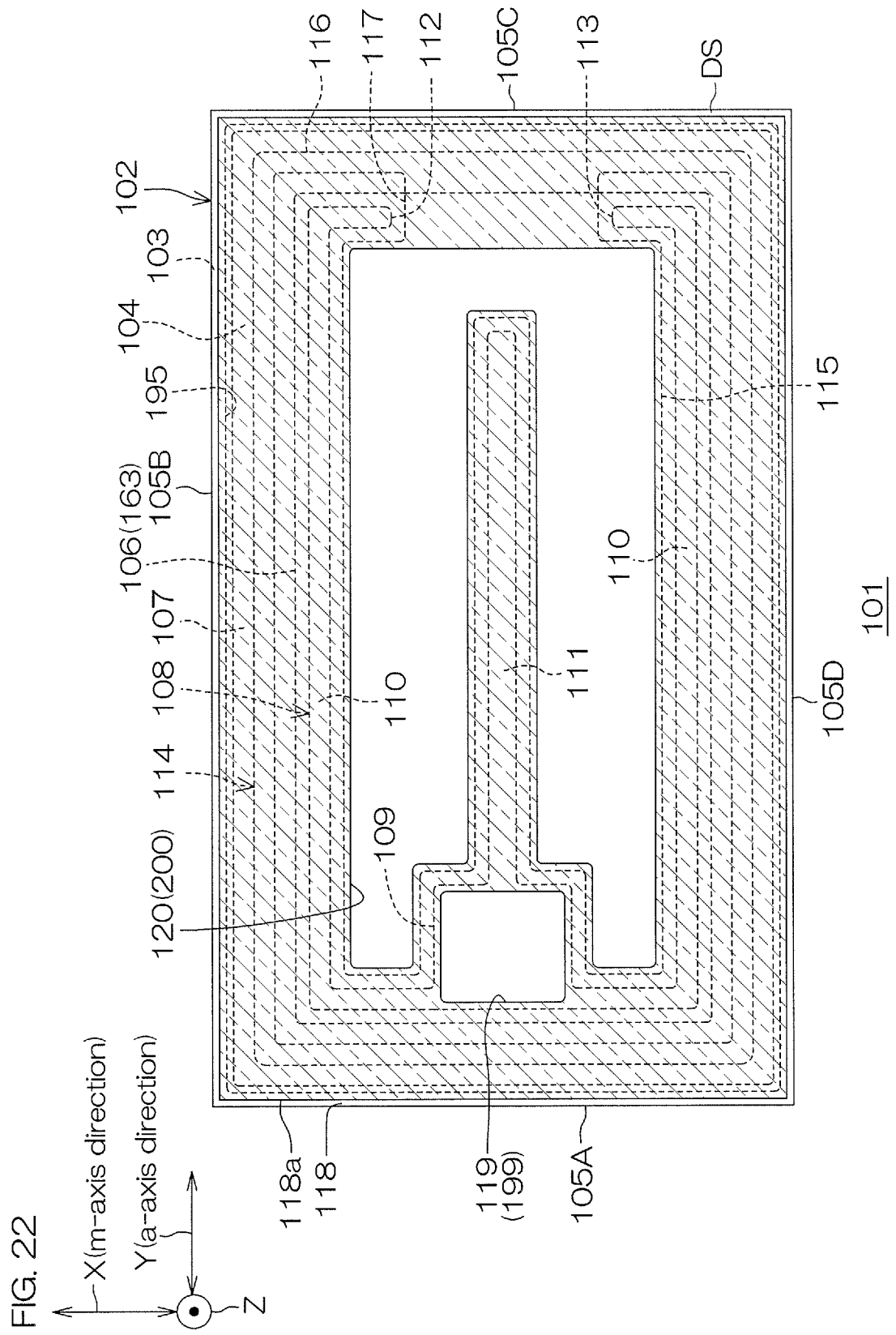
FIG. 22 is a plan view showing an SiC semiconductor device according to an eighth preferred embodiment of the present invention.
Figure 23:
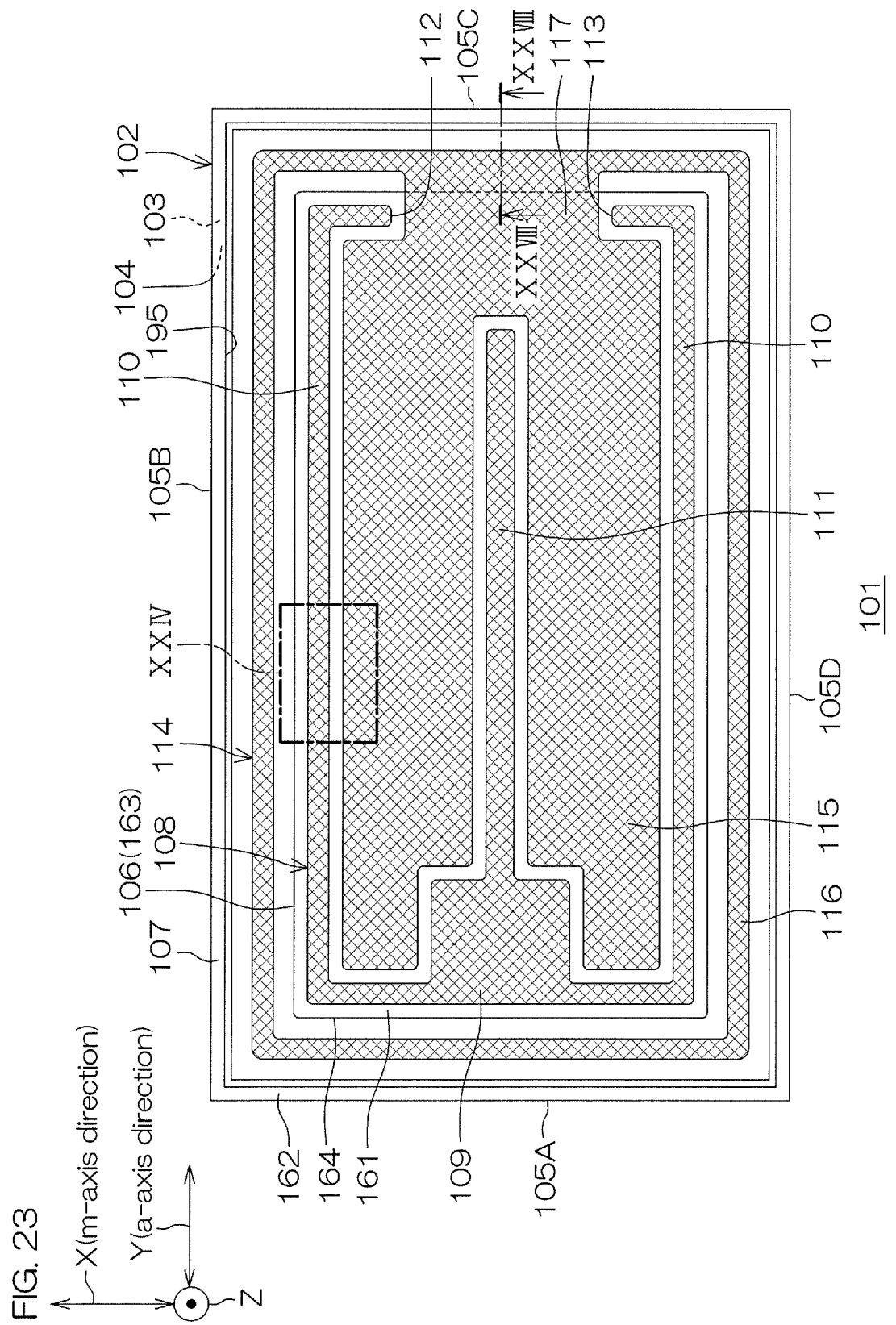
FIG. 23 is a plan view with a resin layer being removed from FIG. 22.

FIG. 22 is a plan view showing an SiC semiconductor device 101 according to an eighth preferred embodiment of the present invention. FIG. 23 is a plan view with a resin layer 118 being removed from FIG. 22.

With reference to FIG. 22 and FIG. 23, the SiC semiconductor device 101 includes an SiC semiconductor layer 102. The SiC semiconductor layer 102 includes a 4H-SiC monocrystal as an example of the hexagonal SiC monocrystal. The SiC semiconductor layer 102 is formed in a chip shape of rectangular parallelepiped shape.

The SiC semiconductor layer 102 has a first main surface 103 on one side, a second main surface 104 on the other side, and side surfaces 105A, 105B, 105C, 105D connecting the first main surface 103 and the second main surface 104. The first main surface 103 and the second main surface 104 are each formed in a quadrilateral shape (a rectangular shape in this embodiment) in plan view as viewed from normal directions Z thereof (hereinafter simply referred to as "plan view").

The first main surface 103 is an element forming surface in which a semiconductor element is formed. The second main surface 104 may be constituted of a ground surface having grinding marks. In this embodiment, the first main surface 103 and the second main surface 104 face the c-planes of the SiC monocrystal. The first main surface 103 faces the (0001) plane (silicon plane). The second main surface 104 faces the (000-1) plane (carbon plane) of the SiC monocrystal. The first main surface 103 has an off angle θ inclined at an angle not more than 10 degrees in the [11-20] direction with respect to the (0001) plane of the SiC monocrystal. The normal direction Z is inclined by the off angle θ with respect to the c-axis ([0001] direction) of the SiC monocrystal.

The off angle θ may be not less than 0 degrees and not more than 5.0 degrees. The off angle θ may be set within an angular range of not less than 0 degrees and not more than 1.0 degree, not less than 1.0 degree and not more than 1.5 degrees, not less than 1.5 degrees and not more than 2.0 degrees, not less than 2.0 degrees and not more than 2.5 degrees, not less than 2.5 degrees and not more than 3.0 degrees, not less than 3.0 degrees and not more than 3.5 degrees, not less than 3.5 degrees and not more than 4.0 degrees, not less than 4.0 degrees and not more than 4.5 degrees, or not less than 4.5 degrees and not more than 5.0 degrees. The off angle θ preferably exceeds 0 degrees. The off angle θ may be less than 4.0 degrees.

The off angle θ may be set within an angular range of not less than 3.0 degrees and not more than 4.5 degrees. In this case, the off angle θ is preferably set within an angular range of not less than 3.0 degrees and not more than 3.5 degrees or not less than 3.5 degrees and not more than 4.0 degrees. The off angle θ may be set within an angular range of not less than 1.5 degrees and not more than 3.0 degrees. In this case, the off angle θ is preferably set within an angular range of not less than 1.5 degrees and not more than 2.0 degrees or not less than 2.0 degrees and not more than 2.5 degrees.

The side surfaces 105A to 105D include, more specifically, a first side surface 105A, a third side surface 105C, and a fourth side surface 105D. In this embodiment, the first side surface 105A and the third side surface 105C extend in a first direction X and oppose each other in a second direction Y intersecting the first direction X. The first side surface 105A and the third side surface 105C form short sides of the SiC semiconductor layer 102 in plan view.

In this embodiment, the second side surface 105B and the fourth side surface 105D extend in the second direction Y and oppose each other in the first direction X. The second side surface 105B and the fourth side surface 105D form long sides of the SiC semiconductor layer 102 in plan view. The second direction Y is, more specifically, a direction orthogonal to the first direction X. The length of the side surfaces 105A to 105D may be not less than 1 mm and not more than 10 mm (e.g. not less than 2 mm and not more than 5 mm).

The side surfaces 105A to 105D may each be formed of a smooth cleavage surface facing one of the crystal planes of the SiC monocrystal. The side surfaces 105A to 105D may each be formed of a grinding surface having grinding marks. In this embodiment, the first direction X is set in the m-axis direction ([1-100] direction) of the SiC monocrystal. Also, the second direction Y is set in the a-axis direction ([11-20] direction) of the SiC monocrystal.

That is, the first side surface 105A and the third side surface 105C are formed by the a-planes of the SiC monocrystal and oppose each other in the a-axis direction of the SiC monocrystal. The first side surface 105A is formed by the (−1-120) plane of the SiC monocrystal. The third side surface 105C is formed by the (11-20) plane of the SiC monocrystal. The second side surface 105B and the fourth side surface 105D are formed by the m-planes of the SiC monocrystal and oppose each other in the m-axis direction of the SiC monocrystal. The second side surface 105B is formed by the (−1100) plane of the SiC monocrystal. The fourth side surface 105D is formed by the (1-100) plane of the SiC monocrystal.

The first side surface 105A and the third side surface 105C may form inclined surfaces that, when a normal to the first main surface 103 is taken as a basis, are inclined toward the c-axis direction ([0001] direction) of the SiC monocrystal with respect to the normal. The first side surface 105A and the third side surface 105C may be inclined at an angle in accordance with the off angle θ with respect to the normal of the first main surface 103 when the normal to the first main surface 103 is 0 degrees. The angle in accordance with the off angle θ may be equal to the off angle θ or may be more than 0 degrees and less than the off angle θ.

The SiC semiconductor layer 102 includes an active region 106 and an outer region 107. In the active region 6, a vertical MISFET is formed. The active region 106 is formed in a central portion of the SiC semiconductor layer 102 at intervals from the side surfaces 105A to 105D to the inner region in plan view. The active region 106 is formed in a quadrilateral shape (a rectangular shape in this embodiment) having four sides in parallel to the side surfaces 105A to 105D in plan view.

The outer region 107 is formed outside the active region 106. The outer region 107 is formed between the side surfaces 105A to 105D and the active region 106. The outer region 107 is formed in an endless shape (a quadrilateral annular shape in this embodiment) that surrounds the active region 106 in plan view.

The SiC semiconductor device 101 includes a gate main surface electrode layer 108 as one of first main surface electrode layers formed on the first main surface 103. The gate main surface electrode layer 108 is arranged to be applied with a gate voltage. The gate voltage may be not less than 10 V and not more than 50 V (e.g. about 30 V). The gate main surface electrode layer 108 includes a gate pad 109 and gate fingers 110, 111. The gate pad 109 and the gate fingers 110, 111 are arranged in the active region 106.

The gate pad 109 is formed in a region along the first side surface 105A in plan view. In this embodiment, the gate pad 109 is formed in a region along a central portion of the first side surface 105A in plan view. The gate pad 109 may be formed in a quadrilateral shape in plan view. The gate pad 109 may be formed along a corner portion connecting any two of the side surfaces 105A to 105D in plan view.

The gate fingers 110, 111 include an outer gate finger 110 and an inner gate finger 111. The outer gate finger 110 is led out from the gate pad 109 and extends in a band shape along a peripheral edge of the active region 106. In this embodiment, the outer gate finger 110 is formed along the three side surfaces 105A, 105B, 105D and demarcates an inner region of the active region 106 from three directions.

The outer gate finger 110 has a pair of open end portions 112, 113. The pair of open end portions 112, 113 are formed in a region opposed to the gate pad 109 with the inner region of the active region 106 therebetween. In this embodiment, the pair of open end portions 112, 113 are formed in a region along the third side surface 105C.

The inner gate finger 111 is led out from the gate pad 109 into the inner region of the active region 106. The inner gate finger 111 extends in a band shape in the inner region of the active region 106. The inner gate finger 111 extends from the gate pad 109 toward the third side surface 105C.

The SiC semiconductor device 101 includes a source main surface electrode layer 114 as one of first main surface electrode layers formed on the first main surface 103. The source main surface electrode layer 114 is arranged to be applied with a source voltage. The source voltage may be a reference voltage (e.g. GND voltage). In this embodiment, the source main surface electrode layer 114 includes a source pad 115, a source routing wiring 116, and a source connection portion 117.

The source pad 115 is formed in the active region 106 at an interval from the gate main surface electrode layer 108. The source pad 115 is formed in a C shape (inverted C shape in FIG. 22 and FIG. 23) in plan view such as to cover a C-shaped (inverted C-shaped in FIG. 22 and FIG. 23) region demarcated by the gate pad 109 and the gate fingers 110, 111.

The source routing wiring 116 is formed in the outer region 107. The source routing wiring 116 extends in a band shape along the active region 106. In this embodiment, the source routing wiring 116 is formed in an endless shape (a quadrilateral annular shape in this embodiment) that surrounds the active region 106 in plan view. The source routing wiring 116 is electrically connected to the SiC semiconductor layer 102 in the outer region 107.

The source connection portion 117 connects the source pad 115 and the source routing wiring 116. The source connection portion 117 is arranged in a region between the pair of open end portions 112, 113 of the outer gate finger 110. The source connection portion 117 crosses a boundary region between the active region 106 and the outer region 107 and is connected to the source routing wiring 116.

The MISFET formed in the active region 106 includes an npn type parasitic bipolar transistor due to its structure. When an avalanche current generated in the outer region 107 flows into the active region 106, the parasitic bipolar transistor is turned on. In this case, the control of the MISFET can be made unstable due to, for example, latchup.

Therefore, with the SiC semiconductor device 101, the structure of the source main surface electrode layer 114 is used to form an avalanche current absorbing structure that absorbs the avalanche current generated in the outer region 107. More specifically, the avalanche current generated in the outer region 107 is absorbed by the source routing wiring 116. The avalanche current absorbed by the source routing wiring 116 reaches the source pad 115 through the source connection portion 117.

If a conductive wire (e.g. a bonding wire) for external connection is connected to the source pad 115, the avalanche current is extracted by the conductive wire. Switching of the parasitic bipolar transistor to the on state by an undesirable current generated in the outer region 107 can thereby be suppressed. Latchup can thus be suppressed and therefore stability of control of the MISFET can be improved.

The SiC semiconductor device 101 includes a resin layer 118 formed on the first main surface 103. In FIG. 22, the resin layer 118 is indicated by hatching. The resin layer 118 may include a negative type or positive type photosensitive resin. In this embodiment, the resin layer 118 includes polybenzoxazole as an example of the positive-type photosensitive resin. The resin layer 118 may include polyimide as an example of the negative-type photosensitive resin.

The resin layer 118 selectively covers the gate main surface electrode layer 108 and the source main surface electrode layer 114. The resin layer 118 includes a gate pad opening 119 and a source pad opening 120. The gate pad opening 119 exposes the gate pad 109. The source pad opening 120 exposes the source pad 115.

A peripheral edge portion 118a of the resin layer 118 is formed at intervals from the side surfaces 105A to 105D to the inner region. The resin layer 118 thereby, with the side surfaces 105A to 105D, demarcates a dicing street DS exposing a peripheral edge portion of the SiC semiconductor layer 102 in plan view. According to the dicing street DS, it is made unnecessary to physically cut the resin layer 118. It is therefore possible to smoothly cut the SiC semiconductor device 101 out of a single SiC semiconductor wafer. The insulation distance from the side surfaces 105A to 105D can also be increased.

The dicing street DS may have a width of not less than 1 μm and not more than 25 μm. The width of the dicing street DS has a width in a direction orthogonal to the direction in which the dicing street DS extends. The dicing street DS may have a width of not less than 1 μm and not more than 5 μm, not less than 5 μm and not more than 10 μm, not less than 10 μm and not more than 15 μm, not less than 15 μm and not more than 20 μm, or not less than 20 μm and not more than 25 μm.

Figure 24:
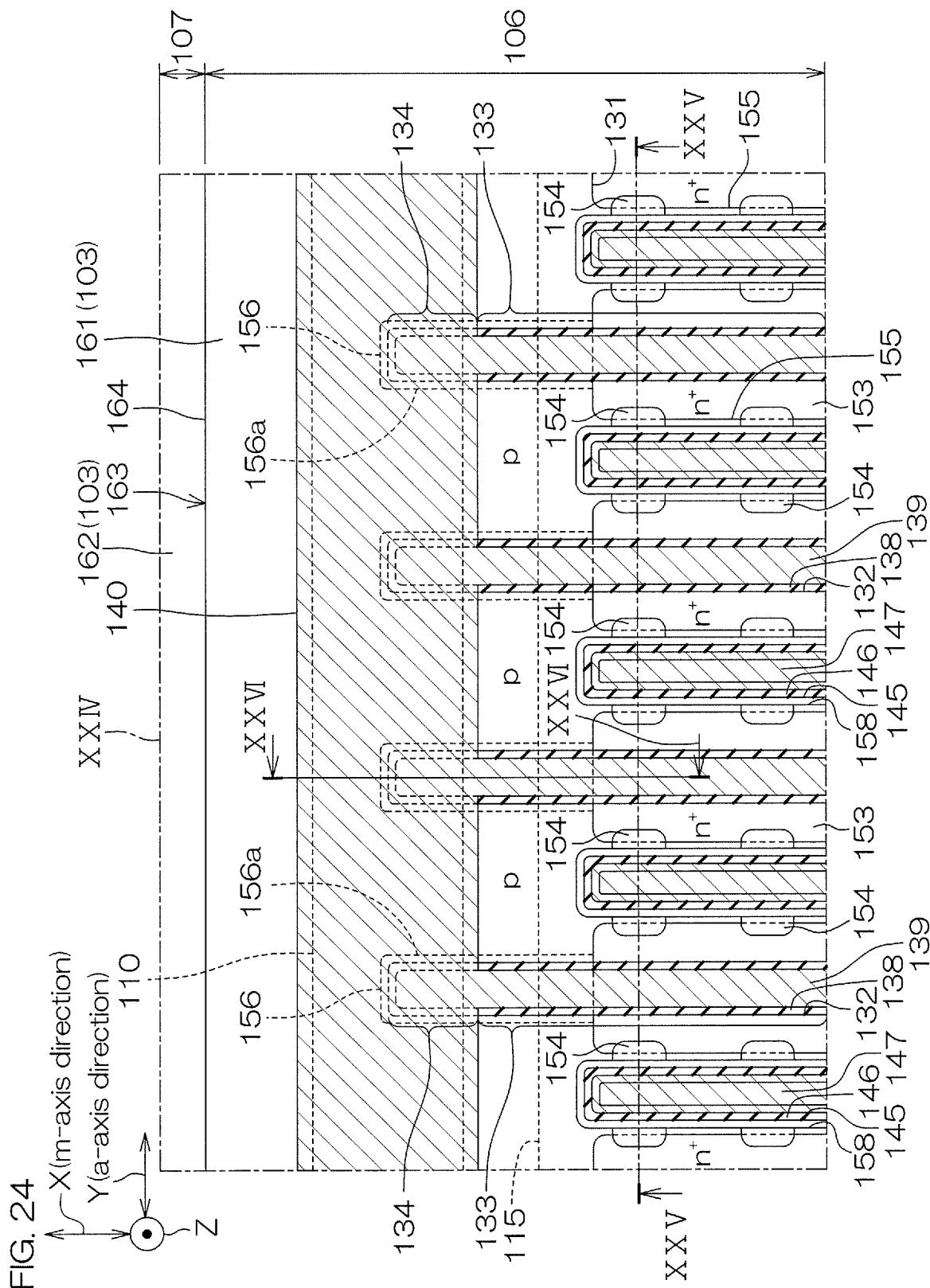
FIG. 24 is an enlarged view of the region XXIV shown in FIG. 23 for describing structures of a first main surface of an SiC semiconductor layer.
Figure 25:
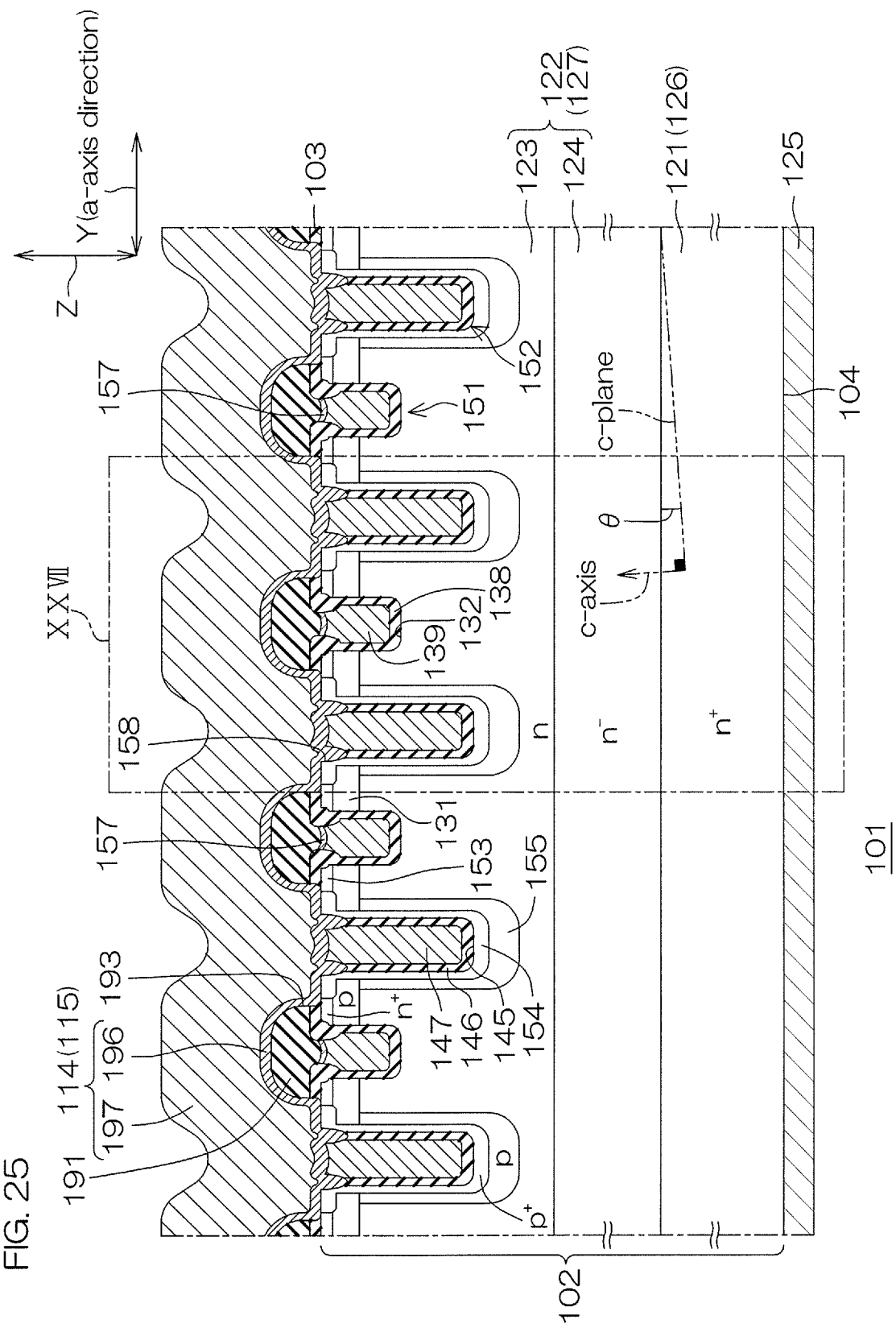
FIG. 25 is a cross-sectional view taken along line XXV-XXV in FIG. 24.
Figure 26:
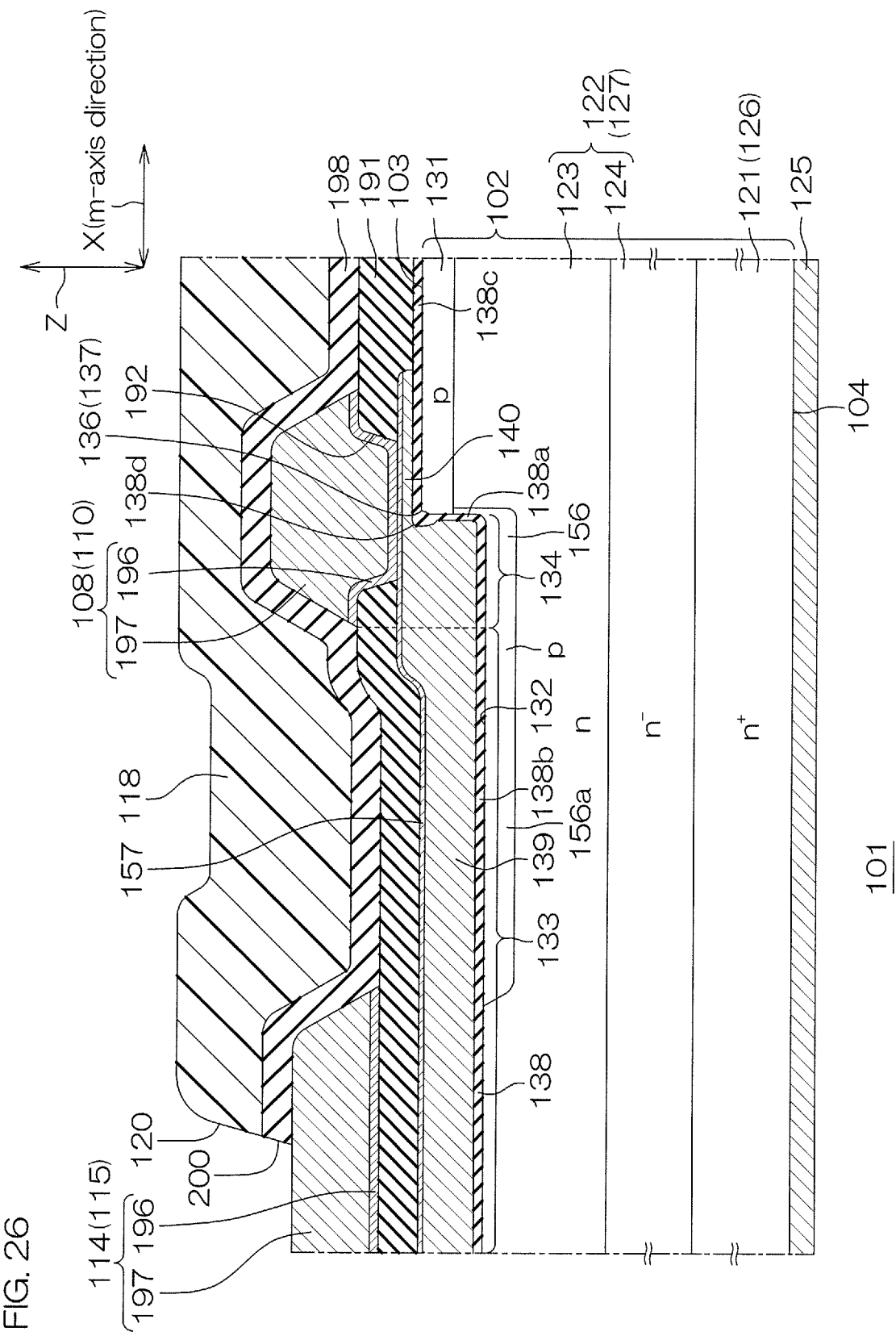
FIG. 26 is a cross-sectional view taken along line XXVI-XXVI in FIG. 24.
Figure 27:
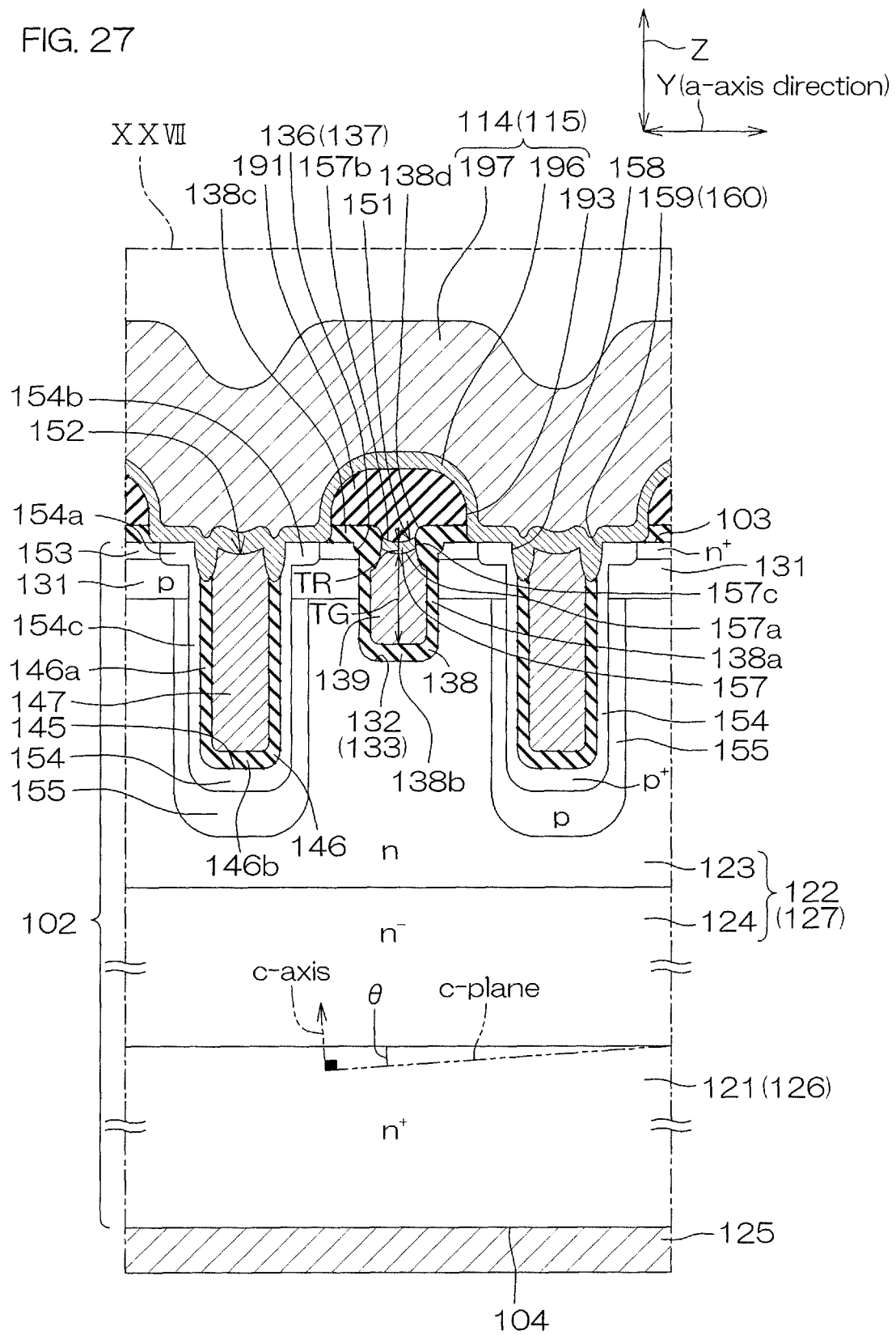
FIG. 27 is an enlarged view of the region XXVII shown in FIG. 25.
Figure 28:
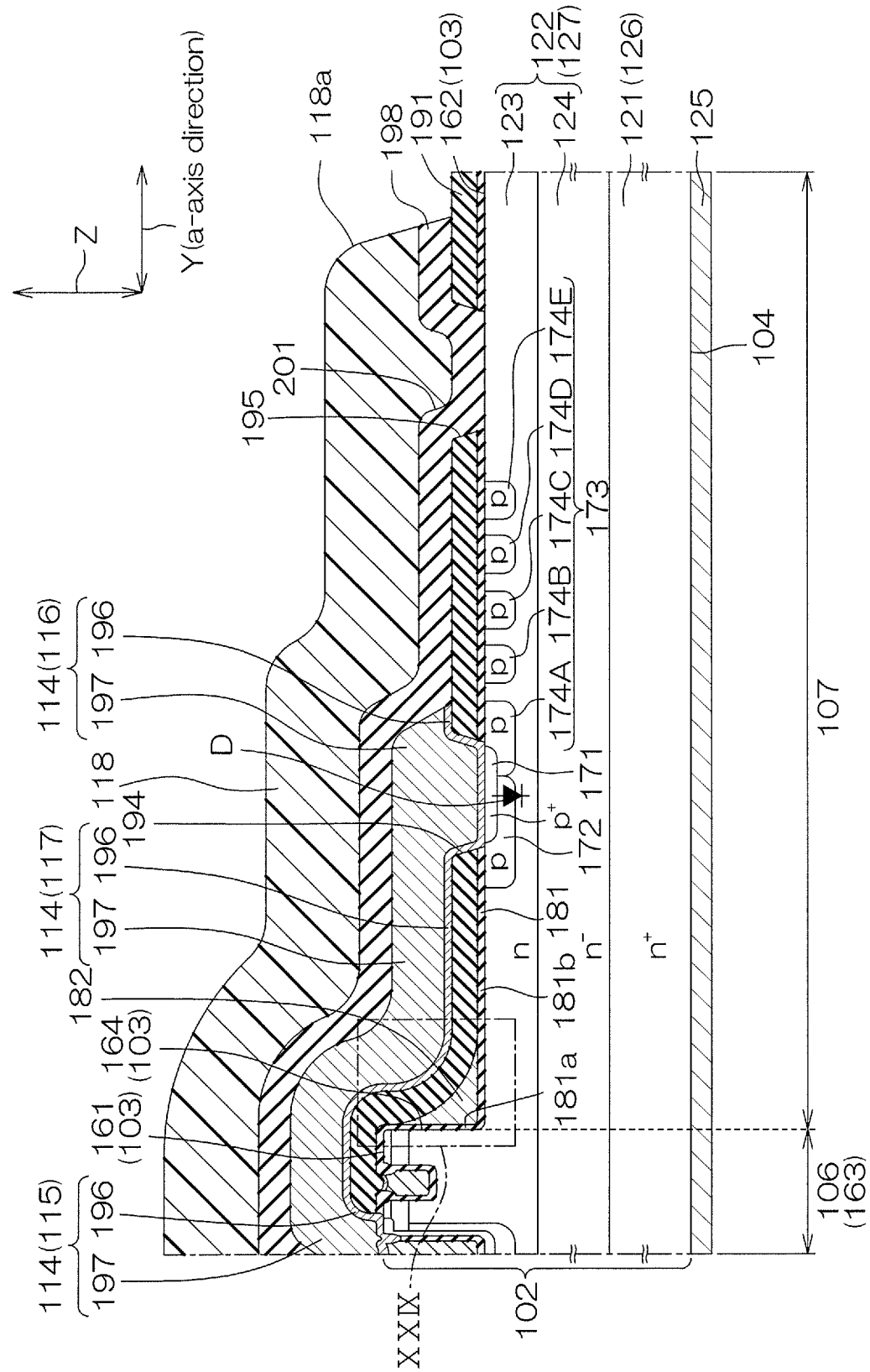
FIG. 28 is a cross-sectional view taken along line XXVIII-XXVIII in FIG. 23.
Figures 2, 28:
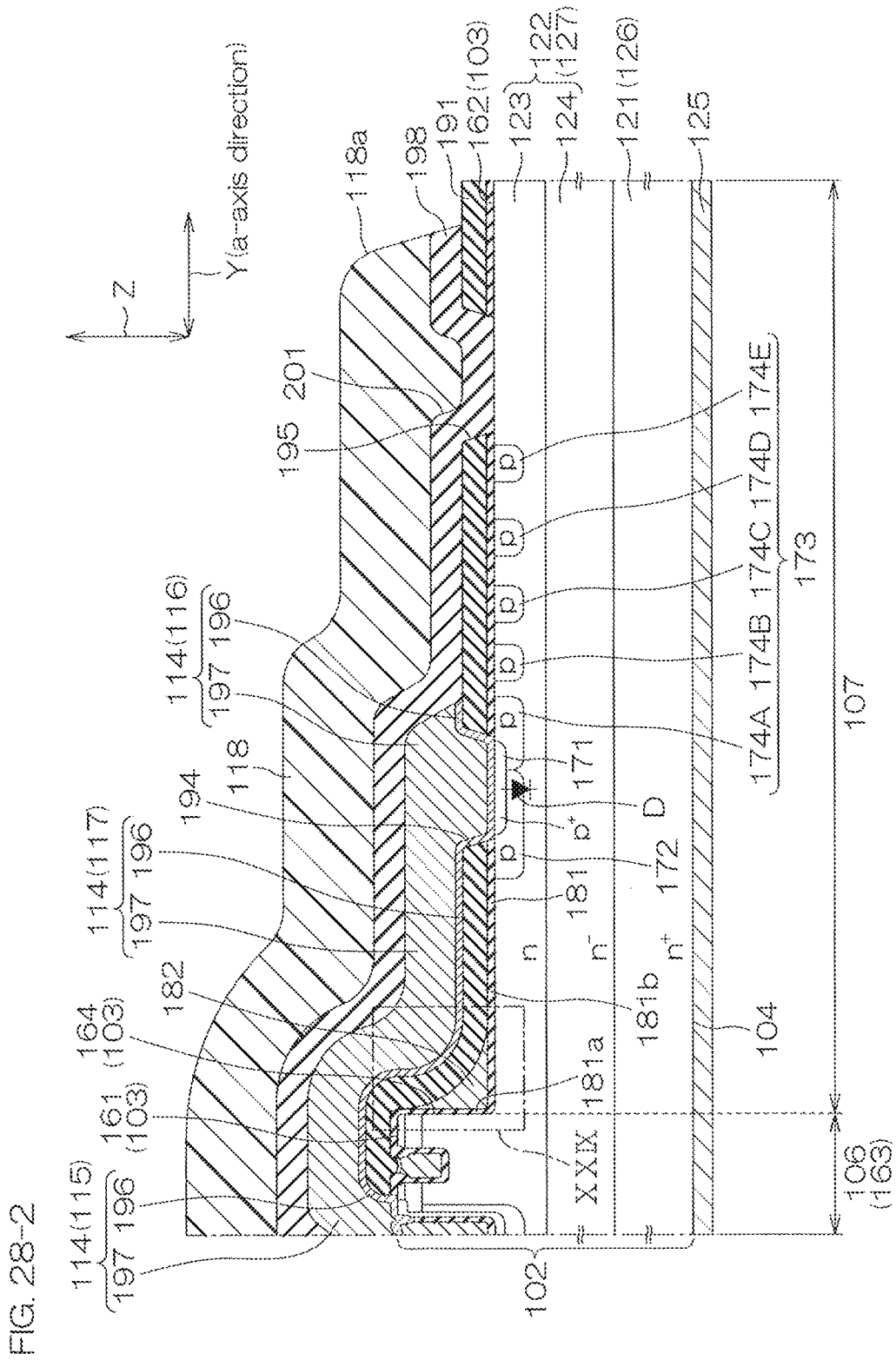
Figures 2, 29:
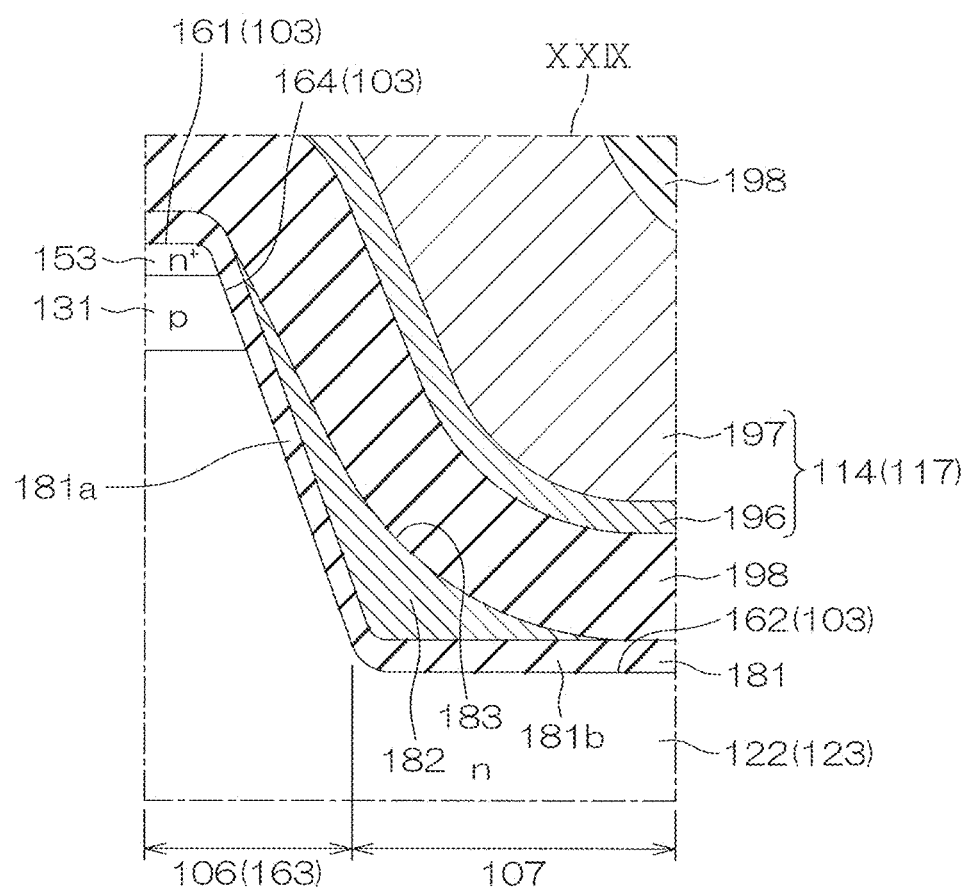
FIG. 29 is an enlarged view of the region XXIX shown in FIG. 28.

FIG. 24 is an enlarged view of the region XXIV shown in FIG. 23 for describing structures of the first main surface 103. FIG. 25 is a cross-sectional view taken along line XXV-XXV in FIG. 24. FIG. 26 is a cross-sectional view taken along line XXVI-XXVI in FIG. 24. FIG. 27 is an enlarged view of the region XXVII shown in FIG. 25. FIG. 28 is a cross-sectional view taken along line XXVIII-XXVIII in FIG. 23. FIG. 29 is an enlarged view of the region XXIX shown in FIG. 28.

With reference to FIG. 24 to FIG. 28, the SiC semiconductor layer 102, in this embodiment, has a layered structure including an n$^+$ type SiC semiconductor substrate 121 and an n type SiC epitaxial layer 122. The SiC semiconductor substrate 121 is formed as a drain region 126 of the MISFET. The SiC epitaxial layer 122 is formed as a drift region 127 of the MISFET. The second main surface 104 is formed by the SiC semiconductor substrate 121. The first main surface 103 is formed by the SiC epitaxial layer 122. The side surfaces 105A to 105D are formed by the SiC semiconductor substrate 121 and the SiC epitaxial layer 122.

The SiC semiconductor substrate 121 may have a thickness of not less than 1 μm and less than 1000 μm. The SiC semiconductor substrate 121 may have a thickness of not less than 1 μm and not more than 50 μm, not less than 50 μm and not more than 100 μm, not less than 100 μm and not more than 150 μm, not less than 150 μm and not more than 200 μm, not less than 200 μm and not more than 250 μm, not less than 250 μm and not more than 300 μm, not less than 300 μm and not more than 400 μm, not less than 400 μm and not more than 500 μm, not less than 500 μm and not more than 600 μm, not less than 600 μm and not more than 700 μm, not less than 700 μm and not more than 800 μm, not less than 800 μm and not more than 900 μm, or not less than 900 μm and not more than 1000 μm. The SiC semiconductor substrate 121 preferably has a thickness not less than 10 μm and not more than 150 μm. By thinning the SiC semiconductor substrate 121, a current path is shortened and reduction of the resistance value can thus be achieved.

The SiC epitaxial layer 122 has an n type impurity concentration not more than an n type impurity concentration of the SiC semiconductor substrate 121. More specifically, the SiC epitaxial layer 122 has the n type impurity concentration lower than the n type impurity concentration of the SiC semiconductor substrate 121. The SiC semiconductor substrate 121 may have the n type impurity concentration of not less than $1.0 \times 10^{18}$ cm$^{-3}$ and not more than $1.0 \times 10^{21}$ cm$^{-3}$. The SiC epitaxial layer 122 has the n type impurity concentration of not less than $1.0 \times 10^{15}$ cm$^{-3}$ and not more than $1.0 \times 10^{18}$ cm$^{-3}$.

In this embodiment, the SiC epitaxial layer 122 includes a plurality of regions having different n type impurity concentrations along the normal direction Z. More specifically, the SiC epitaxial layer 122 includes a high concentration region 123 having a comparatively high n type impurity concentration and a low concentration region 124 having an n type impurity concentration lower than the high concentration region 123.

The high concentration region 123 may have the n type impurity concentration of not less than $1.0 \times 10^{16}$ cm$^{-3}$ and not more than $1.0 \times 10^{18}$ cm$^{-3}$. The low concentration region 124 may have the n type impurity concentration of not less than $1.0 \times 10^{15}$ cm$^{-3}$ and not more than $1.0 \times 10^{16}$ cm$^{-3}$.

The high concentration region 123 is formed in a region at the first main surface 103 side. The low concentration region 124 is formed in a region at the second main surface 104 side with respect to the high concentration region 123. The high concentration region 123 has a thickness not more than the thickness of the low concentration region 124. More specifically, the high concentration region 123 has a thickness less than the thickness of the low concentration region 124. The high concentration region 123 has a thickness less than half the total thickness of the SiC epitaxial layer 122.

The SiC epitaxial layer 122 may have a thickness of not less than 1 μm and not more than 100 μm. The SiC epitaxial layer 122 may have a thickness of not less than 1 μm and not more than 5 μm, not less than 5 μm and not more than 10 μm, not less than 10 μm and not more than 15 μm, not less than 15 μm and not more than 20 μm, not less than 25 μm and not more than 30 μm, not less than 30 μm and not more than 40 μm, not less than 40 μm and not more than 50 μm, not less than 50 μm and not more than 60 μm, not less than 60 μm and not more than 70 μm, not less than 70 μm and not more than 80 μm, not less than 80 μm and not more than 90 μm, or not less than 90 μm and not more than 100 μm. The SiC epitaxial layer 122 preferably has a thickness less than the thickness of the SiC semiconductor substrate 121. The SiC epitaxial layer 122 preferably has a thickness of not less than 5 μm and not more than 15 μm.

The SiC semiconductor device 101 includes a drain electrode layer 125 as a second main surface electrode layer formed on the second main surface 104. The drain electrode layer 125 forms an Ohmic contact with the second main surface 104. The drain electrode layer 125 is arranged to be applied with a drain voltage. The maximum voltage applicable between the source main surface electrode layer 114 and the drain electrode layer 125 in an off state may be not less than 1000 V and not more than 10000 V.

The drain electrode layer 125 may include at least one of Ti layer, Ni layer, Au layer, Ag layer, and Al layer. The drain electrode layer 125 may have a single layer structure including a Ti layer, an Ni layer, an Au layer, an Ag layer, or an Al layer. The drain electrode layer 125 may have a layered structure in which at least two of Ti layer, Ni layer, Au layer, Ag layer, and Al layer are layered in an arbitrary manner. The drain electrode layer 125 may have a layered structure including a Ti layer, an Ni layer, an Au layer, and an Ag layer laminated in this order from the second main surface 104.

The SiC semiconductor device 101 includes a p type body region 131 formed in a surface layer portion of the first main surface 103 in the active region 106. In this embodiment, the body region 131 is formed over an entire region forming the active region 106 in the first main surface 103. That is, the body region 131 defines the active region 106.

The body region 131 may have a peak value of a p type impurity concentration of not less than $1.0 \times 10^{17}$ cm$^{-3}$ and not more than $1.0 \times 10^{19}$ cm$^{-3}$. A lower limit of the peak value of the p type impurity concentration of the body region 131 is preferably not less than $1.0 \times 10^{18}$ cm$^{-3}$.

The SiC semiconductor device 101 includes a plurality of gate trenches 132 (trenches) formed in a surface layer portion of the first main surface 103 in the active region 106. The plurality of gate trenches 132 are each formed in a band shape extending in the first direction X and formed at intervals in the second direction Y. The plurality of gate trenches 132 are formed in a striped manner extending in the first direction X in plan view.

One end portion of each gate trench 132 is positioned at a peripheral edge portion at one side of the active region 106. The other end portion of each gate trench 132 is positioned at a peripheral edge portion at the other side of the active region 106. In this embodiment, each gate trench 132 extends in a band shape from the peripheral edge portion at one side (the second side surface 105B side) toward the peripheral edge portion at the other side (the fourth side surface 105D side) of the active region 106. Each gate trench 132 crosses an intermediate portion between the peripheral edge portion at one side and the peripheral edge portion at the other side of the active region 106.

Each gate trench 132 may have a length of not less than 0.5 μm. In the cross-section shown in FIG. 26, each gate trench 132 has a length extending from an end portion in which the gate trench 132 and the gate fingers 110, 111 are connected to an opposite end portion. In this embodiment, each gate trench 132 has a length of not less than 1 mm and not more than 10 mm (e.g. not less than 2 mm and not more than 5 mm). The total extension of one or more of the gate trenches 132 per unit area may be not less than 0.5 μm/μm$^2$ and not more than 0.75 μm/μm$^2$.

Each gate trench 132 includes an active trench portion 133 and a contact trench portion 134 integrally. The active trench portion 133 is a portion in the active region 106 oriented along a channel of the MISFET. The contact trench portion 134 is a portion of the gate trench 132 that mainly serves as a contact with the outer gate finger 110.

The contact trench portion 134 is led out from the active trench portion 133 to the peripheral edge portion of the active region 106. The contact trench portion 134 is formed in a region directly below the outer gate finger 110. A lead-out amount of the contact trench portion 134 is arbitrary.

Each gate trench 132 penetrates through the body region 131 and reaches the drift region 127 (the SiC epitaxial layer 122). Each gate trench 132 includes side walls and a bottom wall. The side walls forming long sides of each gate trench 132 are formed by the a-planes of the SiC monocrystal. The side walls forming short sides of each gate trench 132 are formed by the m-planes of the SiC monocrystal.

The side walls of each gate trench 132 may extend in the normal direction Z. The side walls of each gate trench 132 may be formed approximately perpendicularly to the first main surface 103. The angle between the side walls of each gate trench 132 and the first main surface 103 inside the SiC semiconductor layer 102 may be not less than 90 degrees and not more than 95 degrees (e.g. not less than 91 degrees and not more than 93 degrees). Each gate trench 132 may be formed in a tapered shape with a bottom area being less than an opening area.

The bottom wall of each gate trench 132 is positioned at the drift region 127 (the SiC epitaxial layer 122). More specifically, the bottom wall of each gate trench 132 is positioned at the high concentration region 123 of the SiC epitaxial layer 122. The bottom wall of each gate trench 132 faces the c-plane of the SiC monocrystal. The bottom wall of each gate trench 132 has the off angle θ inclined in the [11-20] direction with respect to the (0001) plane of the SiC monocrystal. The bottom wall of each gate trench 132 may be formed in parallel to the first main surface 103. The bottom wall of each gate trench 132 may be formed in a convex curved shape toward the second main surface 104.

Each gate trench 132 may have a depth of not less than 0.5 μm and not more than 3.0 μm in the normal direction Z. Each gate trench 132 may have a depth of not less than 0.5 μm and not more than 1.0 μm, not less than 1.0 μm and not more than 1.5 μm, not less than 1.5 μm and not more than 2.0 μm, not less than 2.0 μm and not more than 2.5 μm, or not less than 2.5 μm and not more than 3.0 μm.

Each gate trench 132 may have a width in the second direction Y not less than 0.1 μm and not more than 2 μm. Each gate trench 132 may have a width of not less than 0.1 μm and not more than 0.5 μm, not less than 0.5 μm and not more than 1.0 μm, not less than 1.0 μm and not more than 1.5 μm, or not less than 1.5 μm and not more than 2 μm.

With reference to FIG. 27, an opening edge portion 136 of each gate trench 132 includes an inclined portion 137 that is inclined downwardly from the first main surface 103 toward the inside of each gate trench 132. The opening edge portion 136 of each gate trench 132 is a corner portion connecting the first main surface 103 and the side walls of each gate trench 132.

In this embodiment, the inclined portion 137 is formed in a concave curved shape toward the inside of the SiC semiconductor layer 102. The inclined portion 137 may be formed in a convex curved shape toward the inside of each gate trench 132. The inclined portion 137 is arranged to relax the concentration of the electric field in the opening edge portion 136 of each gate trench 132.

The SiC semiconductor device 101 includes a gate insulating layer 138 formed on an inner wall of each gate trench 132. The SiC semiconductor device 101 also includes a gate electrode layer 139 embedded in each gate trench 132 with the gate insulating layer 138 therebetween. In FIG. 24, the gate insulating layer 138 and the gate electrode layer 139 are indicated by hatching.

The gate insulating layer 138 is formed in a film along the inner wall surface of the gate trench 132 and demarcates a recessed space inside the gate trench 132. The gate insulating layer 138 includes a first region 138a, a second region 138b, and a third region 138c. The first region 138a is formed along the side walls of the gate trench 132. The second region 138b is formed along the bottom wall of the gate trench 132. The third region 138c is formed along the first main surface 103.

The thickness Ta of the first region 138a is less than the thickness Tb of the second region 138b and the thickness Tc of the third region 138c. The ratio of the thickness Tb of the second region 138b to the thickness Ta of the first region 138a (Tb/Ta) may be not less than 2 and not more than 5. The ratio of the thickness Tc of the third region 138c to the thickness Ta of the first region 138a (Tc/Ta) may be not less than 2 and not more than 5.

The thickness Ta of the first region 138a may be not less than 0.01 μm and not more than 0.2 μm. The thickness Tb of the second region 138b may be not less than 0.05 μm and not more than 0.5 μm. The thickness Tc of the third region 138c may be not less than 0.05 μm and not more than 0.5 μm.

By making the first region 138a thin, an increase in carriers induced in regions of the body region 131 in vicinities of the side walls of the gate trench 132 can be suppressed. This allows the increase in the channel resistance to be suppressed. Thickening the second region 138b allows the concentration of the electric field to be reduced in the bottom wall of each gate trench 132.

Thickening the third region 138c allows the withstand voltage of the gate insulating layer 138 to be increased in the vicinity of the opening edge portion 136 of each gate trench 132. Thickening the third region 138c also allows the disappearance of the third region 138c due to an etching method to be suppressed. This further allows the disappearance of the first region 138a due to an etching method to be suppressed. It is therefore possible to make the gate electrode layer 139 appropriately opposed to the SiC semiconductor layer 102 (the body region 131) with the gate insulating layer 138 therebetween.

The gate insulating layer 138 further includes a bulging portion 138d bulging toward the inside of each gate trench 132 at the opening edge portion 136 of the gate trench 132. The bulging portion 138d is formed at a corner portion connecting the first region 138a and the third region 138c of the gate insulating layer 138. The bulging portion 138d is overhung in a convex curved shape toward the inside of each gate trench 132.

The bulging portion 138d narrows the opening of each gate trench 132 at the opening edge portion 136 of each gate trench 132. The bulging portion 138d increases the dielectric withstand voltage of the gate insulating layer 138 at the opening edge portion 136. The gate insulating layer 138 to having a bulging portion 138d may be formed. Also, the gate insulating layer 138 having a uniform thickness may be formed.

The gate insulating layer 138 includes at least one of a silicon oxide ($SiO_2$) layer, a silicon nitride (SiN) layer, an aluminum oxide ($Al_2O_3$) layer, a zirconium oxide ($ZrO_2$) layer, and a tantalum oxide ($Ta_2O_3$) layer. The gate insulating layer 138 may have a layered structure including an SiN layer and an $SiO_2$ layer laminated in this order from the first main surface 103 side.

The gate insulating layer 138 may have a layered structure including an $SiO_2$ layer and an SiN layer laminated in this order from the first main surface 103 side. The gate insulating layer 138 may have a single layer structure consisting of an $SiO_2$ layer or an SiN layer. In this embodiment, the gate insulating layer 138 has a single layer structure consisting of an $SiO_2$ layer.

The gate electrode layer 139 is embedded in a recessed space demarcated by the gate insulating layer 138 inside each gate trench 132. The gate electrode layer 139 is arranged to be controlled under a gate voltage. The gate electrode layer 139 has an upper end portion positioned at the opening side of each gate trench 132. The upper end portion of the gate electrode layer 139 is formed in a concave curved shape recessed toward the bottom wall of each gate trench 132. The upper end portion of the gate electrode layer 139 has a constricted portion constricted along the bulging portion 138d of the gate insulating layer 138.

The gate electrode layer 139 may have a cross-sectional area (orthogonal to the direction in which each gate trench 132 extends) of not less than 0.05 $\mu m^2$ and not more than 0.5 $\mu m^2$. The cross-sectional area of the gate electrode layer 139 is formed by the product of the depth of the gate electrode layer 139 and the width of the gate electrode layer 139. The depth of the gate electrode layer 139 is the distance from the upper end portion to the lower end portion of the gate electrode layer 139. The width of the gate electrode layer 139 is the width of the gate trench 132 at the intermediate position between the upper end portion and the lower end portion of the gate electrode layer 139. The upper end portion of the gate electrode layer 139, if curved (in a concave curved shape in this embodiment), is at the intermediate position on the upper surface of the gate electrode layer 139.

The gate electrode layer 139 includes p type polysilicon doped with p type impurities. The gate electrode layer 139 has a p type impurity concentration of not less than the p type impurity concentration of the body region 131. More specifically, the gate electrode layer 139 has the p type impurity concentration exceeding the p type impurity concentration of the body region 131.

The gate electrode layer 139 may have the p type impurity concentration of not less than $1.0 \times 10^8$ $cm^{-3}$ and not more than $1.0 \times 10^{22}$ $cm^{-3}$. The p type impurities of the gate electrode layer 139 may include at least one of boron (B), aluminum (Al), indium (In), and Gallium (Ga). The gate electrode layer 139 may have a sheet resistance of not less than 10Ω/□ and not more than 500Ω/□ (about 200Ω/□ in this embodiment).

With reference to FIG. 24 and FIG. 26, the SiC semiconductor device 101 includes a gate wiring layer 140 formed on the first main surface 103 in the active region 106. More specifically, the gate wiring layer 140 is formed on the third region 138c of the gate insulating layer 138. The gate wiring layer 140 is electrically connected to the gate electrode layer 139, the gate pad 109, and the gate fingers 110, 111. In FIG. 26, the gate wiring layer 140 is indicated by hatching.

In this embodiment, the gate wiring layer 140 is formed along the three side surfaces 105A, 105B, 105D of the SiC semiconductor layer 102 and demarcates the inner region of the active region 106 from three directions. The gate wiring layer 140 is formed along the outer gate finger 110.

The gate wiring layer 140 is connected to the gate electrode layer 139 exposed from the contact trench portion 134 of each gate trench 132. In this embodiment, the gate wiring layer 140 is formed by a lead-out portion of the gate electrode layer 139 led out from each gate trench 132 onto the first main surface 103. The upper end portion of the gate wiring layer 140 is connected to the upper end portion of the gate electrode layer 139.

With reference to FIG. 24, FIG. 25 and FIG. 27, the SiC semiconductor device 101 includes a plurality of source trenches 145 (second trenches) formed in the first main surface 103 in the active region 106. Each source trench 145 is formed in a region between two adjacent ones of the gate trenches 132. The plurality of source trenches 145 are each formed in a band shape extending in the first direction X (the m-axis direction of the SiC monocrystal). The plurality of source trenches 145 are formed in a striped manner extending in the first direction X in plan view. A pitch in the second direction Y between central portions of source trenches 145 that are mutually adjacent may be not less than 1.5 μm and not more than 3 μm.

Each source trench 145 penetrates through the body region 131 and reaches the drift region 127 (the SiC epitaxial layer 122). Each source trench 145 includes side walls and a bottom wall. The side walls forming long sides of each source trench 145 are formed by the a-planes of the SiC monocrystal. The side walls forming short sides of each source trench 145 are formed by the m-planes of the SiC monocrystal.

The side walls of each source trench 145 may extend in the normal direction Z. The side walls of each source trench 145 may be formed approximately perpendicularly to the first main surface 103. The angle between the side walls of each source trench 145 and the first main surface 103 inside the SiC semiconductor layer 102 may be not less than 90 degrees and not more than 95 degrees (e.g. not less than 91 degrees and not more than 93 degrees). Each source trench 145 may be formed in a tapered shape with a bottom area being less than an opening area.

The bottom wall of each source trench 145 is positioned at the drift region 127 (the SiC epitaxial layer 122). More specifically, the bottom wall of each source trench 145 is positioned at the high concentration region 123 of the SiC epitaxial layer 122. The bottom wall of each source trench 145 is positioned at the second main surface 104 side with respect to the bottom wall of each gate trench 132. The bottom wall of each source trench 145 is positioned at a region between the bottom wall of each gate trench 132 and the low concentration region 124.

The bottom wall of each source trench 145 faces the c-plane of the SiC monocrystal. The bottom wall of each source trench 145 has the off angle θ inclined in the [11-20] direction with respect to the (0001) plane of the SiC monocrystal. The bottom wall of each source trench 145 may be formed in parallel to the first main surface 103. The bottom wall of each source trench 145 may be formed in a convex curved shape toward the second main surface 104.

In this embodiment, the depth of each source trench 145 is not less than the depth of each gate trench 132. More specifically, the depth of each source trench 145 is more than the depth of each gate trench 132. Each source trench 145 may have a depth of not less than 0.5 μm and not more than 10 μm (e.g. about 2 μm) in the normal direction Z.

The ratio of the depth of each source trench 145 to the depth of each gate trench 132 may be not less than 1.5. The ratio of the depth of each source trench 145 to the depth of each gate trench 132 is preferably not less than 2. Each source trench 145 may be formed to have a depth equal to the depth of each gate trench 132.

The width of each source trench 145 in the first direction may be not less than the width of each gate trench 132 in the first direction. The width of each source trench 145 in the first direction may be approximately equal to the width of each gate trench 132 in the first direction. The first direction width of each source trench 145 may be not less than 0.1 μm and not more than 2 μm (f e.g. about 0.5 μm).

The SiC semiconductor device 101 includes a source insulating layer 146 formed on an inner wall of each source trench 145. The SiC semiconductor device 101 also includes a source electrode layer 147 embedded in each source trench 145 with the source insulating layer 146 therebetween. In FIG. 24, the source insulating layer 146 and the source electrode layer 147 are indicated by hatching.

The source insulating layer 146 is formed in a film along the inner wall surface of each source trench 145 and demarcates a recessed space inside each source trench 145. The source insulating layer 146 includes a first region 146a and a second region 146b. The first region 146a is formed along the side walls of each source trench 145. The second region 146b is formed along the bottom wall of each source trench 145. The thickness Tsa of the first region 146a is less than the thickness Tsb of the second region 146b.

The ratio of the thickness Tsb of the second region 146b to the thickness Tsa of the first region 146a (Tsb/Tsa) may be not less than 2 and not more than 5. The thickness Tsa of the first region 146a may be not less than 0.01 μm and not more than 0.2 μm. The thickness Tsb of the second region 146b may be not less than 0.05 μm and not more than 0.5 μm.

The thickness Tsa of the first region 146a may be approximately equal to the thickness Ta of the first region 146a of the gate insulating layer 138. The thickness Tsb of the second region 146b may be approximately equal to the thickness Tb of the second region 146b of the gate insulating layer 138. The source insulating layer 146 may be formed to have a uniform thickness.

The source insulating layer 146 includes at least one of a silicon oxide ($SiO_2$) layer, a silicon nitride (SiN) layer, an aluminum oxide ($Al_2O_3$) layer, a zirconium oxide ($ZrO_2$) layer, and a tantalum oxide ($Ta_2O_3$) layer. The source insulating layer 146 may have a layered structure including an SiN layer and an $SiO_2$ layer laminated in this order from the first main surface 103 side.

The source insulating layer 146 may have a layered structure including an $SiO_2$ layer and an SiN layer laminated in this order from the first main surface 103 side. The source insulating layer 146 may have a single layer structure consisting of an $SiO_2$ layer or an SiN layer. The source insulating layer 146 may include the same insulating material as the gate insulating layer 138. In this embodiment, the source insulating layer 146 has a single layer structure consisting of an $SiO_2$ layer.

The source electrode layer 147 is embedded in a recessed space demarcated by the source insulating layer 146 inside each source trench 145. The source electrode layer 147 is arranged to be controlled under a source voltage.

The source electrode layer 147 has an upper end portion positioned at the opening side of each source trench 145. The upper end portion of the source electrode layer 147 is formed in a concave curved shape recessed toward the bottom wall of each source trench 145. The upper end portion of the source electrode layer 147 may be formed in parallel to the first main surface 103. The source electrode layer 147 may have a thickness of not less than 0.5 μm and not more than 10 μm (e.g. about 1 μm).

The upper end portion of the source electrode layer 147 is formed in the bottom wall of each source trench 145 side with respect to the first main surface 103. The upper end portion of the source electrode layer 147 may be at a position higher than that of the first main surface 103. The upper end portion of the source electrode layer 147 may protrude upward of the upper end portion of the source insulating layer 146. The upper end portion of the source electrode layer 147 may be at a position lower than that of the upper end portion of the source insulating layer 146.

The source electrode layer 147 may include at least one of conductive polysilicon, tungsten, aluminum, copper, aluminum alloy, and copper alloy. The source electrode layer 147 preferably includes conductive polysilicon having properties close to SiC in terms of material properties. This allows stress generated inside the SiC semiconductor layer 102 to be reduced. In this embodiment, the source electrode layer 147 includes p type polysilicon doped with p type impurities. In this case, the source electrode layer 147 can be formed simultaneously with the gate electrode layer 139.

The source electrode layer 147 has ap type impurity concentration of not less than the p type impurity concentration of the body region 131. More specifically, the source electrode layer 147 has the p type impurity concentration exceeding the p type impurity concentration of the body region 131. The source electrode layer 147 may have the p type impurity concentration of not less than $1.0 \times 10^{18}$ $cm^{-3}$ and not more than $1.0 \times 10^{22}$ $cm^{-3}$. The source electrode layer 147 may have the p type impurity concentration approximately equal to the p type impurity concentration of the gate electrode layer 139. The p type impurities of the source electrode layer 147 may include at least one of boron (B), aluminum (Al), indium (In), and Gallium (Ga).

The source electrode layer 147 may have a sheet resistance of not less than 10Ω/☐ and not more than 500Ω/☐ (about 200Ω/☐ in this embodiment). The source electrode layer 147 may have the sheet resistance approximately equal to the sheet resistance of the gate electrode layer 139. The source electrode layer 147 may include an n type polysilicon, alternatively or additionally to the p type polysilicon.

The SiC semiconductor device 101 thus has the plurality of trench gate structures 151 and the plurality of trench source structures 152. Each trench gate structure 151 includes the gate trench 132, the gate insulating layer 138, and the gate electrode layer 139. Each trench source structure 152 includes the source trench 145, the source insulating layer 146, and the source electrode layer 147.

The SiC semiconductor device 101 includes an n$^+$ type source region 153 formed in a region along the side walls of each gate trench 132 in a surface layer portion of the body region 131. The source region 153 may have a peak value of an n type impurity concentration of not less than $1.0\times10^{18}$ cm$^{-3}$ and not more than $1.0\times10^{21}$ cm$^{-3}$. A lower limit of the peak value of the n type impurity concentration of the source region 153 is preferably not less than $1.0\times10^{20}$ cm$^{-3}$. The n type impurities of the source region 153 may be phosphorus (P).

In this embodiment, a plurality of source regions 153 are formed along the side walls at one side and at the other side of each gate trench 132. The plurality of source regions 153 are each formed in a band shape extending in the first direction X. The plurality of source regions 153 are formed in a striped manner extending in the first direction X in plan view. Each source region 153 is exposed from the side wall of each gate trench 132 and the side wall of each source trench 145.

The source region 153, the body region 131, and the drift region 127 are thus formed in this order from the first main surface 103 toward the second main surface 104 in a region along the side walls of the gate trenches 132 in the surface layer portion of the first main surface 103. Channels of the MISFET are formed in regions along the side walls of the gate trench 132 in the body region 131. The channels are formed along the side walls of the gate trenches 132 formed by the a-planes of the SiC monocrystal in the body region 131. The ON/OFF of the channels are controlled by the gate electrode layers 139.

The SiC semiconductor device 101 includes a plurality of p$^+$ type contact regions 154 formed in the surface layer portion of the first main surface 103 in the active region 106. Each contact region 154 may have the peak value P of the p type impurity concentration exceeding the peak value of the p type impurity concentration of the body region 131. The p type impurities of each contact region 154 may be aluminum (Al).

The contact region 42 shown in FIG. 9A or the cancellation/compensation type contact region 42 shown in FIG. 11 may be formed as the contact region 154. That is, each contact region 154 may have the p type impurity concentration shown in FIG. 9A or may have the p type impurity concentration shown in FIG. 11.

Each contact region 154 is formed in a region between two adjacent ones of the gate trenches 132 in plan view. Each contact region 154 is formed in a region at an opposite side of the gate trench 132 with respect to each source region 153. Each contact region 154 is formed along the inner wall of each source trench 145. In this embodiment, the plurality of contact regions 154 are formed at intervals along the inner wall of each source trench 145. Each contact region 154 is formed at an interval from each gate trench 132.

Each contact region 154 covers the side wall and the bottom wall of each source trench 145. The bottom portion of each contact region 154 may be formed in parallel to the bottom wall of each source trench 145. Each contact region 154, more specifically, includes a first surface layer region 154a, a second surface layer region 154b, and an inner wall region 154c (bottom portion region) integrally.

The first surface layer region 154a covers the side wall at one side of the source trench 145 in the surface layer portion of the body region 131. The first surface layer region 154a is electrically connected to the body region 131 and the source region 153. The first surface layer region 154a is positioned at a region at the first main surface 103 side with respect to the bottom portion of the source region 153. In this embodiment, the first surface layer region 154a has a bottom portion extending in parallel to the first main surface 103.

In this embodiment, the bottom portion of the first surface layer region 154a is positioned at a region between the bottom portion of the body region 131 and the bottom portion of the source region 153. The bottom portion of the first surface layer region 154a may be positioned at a region between the first main surface 103 and the bottom portion of the body region 131.

In this embodiment, the first surface layer region 154a is led out from the source trench 145 toward the gate trench 132 adjacent thereto. The first surface layer region 154a may extend to an intermediate region between the gate trench 132 and the source trench 145. An end portion of the first surface layer region 154a is positioned at a region between the gate trench 132 and the source trench 145.

The second surface layer region 154b covers the side wall at the other side of the source trench 145 in the surface layer portion of the body region 131. The second surface layer region 154b is electrically connected to the body region 131 and the source region 153. The second surface layer region 154b is positioned at a region at the first main surface 103 side with respect to the bottom portion of the source region 153. The second surface layer region 154b has a depth approximately equal to the depth of the first surface layer region 154a. In this embodiment, the second surface layer region 154b has a bottom portion extending in parallel to the first main surface 103.

In this embodiment, the bottom portion of the second surface layer region 154b is positioned at a region between the bottom portion of the body region 131 and the bottom portion of the source region 153. The bottom portion of the second surface layer region 154b may be positioned at a region between the first main surface 103 and the bottom portion of the body region 131.

In this embodiment, the second surface layer region 154b is led out from the side wall at the other side of the source trench 145 toward the gate trench 132 adjacent thereto. The second surface layer region 154b may extend to an intermediate region between the source trench 145 and the gate trench 132. The end portion of the second surface layer region 154b is positioned at a region between the gate trench 132 and the source trench 145.

The inner wall region 154c is positioned at a region at the second main surface 104 side with respect to the first surface layer region 154a and the second surface layer region 154b (the bottom portion of the source region 153). The inner wall region 154c is formed in a region along the inner wall of the source trench 145 in the SiC semiconductor layer 102. The inner wall region 154c covers the side wall of the source trench 145.

The inner wall region 154c covers a corner portion connecting the side wall and the bottom wall of the source trench 145. The inner wall region 154c covers the side wall of the source trench 145 from the corner portion to the bottom wall of the source trench 145. The bottom portion of the contact region 154 is formed by the inner wall region 154c.

When a cancellation/compensation type contact region 154 (see also FIG. 11) is employed, portions of the p type impurities (acceptors) of the first surface layer region 154a are cancelled/compensated for by the n type impurities (donors) of the source region 153. Also, portions of the p type impurities (acceptors) of the second surface layer region 154b are cancelled/compensated for by the n type impurities (donors) of the source region 153.

This causes the first surface layer region 154a and the second surface layer region 154b of each contact region 154 to be cancellation/compensation type. Since the inner wall region 154c of each contact region 154 is not in contact with the source region 153, the p type impurities (acceptors) of the inner wall region 154c are not cancelled/compensated for by the n type impurities (donors) of the source region 153.

This causes each contact region 154 to have a cancelled/compensated region (the first surface layer region 154a and the second surface layer region 154b) in a region at the surface layer portion side and a non-cancelled/compensated region (the inner wall region 154c) in a region at the bottom portion side.

The SiC semiconductor device 101 includes a plurality of deep well regions 155 formed in the surface layer portion of the first main surface 103. Each deep well region 155 is also referred to as a withstand voltage adjusting region (withstand voltage maintaining region) arranged to adjust the withstand voltage of the SiC semiconductor layer 102 in the active region 106. Each deep well region 155 is formed in the drift region 127 (the SiC epitaxial layer 122). More specifically, each deep well region 155 is formed in the high concentration region 123 of the SiC epitaxial layer 122.

Each deep well region 155 is formed in a band shape extending along each source trench 145 in plan view. Each deep well region 155 covers the side walls of each source trench 145. Each deep well region 155 covers the corner portion connecting the side walls and the bottom wall of each source trench 145.

Each deep well region 155 covers the side walls of each source trench 145 from the corner portion to the bottom wall of each source trench 145. The bottom portion of each deep well region 155 may be formed in parallel to the bottom wall of each source trench 145. Each deep well region 155 has a bottom portion positioned at the second main surface 104 side with respect to the bottom wall of each gate trench 132.

Each deep well region 155 is formed along the inner wall of each source trench 145 and covers each contact region 154. Each deep well region 155 is electrically connected to each contact region 154. Each deep well region 155 continues to the body region 131 at the side walls of each source trench 145.

Each deep well region 155 may have a peak value of a p type impurity concentration approximately equal to the peak value of the p type impurity concentration of the body region 131. Each deep well region 155 may have the peak value of the p type impurity concentration exceeding the peak value of the p type impurity concentration of the body region 131. Each deep well region 155 may have the peak value of the p type impurity concentration less than the peak value of the p type impurity concentration of the body region 131.

Each deep well region 155 may have the peak value of the p type impurity concentration not more than the peak value P of the p type impurity concentration of the contact region 154. Each deep well region 155 may have the peak value of the p type impurity concentration less than the peak value P of the p type impurity concentration of the contact region 154. Each deep well region 155 may have the peak value of the p type impurity concentration of not less than $1.0 \times 10^{17}$ cm$^{-3}$ and not more than $1.0 \times 10^{19}$ cm$^{-3}$. A lower limit of the peak value of the p type impurity concentration of each deep well region 155 is preferably not less than $1.0 \times 10^{18}$ cm$^{-3}$.

Each deep well region 155 forms a pn junction with the SiC semiconductor layer 102 (the high concentration region 123 of the SiC epitaxial layer 122). A depletion layer spreads from the pn junction toward a region between the plurality of gate trenches 132 that are mutually adjacent. The depletion layer spreads toward a region at the second main surface 104 side with respect to the bottom wall of each gate trench 132. The depletion layer spreading from each deep well region 155 may overlap the bottom wall of each gate trench 132. The depletion layer spreading from the bottom portion of each deep well region 155 may overlap the bottom wall of each gate trench 132.

With an SiC semiconductor device that includes just a pn junction diode, due to the structure being free from trenches, a problem of concentration of electric field inside the SiC semiconductor layer 102 rarely occurs. Each deep well region 155 makes the trench gate type MISFET approach the structure of a pn junction diode. This allows the trench gate type MISFET to relax the electric field inside the SiC semiconductor layer 102.

Narrowing a pitch between the plurality of mutually adjacent deep well regions 155 is thus effective in terms of relaxing the concentration of electric field. Also, with each deep well regions 155 having the bottom portions at the second main surface 104 side with respect to the bottom wall of each gate trenches 132, concentration of electric field with respect to each gate trenches 132 can be relaxed appropriately by the depletion layer.

Preferably, distances between the bottom portions of the plurality of deep well regions 155 and the second main surface 104 are substantially equal. Occurrence of variation in the distances between the bottom portions of the plurality of deep well regions 155 and the second main surface 104 can thereby be suppressed. The withstand voltage (for example, an electrostatic breakdown strength) of the SiC semiconductor layer 102 can thus be suppressed from being restricted by a configuration of the respective deep well regions 155 and therefore improvement of the withstand voltage can be achieved appropriately.

In this embodiment, the high concentration region 123 of the SiC epitaxial layer 122 is interposed in regions between the plurality of mutually adjacent deep well regions 155. JFET (junction field effect transistor) resistance can thereby be reduced in the regions between the plurality of mutually adjacent deep well regions 155.

Further, in this embodiment, the bottom portions of the respective deep well regions 155 are positioned inside the high concentration region 123 of the SiC epitaxial layer 122. Current paths can thereby be expanded in lateral direction parallel to the first main surface 103 from the bottom portions of the respective deep well regions 155. Current spread resistance can thereby be reduced. The low concentration region 124 of the SiC epitaxial layer 122 increases the withstand voltage of the SiC semiconductor layer 102 in such a structure.

By forming the source trenches 145, the p type impurities can be introduced into the inner walls of the source trenches 145. The respective deep well regions 155 can thereby be formed conformally to the source trenches 145 and occurrence of variation in the depths of the respective deep well regions 155 can thus be suppressed appropriately. Also, by using the respective source trenches 145, each deep well region 155 can be formed appropriately in comparatively deep regions of the SiC semiconductor layer 102.

With reference to FIG. 24 and FIG. 26, the SiC semiconductor device 101 includes a p type peripheral edge deep well region 156 formed in a peripheral edge portion of the active region 106. The peripheral edge deep well region 156 is formed in the drift region 127 (the SiC epitaxial layer 122). More specifically, the peripheral edge deep well region 156 is formed in the high concentration region 123 of the SiC epitaxial layer 122.

The peripheral edge deep well region 156 is electrically connected to each deep well region 155. The peripheral edge deep well region 156 has the same potential as each deep well region 155. In this embodiment, the peripheral edge deep well region 156 is formed integrally with each deep well region 155.

The peripheral edge deep well region 156 is formed in a region along the inner wall of the contact trench portion 134 of each gate trench 132 in a peripheral edge portion of the active region 106. The peripheral edge deep well region 156 covers the side walls of each contact trench portion 134. The peripheral edge deep well region 156 covers a corner portion connecting the side walls and the bottom wall of each contact trench portion 134.

The peripheral edge deep well region 156 covers the side walls of each contact trench portion 134 from the corner portion to the bottom wall of each contact trench portion 134. Each deep well region 155 continues to the body region 131 at the side walls of each contact trench portion 134. The bottom portion of the peripheral edge source trench 156 is positioned at the second main surface 104 side with respect to the bottom wall of each contact trench portion 134.

The peripheral edge deep well region 156 overlaps the gate wiring layer 140 in plan view. The peripheral edge deep well region 156 is opposed to the gate wiring layer 140 with the gate insulating layer 138 (the third region 138c) therebetween.

The peripheral edge deep well region 156 includes a lead-out portion 156a led out from each contact trench portion 134 into each active trench portion 133. The lead-out portion 156a is formed in the high concentration region 123 of the SiC epitaxial layer 122. The lead-out portion 156a extends along the side walls of each active trench portion 133 from the corner portion to cover the bottom wall of the active trench portion 133. The lead-out portion 156a continues to the body region 131 at the side wall of each active trench portion 133. The bottom portion of the lead-out portion 156a is positioned at the second main surface 104 side with respect to the bottom wall of each active trench portion 133.

The peripheral edge deep well region 156 may have a peak value of a p type impurity concentration approximately equal to the p type impurity concentration of the body region 131. The peripheral edge deep well region 156 may have the peak value of the p type impurity concentration exceeding the peak value of the p type impurity concentration of the body region 131. The peripheral edge deep well region 156 may have the peak value of the p type impurity concentration less than the peak value of the p type impurity concentration of the body region 131.

The peripheral edge deep well region 156 may have the peak value of the p type impurity concentration approximately equal to the p type impurity concentration of each deep well region 155. The peripheral edge deep well region 156 may have the peak value of the p type impurity concentration exceeding the peak value of the p type impurity concentration of the each deep well region 155. The peripheral edge deep well region 156 may have the peak value of the p type impurity concentration less than the peak value of the p type impurity concentration of the each deep well region 155.

The peripheral edge deep well region 156 may have the peak value of the p type impurity concentration not more than the peak value P of the p type impurity concentration of the contact region 154. The peripheral edge deep well region 156 may have the peak value of the p type impurity concentration less than the peak value P of the p type impurity concentration of the contact region 154. The peripheral edge deep well region 156 may have the peak value of the p type impurity concentration of not less than $1.0 \times 10^{17}$ cm$^{-3}$ and not more than $1.0 \times 10^{19}$ cm$^{-3}$. A lower limit of the peak value of the p type impurity concentration of the peripheral edge deep well region 156 is preferably not less than $1.0 \times 10^{18}$ cm$^{-3}$.

With reference to FIG. 27, the SiC semiconductor device 101 includes a low resistance electrode layer 157 formed on the gate electrode layer 139. The low resistance electrode layer 157 includes conductive material having a sheet resistance less than the sheet resistance of the gate electrode layer 139. The low resistance electrode layer 157 may have a sheet resistance of not less than 0.01Ω/☐ and not more than 10 Ω/☐.

The low resistance electrode layer 157 covers the upper end portion of the gate electrode layer 139 inside each gate trench 132. The low resistance electrode layer 157 is formed in a film. The low resistance electrode layer 157 has a connection portion 157a in contact with the upper end portion of the gate electrode layer 139 and a non-connection portion 157b opposite thereof. The connection portion 157a and the non-connection portion 157b may each be formed in a concave curved shape along the upper end portion of the gate electrode layer 139. The connection portion 157a and the non-connection portion 157b each may have various forms.

The entire connection portion 157a may be at a position higher than that of the first main surface 103. The entire connection portion 157a may be at a position lower than that of the first main surface 103. The connection portion 157a may include a portion that is at a position higher than that of the first main surface 103. The connection portion 157a may include a portion that is at a position lower than that of the first main surface 103. For example, a central portion of the connection portion 157a may be at a position lower than that of the first main surface 103, while a peripheral edge portion of the connection portion 157a may be at a position higher than that of the first main surface 103.

The entire non-connection portion 157b may be at a position higher than that of the first main surface 103. The entire non-connection portion 157b may be at a position lower than that of the first main surface 103. The non-connection portion 157b may include a portion that is at a position higher than that of the first main surface 103. The non-connection portion 157b may include a portion that is at a position lower than that of the first main surface 103. For example, a central portion of the non-connection portion 157b may be at a position lower than that of the first main surface 103, while a peripheral edge portion of the non-connection portion 157b may be at a position higher than that of the first main surface 103.

The low resistance electrode layer 157 has an edge portion 157c in contact with the gate insulating layer 138. The edge portion 157c is in contact with the corner portion connecting the first region 138a and the second region 138b of the gate insulating layer 138. The edge portion 157c is in contact with the third region 138c of the gate insulating layer 138. More specifically, the edge portion 157c is in contact with the bulging portion 138d of the gate insulating layer 138.

The edge portion 157c is formed in a region at the first main surface 103 side with respect to the bottom portion of the source region 153. The edge portion 157c is formed in a region at the first main surface 103 side with respect to the boundary region between the body region 131 and the source region 153. The edge portion 157c is thereby opposed to the source region 153 with the gate insulating layer 138 therebetween. The edge portion 157c is not opposed to the body region 131 with the gate insulating layer 138 therebetween.

According to the structure above, forming of a current path in a region of the gate insulating layer 138 between the low resistance electrode layer 157 and the body region 131 can be suppressed. The current path may be formed by undesired diffusion of an electrode material of the low resistance electrode layer 157 into the gate insulating layer 138. In particular, a design where the edge portion 157c is connected to the comparatively thick third region 138c of the gate insulating layer 138 (the corner portion of the gate insulating layer 138) is effective for reducing the risk of forming the current path.

The thickness TR of the low resistance electrode layer 157 is not more than the thickness TG of the gate electrode layer 139 (TR≤TG) in the normal direction Z. The thickness TR of the low resistance electrode layer 157 is preferably less than the thickness TG of the gate electrode layer 139 (TR<TG). More specifically, the thickness TR of the low resistance electrode layer 157 is preferably not more than half the thickness TG of the gate electrode layer 139 (TR≤TG/2).

The ratio of the thickness TR of the low resistance electrode layer 157 to the thickness TG of the gate electrode layer 139 (TR/TG) is not less than 0.01 and not more than 1. The thickness TG of the gate electrode layer 139 may be not less than 0.5 μm and not more than 3 μm. The thickness TR of the low resistance electrode layer 157 may be not less than 0.01 μm and not more than 3 μm.

A current supplied into each gate trench 132 flows through the low resistance electrode layer 157 having a relatively low sheet resistance and is transmitted to the entire gate electrode layer 139. This allows the entire gate electrode layer 139 (the entire active region 106) to be transitioned immediately from an off state to the on state, and therefore delay of switching response can be suppressed.

In particular, although time is required for transmission of current in a case of the gate trenches 132 each having a length of the millimeter order (a length not less than 1 mm), the delay of the switching response can be suppressed appropriately by the low resistance electrode layer 157. That is, the low resistance electrode layer 157 is formed in a current diffusing electrode layer that diffuses the current into each gate trench 132.

Also, as refinement of cell structure progresses, the width, depth, cross-sectional area, etc., of the gate electrode layer 139 decreases and there is thus concern for the delay of the switching response due to increase of electrical resistance inside each gate trench 132. In this respect, according to the low resistance electrode layer 157, the entireties of the gate electrode layers 149 can be made to transition rapidly from the off state to the on state and therefore the delay of the switching response due to refinement can be suppressed appropriately.

With reference to FIG. 26, in this embodiment, the low resistance electrode layer 157 also covers the upper end portion of the gate wiring layer 140. The portion of the low resistance electrode layer 157 covering the upper end portion of the gate wiring layer 140 is formed integrally with the portion of the low resistance electrode layer 157 covering the upper end portion of the gate electrode layer 139. The low resistance electrode layer 157 thus covers the entire gate electrode layer 139 and the entire gate wiring layer 140.

Accordingly, the current supplied from the gate main surface electrode layer 108 to the gate wiring layer 140 is transmitted to the entire gate electrode layer 139 and the entire gate wiring layer 140 through the low resistance electrode layer 157 having the relatively low sheet resistance. This allows the entire gate electrode layer 139 (the entire active region 106) to be transitioned immediately from the off state to the on state via the gate wiring layer 140, and therefore delay of switching response can be suppressed. In particular, in a case where the gate trenches 132 each have a length on the order of millimeters, the low resistance electrode layer 157, which covers the upper end portion of the gate wiring layer 140, can appropriately suppress the delay of switching response.

The low resistance electrode layer 157 includes a polycide layer. The polycide layer is formed by portions forming surface layer portions of the gate electrode layers 149 being silicided by a metal material. More specifically, the polycide layer is constituted of a p type polycide layer including p type impurities doped in the gate electrode layer 139 (p type polysilicon). The polycide layer preferably has a specific resistance of not less than 10 μΩ·cm and not more than 110 μΩ·cm.

The sheet resistance inside the gate trench 132 embedded with the gate electrode layer 139 and the low resistance electrode layer 157 is not more than the sheet resistance of only the gate electrode layer 139. The sheet resistance inside the gate trench 132 is preferably not more than a sheet resistance of an n type polysilicon doped with n type impurities.

The sheet resistance inside the gate trench 132 approximates the sheet resistance of the low resistance electrode layer 157. That is, the sheet resistance inside the gate trench 132 may be not less than 0.01Ω/□ and not more than 10Ω/□. The sheet resistance inside the gate trench 132 is preferably lower than 10 Ω/□.

The low resistance electrode layer 157 may include at least one of TiSi, $TiSi_2$, NiSi, CoSi, $CoSi_2$, $MoSi_2$, and $WSi_2$. Among these types, NiSi, $CoSi_2$, and $TiSi_2$ each have a relatively low specific resistance and temperature dependency, being suitable as a polycide layer forming the low resistance electrode layer 157.

The SiC semiconductor device 101 includes a plurality of source sub-trenches 158 formed in a region of the first main surface 103 along the upper end portion of the source electrode layer 147 and in communication with the respective source trenches 145. Each source sub-trench 158 forms a portion of the side walls of each source trench 145. In this embodiment, each source sub-trench 158 is formed in an endless shape (a quadrilateral annular shape in this embodiment) that surrounds the upper end portion of the source electrode layer 147 in plan view. The source sub-trench 158 borders the upper end portion of the source electrode layer 147.

The source sub-trench 158 is formed by digging down into a portion of the source insulating layer 146. The source sub-trench 158 is formed in a tapered shape with a bottom area being less than an opening area. The bottom wall of the source sub-trench 158 may be formed in a convex curved shape toward the second main surface 104. More specifically, the source sub-trench 158 is formed by digging down into the upper end portion of the source insulating layer 146 and the upper end portion of the source electrode layer 147 from the first main surface 103.

The upper end portion of the source electrode layer 147 has a shape constricted inward of s lower end portion of the source electrode layer 147. The lower end portion of the source electrode layer 147 is a portion of the source electrode layer 147 that is positioned at the bottom wall side of the corresponding source trench 145. A first direction width of the upper end portion of the source electrode layer 147 may be less than a first direction width of the lower end portion of the source electrode layer 147.

An inner wall of the source sub-trench 158 exposes the source region 153, the contact region 154, the source insulating layer 146, and the source electrode layer 147. The inner wall of the source sub-trench 158 exposes the first surface layer region 154a and the second surface layer region 154b of the contact region 154.

The bottom wall of the source sub-trench 158 exposes at least the first region 146a of the source insulating layer 146. Thus, the upper end portion of the first region 146a of the source insulating layer 146 is at a position lower than that of the first main surface 103.

An opening edge portion 159 of each source trench 145 includes an inclined portion 160 that is inclined downwardly from the first main surface 103 toward the inside of each source trench 145. The opening edge portion 159 of each source trench 145 is a corner portion connecting the first main surface 103 and the side walls of each source trench 145. The inclined portion 160 of each source trench 145 is formed by the source sub-trench 158.

In this embodiment, the inclined portion 160 is formed in a concave curved shape toward the inside of the SiC semiconductor layer 102. The inclined portion 160 may be formed in a convex curved shape toward the inside of the source sub-trench 158. The inclined portion 160 is arranged to relax the concentration of the electric field in the opening edge portion 159 of each source trench 145.

With reference to FIG. 28 and FIG. 29, the active region 106 has an active main surface 161 forming a portion of the first main surface 103. The outer region 107 has an outer main surface 162 forming a portion of the first main surface 103. In this embodiment, the outer main surface 162 is connected to the side surfaces 105A to 105D.

The active main surface 161 and the outer main surface 162 each face the c-plane of the SiC monocrystal. Also, the active main surface 161 and the outer main surface 162 each have the off angle θ inclined in the [11-20] direction with respect to the (0001) plane of the SiC monocrystal.

The outer main surface 162 is positioned at the second main surface 104 side with respect to the active main surface 161. In this embodiment, the outer region 107 is formed by digging down into the first main surface 103 toward the second main surface 104 side. The outer main surface 162 is therefore formed in a region recessed toward the second main surface 104 side with respect to the active main surface 161.

The outer main surface 162 may be positioned at the second main surface 104 side with respect to the bottom wall of each gate trench 132. In this embodiment, the outer main surface 162 is formed at a depth position approximately equal to that of the bottom wall of each source trench 145. That is, the outer main surface 162 may be positioned on substantially the same plane as the bottom walls of the respective source trenches 145. The distance between the outer main surface 162 and the second main surface 104 may also be approximately equal to the distance between the bottom wall of each source trench 145 and the second main surface 104.

The outer main surface 162 may be positioned at the second main surface 104 side with respect to the bottom wall of each source trench 145. The outer main surface 162 may be positioned at the second main surface 104 side within a range of not less than 0 μm and not more than 1 μm with respect to the bottom wall of each source trench 145.

The outer main surface 162 exposes the SiC epitaxial layer 122. More specifically, the outer main surface 162 exposes the high concentration region 123 of the SiC epitaxial layer 122. The outer main surface 162 is opposed to the low concentration region 124 with the high concentration region 123 therebetween.

In this embodiment, the active region 106 is demarcated in a mesa shape by the outer region 107. The active region 106 is thus formed as an active mesa 163 in a mesa shape protruding upward than the outer region 107. The active mesa 163 includes active side walls 164 connecting the active main surface 161 and the outer main surface 162. The active side walls 164 demarcate the boundary region between the active region 106 and the outer region 107. The first main surface 103 is formed by the active main surface 161, the outer main surface 162, and the active side walls 164.

In this embodiment, the active side walls 164 extend in the normal direction Z of the active main surface 161 (the outer main surface 162). The active side walls 164 are formed by the m-planes and the a-planes of the SiC monocrystal. The active side walls 164 may have inclined surfaces inclined downwardly from the active main surface 161 toward the outer main surface 162. An inclination angle of the active side wall 164 is the angle between the active side wall 164 and the active main surface 161 inside the SiC semiconductor layer 102.

In this case, the inclination angle of the active side wall 164 may be more than 90 degrees and not more than 135 degrees. The inclination angle of the active side wall 164 may be more than 90 degrees and not more than 95 degrees, not less than 95 degrees and not more than 100 degrees, not less than 100 degrees and not more than 110 degrees, not less than 110 degrees and not more than 120 degrees, or not less than 120 degrees and not more than 135 degrees. The inclination angle of the active side wall 164 is preferably more than 90 degrees and not more than 95 degrees.

The active side walls 164 expose the SiC epitaxial layer 122. More specifically, the active side walls 164 expose the high concentration region 123 of the SiC epitaxial layer 122. The active side walls 164 expose at least the body region 131 in a region at the active main surface 161 side. FIG. 28 and FIG. 29 show an exemplary mode in which the active side walls 164 expose the body region 131 and the source region 153.

The SiC semiconductor device 101 includes a $p^+$ type diode region 171 (impurity region) formed in a surface layer portion of the outer main surface 162. The SiC semiconductor device 101 also includes a p type outer deep well region 172 formed in the surface layer portion of the outer main surface 162. The SiC semiconductor device 101 also includes a p type field limiting structure 173 formed in the surface layer portion of the outer main surface 162.

The diode region 171 is formed in a region between the active side walls 164 and the side surfaces 105A to 105D in the outer region 107. The diode region 171 is formed at intervals from the active side walls 164 and the side surfaces 105A to 105D. The diode region 171 extends in a band shape along the active region 106 in plan view. In this embodiment, the diode region 171 is formed in an endless shape (a quadrilateral annular shape in this embodiment) that surrounds the active region 106 in plan view. The diode region 171 overlaps the source routing wiring 116 in plan view.

The diode region 171 forms a pn junction with the SiC semiconductor layer 102. More specifically, the diode region 171 is positioned inside the SiC epitaxial layer 122. The diode region 171 therefore forms the pn junction with the SiC epitaxial layer 122. More specifically, the diode region 171 is positioned inside the high concentration region 123 of the SiC epitaxial layer 122. The diode region 171 therefore forms the pn junction with the high concentration region 123.

A pn junction diode D, having the diode region 171 as an anode and the SiC semiconductor layer 102 as a cathode, is thereby formed. The diode region 171 is electrically connected to the source routing wiring 116. The diode region 171 forms a part of the avalanche current absorbing structure.

The entire diode region 171 is positioned at the second main surface 104 side with respect to the bottom wall of each gate trench 132. A bottom portion of the diode region 171 is positioned at the second main surface 104 side with respect to the bottom wall of each source trench 145. The bottom portion of the diode region 171 may be formed at a depth position approximately equal to that of the bottom portion of the contact region 154. The bottom portion of the diode region 171 may be positioned on substantially the same plane as the bottom portions of the contact regions 154.

The distance between the bottom portion of the diode region 171 and the second main surface 104 may be approximately equal to the distance between the bottom portion of the contact region 154 and the second main surface 104. The bottom portion of the diode region 171 may be positioned at the second main surface 104 side with respect to the bottom portion of the contact region 154. The bottom portion of the diode region 171 may be positioned at the second main surface 104 side within a range of not less than 0 μm and not more than 1 μm with respect to the bottom portion of the contact region 154.

When the contact region 42 shown in FIG. 9A is employed as the contact region 154, the diode region 171 may have a peak value of a p type impurity concentration approximately equal to the peak value P of the p type impurity concentration of the contact region 154. The diode region 171 has the peak value of the p type impurity concentration of not more than $1.0 \times 10^{20}$ $cm^{-3}$. The peak value of the p type impurity concentration of the diode region 171 is preferably within a range of not less than $1.0 \times 10^{17}$ $cm^{-3}$ and not more than $1.0 \times 10^{20}$ $cm^{-3}$.

The thickness (depth) of the diode region 171 is preferably approximately equal to the thickness (depth) of the contact region 154. Also, the diode region 171 preferably has a p type impurity concentration equal to the p type impurity concentration of the contact region 154. This structure allows the contact region 154 and the diode region 171 to be formed using the same mask.

The contact region 154 and the diode region 171 may be formed using different masks. In this case, the diode region 171 may have the p type impurity concentration exceeding the p type impurity concentration of the contact region 154. The diode region 171 may have the p type impurity concentration of not more than $1.0 \times 10^{20}$ $cm^{-3}$ and exceeding the p type impurity concentration of the contact region 154.

The diode region 171 may have the p type impurity concentration having the peak value exceeding $1.0 \times 10^{20}$ $cm^{-3}$. The peak value of the p type impurity concentration of the diode region 171 may be within a range of more than $1.0 \times 10^{20}$ $cm^{-3}$ and not more than $1.0 \times 10^{21}$ $cm^{-3}$. In this case, while the contact region 154 and the diode region 171 cannot be formed simultaneously, design focusing on the characteristics of the pn junction diode D can be made.

In this case, the diode region 171 may have a thickness (depth) different from that of the contact region 154. The thickness (depth) of the diode region 171 may be not less than the thickness (depth) of the contact region 154. The thickness (depth) of the diode region 171 may be less than the thickness (depth) of the contact region 154.

On the other hand, when the cancellation/compensation type contact region 42 shown in FIG. 11 is employed as the contact region 154, the diode region 171 may have the peak value of the p type impurity concentration exceeding the peak value P of the p type impurity concentration of the contact region 154. In this case, the peak value of the p type impurity concentration of the diode region 171 may be within a range of more than $1.0 \times 10^{20}$ $cm^{-3}$ and not more than $1.0 \times 10^{21}$ $cm^{-3}$, under a condition that it is more than the peak value of the n type impurity concentration of the source region 153.

In this case, the diode region 171 may have a thickness (depth) equal to the thickness (depth) of the contact region 154. The thus arranged diode region 171 allows the contact region 154 and the diode region 171 to be formed using the same mask. Also, when the cancellation/compensation type contact region 154 is employed, design focusing on the characteristics of the pn junction diode D can be made while forming the contact region 154 and the diode region 171 at the same time.

The outer deep well region 172 is formed in a region between the active side walls 164 and the diode region 171 in plan view. In this embodiment, the outer deep well region 172 is formed at intervals from the active side walls 164 toward the diode region 171 side. The outer deep well region 172 is also referred to as a withstand voltage adjusting region (withstand voltage maintaining region) arranged to adjust the withstand voltage of the SiC semiconductor layer 102 in the outer region 107.

The outer deep well region 172 extends in a band shape along the active region 106 in plan view. In this embodiment, the outer deep well region 172 is formed in an endless shape (a quadrilateral annular shape in this embodiment) that surrounds the active region 106 in plan view. The outer deep well region 172 is electrically connected to the source routing wiring 116 via the diode region 171. The outer deep well region 172 may form a part of the pn junction diode D. The outer deep well region 172 may form a part of the avalanche current absorbing structure.

The entire outer deep well region 172 is positioned at the second main surface 104 side with respect to the bottom wall of each gate trench 132. The bottom portion of the outer deep well region 172 is positioned at the second main surface 104 side with respect to the bottom wall of each source trench 145.

An inner peripheral edge of the outer deep well region 172 extends to the vicinity of the boundary region between the active region 106 and the outer region 107. The outer deep well region 172 may cross the boundary region between the active region 106 and the outer region 107. The inner peripheral edge of the outer deep well region 172 may cover a corner portion connecting the active side walls 164 and the outer main surface 162. The inner peripheral edge of the outer deep well region 172 may further extend along the active side walls 164 and may be connected to the body region 131.

In this embodiment, an outer peripheral edge of the outer deep well region 172 covers the diode region 171 from the second main surface 104 side. The outer deep well region 172 may overlap the source routing wiring 116 in plan view. The outer peripheral edge of the outer deep well region 172 may be formed at an interval from the diode region 171 toward the active side walls 164 side.

The bottom portion of the outer deep well region 172 is positioned at the second main surface 104 side with respect to the bottom portion of the diode region 171. The bottom portion of the outer deep well region 172 may be formed at a depth position approximately equal to that of the bottom portion of each deep well region 155. The bottom portion of the outer deep well region 172 may be positioned on substantially the same plane as the bottom portion of each deep well region 155.

The distance between the bottom portion of the outer deep well region 172 and the outer main surface 162 may be approximately equal to the distance between the bottom portion of each deep well region 155 and the bottom wall of each source trench 145. The distance between the bottom portion of the outer deep well region 172 and the second main surface 104 may be approximately equal to the distance between the bottom portion of each deep well region 155 and the second main surface 104.

The bottom portion of the outer deep well region 172 may be positioned at the second main surface 104 side with respect to the bottom portion of each deep well region 155. The bottom portion of the outer deep well region 172 may be positioned at the second main surface 104 side within a range of not less than 0 μm and not more than 1 μm with respect to the bottom portion of each deep well region 155.

The occurrence of variation can thereby be suppressed between the distance between the bottom portion of the outer deep well region 172 and the second main surface 104 and the distance between the bottom portion of each deep well region 155 and the second main surface 104. The withstand voltage (for example, the breakdown strength) of the SiC semiconductor layer 102 can thus be suppressed from being restricted by a configuration of the outer deep well region 172 and the respective deep well regions 155 and therefore improvement of the withstand voltage can be appropriately achieved.

The outer deep well region 172 may have a peak value of a p type impurity concentration of not more than the peak value of the p type impurity concentration of the diode region 171. The outer deep well region 172 may have the peak value of the p type impurity concentration less than the peak value of the p type impurity concentration of the diode region 171. The outer deep well region 172 may have the peak value of the p type impurity concentration approximately equal to the peak value of the p type impurity concentration of each deep well region 155. The outer deep well region 172 may have the peak value of the p type impurity concentration approximately equal to the peak value of the p type impurity concentration of the body region 131.

The outer deep well region 172 may have the peak value of the p type impurity concentration exceeding the peak value of the p type impurity concentration of the body region 131. The outer deep well region 172 may have the peak value of the p type impurity concentration less than the peak value of the p type impurity concentration of the body region 131. The outer deep well region 172 may have the peak value of the p type impurity concentration not more than the peak value P of the p type impurity concentration of the contact region 154. The outer deep well region 172 may have the peak value of the p type impurity concentration less than the peak value P of the p type impurity concentration of the contact region 154.

The outer deep well region 172 may have the peak value of the p type impurity concentration of not less than $1.0 \times 10^{17}$ cm$^{-3}$ and not more than $1.0 \times 10^{19}$ cm$^{-3}$. A lower limit of the peak value of the p type impurity concentration of the outer deep well region 172 is preferably not less than $1.0 \times 10^{18}$ cm$^{-3}$.

The field limiting structure 173 is formed in a region between the diode region 171 and the side surfaces 105A to 105D in plan view. In this embodiment, the field limiting structure 173 is formed at intervals from the side surfaces 105A to 105D toward the diode region 171 side.

The field limiting structure 173 includes one or more (e.g. two or more but 20 or less) field limiting regions 174. In this embodiment, the field limiting structure 173 includes a field limiting region group having a plurality of (five) field limiting regions 174A, 174B, 174C, 174D, 174E.

The field limiting regions 174A to 174E are formed in this order at intervals in a direction away from the diode region 171. The field limiting regions 174A to 174E each extend in a band shape along the peripheral edge of the active region 106 in plan view. More specifically, the field limiting regions 174A to 174E are each formed in an endless shape (a quadrilateral annular shape in this embodiment) that surrounds the active region 106 in plan view. The field limiting regions 174A to 174E are also referred to as FLR (Field Limiting Ring) regions.

In this embodiment, the bottom portions of the field limiting regions 174A to 174E are positioned at the second main surface 104 side with respect to the bottom portion of the diode region 171. In this embodiment, the innermost field limiting region 174A among the field limiting regions 174A to 174E covers the diode region 171 from the second main surface 104 side. The field limiting region 174A may overlap the source routing wiring 116 aforementioned in plan view.

The field limiting region 174A is electrically connected to the source routing wiring 116 via the diode region 171. The field limiting region 174A may form a part of the pn junction diode D. The field limiting region 174A may form a part of the avalanche current absorbing structure.

The field limiting regions 174A to 174E are entirely positioned at the second main surface 104 side with respect to the bottom wall of each gate trench 132. The bottom portions of the field limiting regions 174A to 174E are positioned at the second main surface 104 side with respect to the bottom wall of each source trench 145.

The field limiting regions 174A to 174E may be formed at a depth position approximately equal to that of each deep well region 155 (the outer deep well region 172). The bottom portions of the field limiting regions 174A to 174E may be positioned on substantially the same plane as the bottom portion of each deep well region 155 (the outer deep well region 172).

The bottom portions of the field limiting regions 174A to 174E may be positioned at the outer main surface 162 side with respect to the bottom portion of each deep well region 155 (the outer deep well region 172). The bottom portions of the field limiting regions 174A to 174E may be positioned at the second main surface 104 side with respect to the bottom portion of each deep well region 155 (the outer deep well region 172).

The width between adjacent ones of the field limiting regions 174A to 174E may be different. The width between adjacent ones of the field limiting regions 174A to 174E may be increased in a direction away from the active region 106. The width between adjacent ones of the field limiting regions 174A to 174E may be decreased in a direction away from the active region 106.

The field limiting regions 174A to 174E may have different thicknesses (depths), respectively. The thickness (depth) of the field limiting regions 174A to 174E may be decreased in a direction away from the active region 106. The thickness (depth) of the field limiting regions 174A to 174E may be increased in a direction away from the active region 106.

The field limiting regions 174A to 174E may have a peak value of a p type impurity concentration of not more than the peak value of the p type impurity concentration of the diode region 171. The field limiting regions 174A to 174E may have the peak value of the p type impurity concentration less than the peak value of the p type impurity concentration of the diode region 171.

The field limiting regions 174A to 174E may have the peak value of the p type impurity concentration of not more than the peak value of the p type impurity concentration of the outer deep well region 172. The field limiting regions 174A to 174E may have the peak value of the p type impurity concentration less than the peak value of the p type impurity concentration of the outer deep well region 172.

The field limiting regions 174A to 174E may have the peak value of the p type impurity concentration of not less than the peak value of the p type impurity concentration of the outer deep well region 172. The field limiting regions 174A to 174E may have the peak value of the p type impurity concentration exceeding the peak value of the p type impurity concentration of the outer deep well region 172.

The field limiting regions 174A to 174E may have the peak value of the p type impurity concentration of not less than $1.0 \times 10^{15}$ cm$^{-3}$ and not more than $1.0 \times 10^{18}$ cm$^{-3}$. The following relationship is preferred that the peak value of the p type impurity concentration of the diode region 171 >the peak value of the p type impurity concentration of the outer deep well region 172 >the peak value of the p type impurity concentration of the field limiting regions 174A to 174E.

The field limiting structure 173 is arranged to relax the concentration of the electric field in the outer region 107. The number, width, depth, p type impurity concentration, etc., of field limiting regions 174 may have one of various values in accordance with the electric field to be relaxed.

In this embodiment, the field limiting structure 173 is explained as an example of including one or more field limiting regions 174 formed in a region between the diode region 171 and the side surfaces 105A to 105D in plan view. However, the field limiting structure 173 may include one or more field limiting regions 174 formed in a region between the active side walls 164 and the diode region 171 in plan view, instead of the region between the diode region 171 and the side surfaces 105A to 105D.

The field limiting structure 173 may also include one or more field limiting regions 174 formed in a region between the diode region 171 and the side surfaces 105A to 105D in plan view and one or more field limiting regions 174 formed in a region between the active side walls 164 and the diode region 171 in plan view.

The SiC semiconductor device 101 includes an outer insulating layer 181 formed on the first main surface 103 in the outer region 107. The outer insulating layer 181 may include silicon oxide. The outer insulating layer 181 may include another insulating film such as silicon nitride. In this embodiment, the outer insulating layer 181 is formed of the same insulating material type as the gate insulating layer 138.

The outer insulating layer 181 selectively covers the diode region 171, the outer deep well region 172, and the field limiting structure 173 in the outer region 107. The outer insulating layer 181 is formed in a film along the active side walls 164 and the outer main surface 162. The outer insulating layer 181 continues to the gate insulating layer 138 (more specifically, the third region 138c) on the active main surface 161.

The outer insulating layer 181 includes a first region 181a and a second region 181b. The first region 181a covers the active side walls 164. The second region 181b covers the outer main surface 162. The thickness of the second region 181b may be not more than the thickness of the first region 181a. The thickness of the second region 181b may be less than the thickness of the first region 181a.

The thickness of the first region 181a may be approximately equal to the thickness of the first region 181a of the gate insulating layer 138. The thickness of the second region 181b may be approximately equal to the thickness of the third region 138c of the gate insulating layer 138. The outer insulating layer 181 may be formed to have a uniform thickness.

With reference to FIG. 28 and FIG. 29, the SiC semiconductor device 101 further includes a side wall structure 182 that covers the active side walls 164. The side wall structure 182 protects and reinforces the active mesa 163 from the outer region 107 side.

The side wall structure 182 forms a level difference moderating structure arranged to moderate the level difference formed between the active main surface 161 and the outer main surface 162. If an upper layer structure (covering layer) is formed to cover the boundary region between the active region 106 and the outer region 107, the side wall structure 182 increases the flatness of the upper layer structure.

The side wall structure 182 may have an inclined portion 183 that is inclined downwardly from the active main surface 161 toward the outer main surface 162. The inclined portion 183 can appropriately moderate the level difference. The inclined portion 183 may be formed in a concave curved shape toward the SiC semiconductor layer 102 side. The inclined portion 183 may be formed in a convex curved shape toward the opposite side of the SiC semiconductor layer 102.

The inclined portion 183 may extend in a planar manner from the active main surface 161 side toward the outer main surface 162 side. The inclined portion 183 may extend in a straight manner from the active main surface 161 side toward the outer main surface 162 side. The inclined portion 183 may be formed in a downward stepwise manner from the active main surface 161 toward the outer main surface

162. That is, the inclined portion 183 may have one or more stepped portions recessed toward the outer main surface 162 side. The plurality of stepped portions increase the surface area of the inclined portion 183 and therefore the sticking force to the upper layer structure.

The inclined portion 183 may include a plurality of raised portions raised outward of the side wall structure 182. The plurality of raised portions increase the surface area of the inclined portion 183 and therefore the sticking force to the upper layer structure. The inclined portion 183 may include a plurality of recessions recessed inward of the side wall structure 182. The plurality of recessions increase the surface area of the inclined portion 183 and therefore the sticking force to the upper layer structure.

The side wall structure 182 is formed in a self-aligned manner with respect to the active main surface 161. More specifically, the side wall structure 182 is formed along the active side walls 164. In this embodiment, the side wall structure 182 is formed in an endless shape (a quadrilateral annular shape in this embodiment) that surrounds the active region 106 in plan view.

The side wall structure 182 may include at least one of conductive polysilicon, tungsten, aluminum, copper, aluminum alloy, and copper alloy. The side wall structure 182 preferably includes p type polysilicon doped with p type impurities. In this case, the side wall structure 182 can be formed simultaneously with the gate electrode layer 139 and/or the source electrode layer 147.

In this case, the side wall structure 182 has a p type impurity concentration of not less than the p type impurity concentration of the body region 131. More specifically, the side wall structure 182 has the p type impurity concentration exceeding the p type impurity concentration of the body region 131. The side wall structure 182 may have the p type impurity concentration of not less than $1.0\times10^8$ cm$^{-3}$ and not more than $1.0\times1022$ cm$^{-3}$.

The p type impurities of the side wall structure 182 may include at least one of boron (B), aluminum (Al), indium (In), and Gallium (Ga). The side wall structure 182 may have the p type impurity concentration approximately equal to the p type impurity concentration of the gate electrode layer 139.

The side wall structure 182 may have a sheet resistance of not less than 10Ω/☐ and not more than 500Ω/☐ (about 200Ω/☐ in this embodiment). The side wall structure 182 may have the sheet resistance approximately equal to the sheet resistance of the gate electrode layer 139.

The side wall structure 182 may include an n type polysilicon, alternatively or additionally to the p type polysilicon. The side wall structure 182 may include insulating material. In this case, the side wall structure 182 can improve an insulation property of the active region 106 against the outer region 107.

With reference to FIG. 25 to FIG. 29, the SiC semiconductor device 101 includes an interlayer insulating layer 191 formed on the first main surface 103. The interlayer insulating layer 191 selectively covers the active region 106 and the outer region 107. The interlayer insulating layer 191 is formed in a film along the active main surface 161 and the outer main surface 162.

The interlayer insulating layer 191 selectively covers the trench gate structure 151, the gate wiring layer 140, and the trench source structure 152 in the active region 106. The interlayer insulating layer 191 selectively covers the diode region 171, the outer deep well region 172, and the field limiting structure 173 in the outer region 107.

The interlayer insulating layer 191 is formed along the outer surface (inclined portion 183) of the side wall structure 182 in the boundary region between the active region 106 and the outer region 107. The interlayer insulating layer 191 forms a part of the upper layer structure that covers the side wall structure 182. A peripheral edge portion of the interlayer insulating layer 191 may be formed in a manner flush with the side surfaces 105A to 105D.

The interlayer insulating layer 191 may include silicon oxide or silicon nitride. The interlayer insulating layer 191 may include PSG (Phosphor Silicate Glass) and/or BPSG (Boron Phosphor Silicate Glass) as an example of the silicon oxide. The interlayer insulating layer 191 may have a layered structure including a PSG layer and a BPSG layer laminated in this order from the first main surface 103 side. The interlayer insulating layer 191 may have a layered structure including a BPSG layer and a PSG layer laminated in this order from the first main surface 103 side.

The interlayer insulating layer 191 includes a gate contact hole 192, a source contact hole 193, and a diode contact hole 194. The interlayer insulating layer 191 also includes an anchor hole 195.

The gate contact hole 192 exposes the gate wiring layer 140 in the active region 106. The gate contact hole 192 may be formed in a band shape along the gate wiring layer 140. The opening edge portion of the gate contact hole 192 is formed in a convex curved shape toward the inside of the gate contact hole 192.

The source contact hole 193 exposes the source region 153, the contact region 154, and the trench source structure 152 in the active region 106. The source contact hole 193 may be formed in a band shape along, for example, the trench source structure 152. The opening edge portion of the source contact hole 193 is formed in a convex curved shape toward the inside of the source contact hole 193.

The diode contact hole 194 exposes the diode region 171 in the outer region 107. The diode contact hole 194 may be formed in a band shape (more specifically, an endless shape) extending along the diode region 171.

The diode contact hole 194 may expose the outer deep well region 172 and/or the field limiting structure 173. The opening edge portion of the diode contact hole 194 is formed in a convex curved shape toward the inside of the diode contact hole 194.

The anchor hole 195 is formed by digging down into the interlayer insulating layer 191 in the outer region 107. The anchor hole 195 is formed in a region between the diode region 171 and the side surfaces 105A to 105D in plan view. More specifically, the anchor hole 195 is formed in a region between the field limiting structure 173 and the side surfaces 105A to 105D in plan view. The anchor hole 195 exposes the first main surface 103 (the outer main surface 162). The opening edge portion of the anchor hole 195 is formed in a convex curved shape toward the inside of the anchor hole 195.

With reference to FIG. 23, the anchor hole 195 extends in a band shape along the active region 106 in plan view. In this embodiment, the anchor hole 195 is formed in an endless shape (a quadrilateral annular shape in this embodiment) that surrounds the active region 106 in plan view. In this embodiment, one anchor hole 195 is formed in a portion covering the outer region 107 in the interlayer insulating layer 191. However, a plurality of anchor holes 195 may be formed in a portion covering the outer region 107 in the interlayer insulating layer 191.

The gate main surface electrode layer 108 and the source main surface electrode layer 114 aforementioned are formed on the interlayer insulating layer 191. The gate main surface electrode layer 108 and the source main surface electrode layer 114 each have a layered structure including a barrier electrode layer 196 and a main electrode layer 197 laminated in this order from the first main surface 103 side.

The barrier electrode layer 196 may have a single layer structure including a titanium layer or a titanium nitride layer. The barrier electrode layer 196 may have a layered structure including a titanium layer and a titanium nitride layer laminated in this order from the first main surface 103 side.

The main electrode layer 197 has a thickness exceeding the thickness of the barrier electrode layer 196. The main electrode layer 197 includes conductive material having a resistance value less than the resistance value of the barrier electrode layer 196. The main electrode layer 197 may include at least one of aluminum, copper, aluminum alloy, and copper alloy. The main electrode layer 197 may include at least one of AlSi alloy, AlSiCu alloy, and AlCu alloy. In this embodiment, the main electrode layer 197 includes AlSiCu alloy.

The gatemainsurface electrode layer 108 (the outer gate finger 110) enters the gate contact hole 192 from on the interlayer insulating layer 191. The outer gate finger 110 is electrically connected to the gate wiring layer 140 inside the gate contact hole 192. This causes an electrical signal from the gate pad 109 to be delivered via the outer gate finger 110 to the gate electrode layer 139.

The source main surface electrode layer 114 (the source pad 115) enters the source contact hole 193 and the source sub-trench 158 from on the interlayer insulating layer 191. The source pad 115 is electrically connected to the source region 153, the contact region 154, and the source electrode layer 147 inside the source contact hole 193 and the source sub-trench 158.

When the contact region 42 shown in FIG. 9A is formed as the contact region 154, the source main surface electrode layer 114 (the source pad 115) may form a Schottky junction with the contact region 154.

When the contact region 42 shown in FIG. 11 is formed as the contact region 154, the source main surface electrode layer 114 (the source pad 115) may form an Ohmic contact or a Schottky junction with the contact region 154.

The source electrode layer 147 may be formed using a part of the source pad 115. That is, the source electrode layer 147 may be formed by a portion of the source pad 115 entering each source trench 145.

The source main surface electrode layer 114 (the source routing wiring 116) enters the diode contact hole 194 from on the interlayer insulating layer 191. The source routing wiring 116 is electrically connected to the diode region 171 inside the diode contact hole 194.

The source main surface electrode layer 114 (the source connection portion 117) is led out from the active region 106 across the side wall structure 182 into the outer region 107. The source connection portion 117 forms a part of the upper layer structure that covers the side wall structure 182.

The SiC semiconductor device 101 includes a passivation layer 198 formed on the interlayer insulating layer 191. The passivation layer 198 may have a single layer structure consisting of a silicon oxide layer or a silicon nitride layer. The passivation layer 198 may have a layered structure including a silicon oxide layer and a silicon nitride layer. The silicon oxide layer may be formed on the silicon nitride layer. The silicon nitride layer may be formed on the silicon oxide layer. The passivation layer 198 preferably includes insulating material different from that of the interlayer insulating layer 191. In this embodiment, the passivation layer 198 has a single layer structure consisting of a silicon nitride layer.

The passivation layer 198 is formed in a film along the interlayer insulating layer 191. The passivation layer 198 selectively covers the active region 106 and the outer region 107 via the interlayer insulating layer 191. The passivation layer 198 is led out from the active region 106 across the side wall structure 182 into the outer region 107. The passivation layer 198 forms a part of the upper layer structure that covers the side wall structure 182.

The passivation layer 198 includes a gate sub pad opening 199 and a source sub pad opening 200 (see also FIG. 23). The gate sub pad opening 199 exposes the gate pad 109. The source sub pad opening 200 exposes the source pad 115.

With reference to FIG. 28, the passivation layer 198 enters the anchor hole 195 from on the interlayer insulating layer 191 in the outer region 107. The passivation layer 198 is connected to the first main surface 103 (the outer main surface 162) inside the anchor hole 195. A recess 201 recessed along the anchor hole 195 is formed in a region of the outer surface of the passivation layer 198 positioned over the anchor hole 195.

A peripheral edge portion of the passivation layer 198 may be formed in a manner flush with the side surfaces 105A to 105D. The peripheral edge portion of the passivation layer 198 may be formed at intervals from the side surfaces 105A to 105D to the inner region. The peripheral edge portion of the passivation layer 198 may expose the first main surface 103 (the interlayer insulating layer 191) in plan view.

The peripheral edge portion of the passivation layer 198 may continue to the peripheral edge portion 118a of the resin layer 118. That is, the peripheral edge portion of the passivation layer 198 may demarcate a part of the dicing street DS. The passivation layer 198 does not need to be physically cut by exposing the first main surface 103 from the peripheral edge portion of the passivation layer 198. It is therefore possible to smoothly cut the SiC semiconductor device 101 out of a single SiC semiconductor wafer.

The resin layer 118 aforementioned is formed on the passivation layer 198. The resin layer 118 is formed in a film along the passivation layer 198. The resin layer 118 selectively covers the active region 106 and the outer region 107 with the passivation layer 198 and the interlayer insulating layer 191 therebetween. The resin layer 118 is led out from the active region 106 across the side wall structure 182 into the outer region 107. The resin layer 118 forms a part of the upper layer structure that covers the side wall structure 182.

The gate pad opening 119 of the resin layer 118 is in communication with the gate sub pad opening 199 of the passivation layer 198. An inner wall of the gate pad opening 119 may be positioned outside the inner wall of the gate sub pad opening 199. The inner wall of the gate pad opening 119 may be positioned inside the inner wall of the gate sub pad opening 199. That is, the resin layer 118 may cover the inner wall of the gate sub pad opening 199.

The source pad opening 120 of the resin layer 118 is in communication with the source sub pad opening 200 of the passivation layer 198. An inner wall of the gate pad opening 119 may be positioned outside the inner wall of the source sub pad opening 200. The inner wall of the source pad opening 120 may be positioned inside the inner wall of the source sub pad opening 200. That is, the resin layer 118 may cover the inner wall of the source sub pad opening 200.

With reference to FIG. 28, the resin layer 118 has an anchor portion entering the recess 201 of the passivation layer 198 in the outer region 107. This causes an anchor structure to be formed in the outer region 107 to increase the strength of connection of the resin layer 118.

The anchor structure includes an uneven structure formed in the first main surface 103 in the outer region 107. More specifically, the anchor structure (uneven structure) includes an unevenness formed using the interlayer insulating layer 191 that covers the outer main surface 162. More specifically, the anchor structure (uneven structure) includes the anchor hole 195 formed in the interlayer insulating layer 191.

The resin layer 118 is engaged with the anchor hole 195. In this embodiment, the resin layer 118 is engaged with the anchor hole 195 via the passivation layer 198. This allows to increase the strength of connection of the resin layer 118 to the first main surface 103 and thereby to suppress a delamination of the resin layer 118.

As described above, the SiC semiconductor device 101 can exhibit the same advantageous effects as those described for the SiC semiconductor device 1. Also, according to the SiC semiconductor device 101, depletion layers can be spread from boundary regions (pn junction portions) between the SiC semiconductor layer 102 and the deep well regions 155 toward regions at the second main surface 104 side with respect to the gate trenches 132.

This allows the current path of the short-circuit current flowing between the source main surface electrode layer 114 and the drain electrode layer 125 to be narrowed. The depletion layers spreading from the boundary regions between the SiC semiconductor layer 102 and the deep well regions 155 can also reduce the feedback capacity Crss in an inversely proportional manner. It is therefore possible to provide the SiC semiconductor device 101 with an improved short-circuit capacity and therefore a reduced feedback capacity Crss. The feedback capacity Crss is the capacitance between the gate electrode layer 139 and the drain electrode layer 125.

The depletion layers spreading from the boundary regions (pn junctions) between the SiC semiconductor layer 102 and the deep well regions 155 may overlap the bottom walls of the gate trenches 132. In this case, the depletion layers spreading from the bottom portions of the deep well regions 155 may overlap the bottom walls of the gate trenches 132.

Also, with the SiC semiconductor device 101, the distance between the bottom portions of each deep well regions 155 and the second main surface 104 are substantially equal. The occurrence of variation in the distances between the bottom portions of the deep well regions 155 and the second main surface 104 can thereby be suppressed. The withstand voltage (for example, a breakdown strength) of the SiC semiconductor layer 102 can thus be suppressed from being restricted by a configuration of the respective deep well regions 155 and therefore improvement of the withstand voltage can be appropriately achieved.

Further, with the SiC semiconductor device 101, the diode region 171 is formed in the outer region 107. The diode region 171 is electrically connected to the source main surface electrode layer 114. This allows the avalanche current generated in the outer region 107 to flow via the diode region 171 into the source main surface electrode layer 114. It is therefore possible to increase the stability of the operation of the MISFET.

Furthermore, with the SiC semiconductor device 101, the outer deep well region 172 is formed in the outer region 107. It is therefore possible to adjust the withstand voltage of the SiC semiconductor layer 102 in the outer region 107.

The outer deep well region 172 is formed at the depth position approximately equal to that of the deep well region 155. More specifically, the bottom portion of the outer deep well region 172 is positioned on substantially the same plane as the bottom portion of the deep well region 155. That is, the distance between the bottom portion of the outer deep well region 172 and the second main surface 104 is approximately equal to the distance between the bottom portion of the deep well region 155 and the second main surface 104.

The occurrence of variation can thereby be suppressed between the distance between the bottom portion of the outer deep well region 172 and the second main surface 104 and the distance between the bottom portion of the deep well region 155 and the second main surface 104. The withstand voltage (for example, a breakdown strength) of the SiC semiconductor layer 102 can thus be suppressed from being restricted by a configuration of the outer deep well region 172 and a configuration of the deep well region 155, and therefore improvement of the withstand voltage can be appropriately achieved.

Also, with the SiC semiconductor device 101, the outer region 107 is formed in the region at the second main surface 104 side with respect to the active region 106. This allows the position of the bottom portion of the outer deep well region 172 to be appropriately brought closer to the position of the bottom portion of the deep well region 155. That is, there is no need to introduce the p type impurities at a relatively deep position in the surface layer portion of the first main surface 103 when, for example, forming the outer deep well region 172. It is therefore possible to appropriately suppress the position of the bottom portion of the outer deep well region 172 from being displaced significantly with respect to the position of the bottom portion of the deep well region 155.

Also, with the SiC semiconductor device 101, the outer main surface 162 is positioned on substantially the same plane as the bottom wall of the source trench 145. As a result, when the p type impurities are introduced with the same energy into the bottom wall of the source trench 145 and the outer main surface 162, the deep well region 155 and the outer deep well region 172 can be formed at approximately the same depth position. It is therefore possible to further appropriately suppress the position of the bottom portion of the outer deep well region 172 from being significantly displaced with respect to the position of the bottom portion of the deep well region 155.

Also, with the SiC semiconductor device 101, the field limiting structure 173 is formed in the outer region 107. This can exhibit an electric field relaxing effect by the field limiting structure 173 in the outer region 107. The breakdown strength of the SiC semiconductor layer 102 can therefore be appropriately improved.

Further, with the SiC semiconductor device 101, the active region 106 is formed as the active mesa 163 in the mesa shape. The active mesa 163 includes active side walls 164 connecting the active main surface 161 of the active region 106 and the outer main surface 162. The level difference moderating structure arranged to moderate the level difference between the active main surface 161 and the outer main surface 162 is formed in the region between the active main surface 161 and the outer main surface 162. The level difference moderating structure includes the side wall structure 182.

This allows the level difference between the active main surface 161 and the outer main surface 162 to be appropriately moderated. It is therefore possible to appropriately increase the flatness of the upper layer structure that is formed on the side wall structure 182. In the SiC semiconductor device 101, the interlayer insulating layer 191, the source main surface electrode layer 114, the passivation layer 198, and the resin layer 118 are formed as an example of the upper layer structure.

Furthermore, with the SiC semiconductor device 101, the anchor structure is formed to increase the strength of connection of the resin layer 118 in the outer region 107. The anchor structure includes the uneven structure formed in the first main surface 103 in the outer region 107. More specifically, the anchor structure (uneven structure) includes the unevenness formed using the interlayer insulating layer 191 that is formed on the first main surface 103 in the outer region 107. More specifically, the anchor structure (uneven structure) includes the anchor hole 195 formed in the interlayer insulating layer 191.

The resin layer 118 is engaged with the anchor hole 195. In this embodiment, the resin layer 118 is engaged with the anchor hole 195 via the passivation layer 198. This allows to increase the strength of connection of the resin layer 118 to the first main surface 103 and thereby to appropriately suppress the delamination of the resin layer 118.

Also, with the SiC semiconductor device 101, the trench gate structure 151 is formed in which the gate electrode layer 139 is embedded in the gate trench 132 with the gate insulating layer 138 therebetween. In the trench gate structure 151, the gate electrode layer 139 is covered with the low resistance electrode layer 157 in a limited space inside the gate trench 132. Such an arrangement can exhibit the same advantageous effects as those described with FIG. 30.

Figure 30:
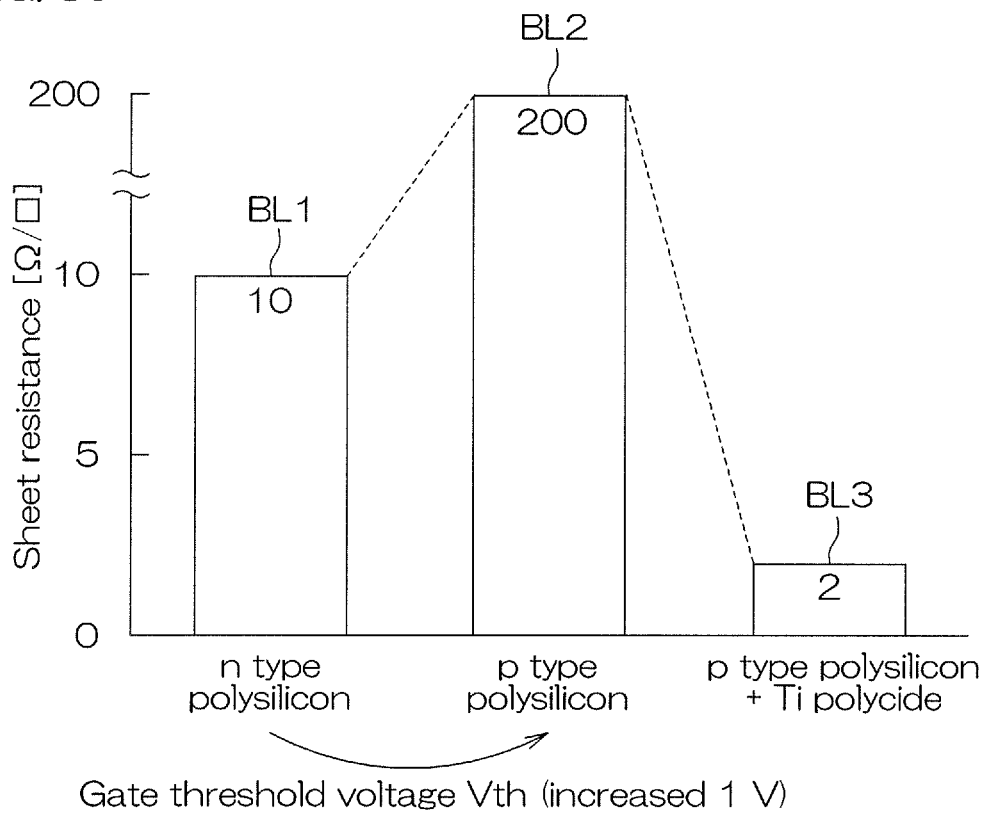
FIG. 30 is a graph for describing a sheet resistance.

FIG. 30 is a graph for describing the sheet resistance inside the gate trench 132. In FIG. 30, the vertical axis represents the sheet resistance [Ω/], while the horizontal axis represents items. FIG. 30 shows a first bar graph BL1, a second bar graph BL2, and a third bar graph BL3.

The first bar graph BL1 represents a sheet resistance inside the gate trench 132 embedded with an n type polysilicon. The second bar graph BL2 represents a sheet resistance inside the gate trench 132 embedded with a p type polysilicon.

The third bar graph BL3 represents the sheet resistance inside the gate trench 132 embedded with the gate electrode layer 139 (p type polysilicon) and the low resistance electrode layer 157. Here will be described a case where the low resistance electrode layer 157 is formed of $TiSi_2$ (p type titanium silicide) as an example of the polycide (silicide).

With reference to the first bar graph BL1, the sheet resistance inside the gate trench 132 embedded with the n type polysilicon was 10Ω/. With reference to the second bar graph BL2, the sheet resistance inside the gate trench 132 embedded with the p type polysilicon was 200Ω/. With reference to the third bar graph BL3, the sheet resistance inside the gate trench 132 embedded with the gate electrode layer 139 (p type polysilicon) and the low resistance electrode layer 157 was 2 Ω/.

The p type polysilicon has a work function different from that of the n type polysilicon. According to the structure in which the gate trench 132 is embedded with the p type polysilicon, the gate threshold voltage Vth can be increased about 1 V. However, the p type polysilicon has the sheet resistance tens of times (20 times here) higher than the sheet resistance of the n type polysilicon. Accordingly, if the p type polysilicon is employed as the material of the gate electrode layer 139, an increase in the parasitic resistance (hereinafter simply referred to as "gate resistance") inside the gate trench 132 results in a significant increase in the energy loss.

In contrast, according to the structure having the low resistance electrode layer 157 on the gate electrode layer 139 (p type polysilicon), the sheet resistance can be reduced to one hundredth or lower than the case where the low resistance electrode layer 157 is not formed. Also, according to the structure having the low resistance electrode layer 157, the sheet resistance can be reduced to one fifth or lower than the case of the gate electrode layer 139 including the n type polysilicon.

Thus, according to the structure having the low resistance electrode layer 157, the sheet resistance inside each gate trench 132 can be reduced while increasing the gate threshold voltage Vth (e.g. about 1 V). This allows the gate resistance to be reduced and thereby the current to be diffused efficiently along the trench gate structure 151. As a result, the switching delay can be shortened.

Further, according to the structure having the low resistance electrode layer 157, there is no need to increase the p type impurity concentration of the body region 131. It is therefore possible to appropriately increase the gate threshold voltage Vth while suppressing the increase in the channel resistance. Also, according to the structure having the low resistance electrode layer 157, there is no need to increase the p type impurity concentration of the contact region 154. It is therefore possible to appropriately increase the gate threshold voltage Vth while suppressing the aging degradation of the gate threshold voltage Vth and the increase in the channel resistance.

The low resistance electrode layer 157 may include at least one of TiSi, $TiSi_2$, NiSi, CoSi, $CoSi_2$, $MoSi_2$, and $WSi_2$. Among these types, NiSi, $CoSi_2$, and $TiSi_2$ each have a relatively low specific resistance and temperature dependency, being suitable as the polycide layer forming the low resistance electrode layer 157.

The inventors of this application have further investigated to eventually find that when $TiSi_2$ is employed as the material of the low resistance electrode layer 157, the leak current between the gate and the source increases under a low electric field. In contrast, when $CoSi_2$ was employed, no increase in the leak current between the gate and the source was observed under a low electric field. In view of this, $CoSi_2$ may be most preferable as the polycide layer forming the low resistance electrode layer 157.

Moreover, with the SiC semiconductor device 101, the gate wiring layer 140 is covered with the low resistance electrode layer 157. This also allows the gate resistance in the gate wiring layer 140 to be reduced. Particularly, in the structure in which the gate electrode layer 139 and the gate wiring layer 140 are covered with the low resistance electrode layer 157, the current can be diffused efficiently along the trench gate structure 151. As a result, the switching delay can be appropriately shortened.

Figure 31:
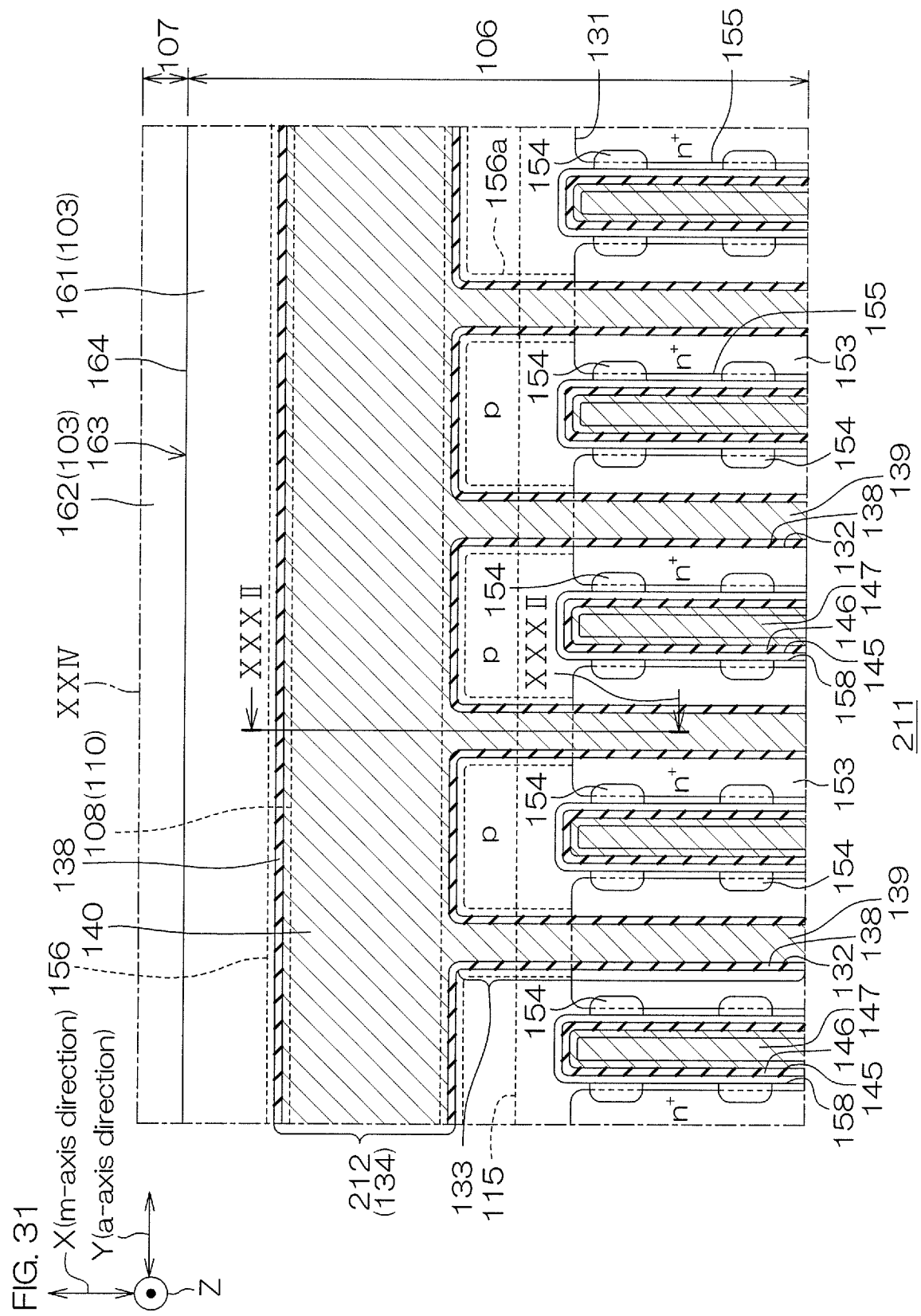
FIG. 31 is an enlarged view of a region corresponding to FIG. 24, showing an SiC semiconductor device according to a ninth preferred embodiment of the present invention.
Figure 32:
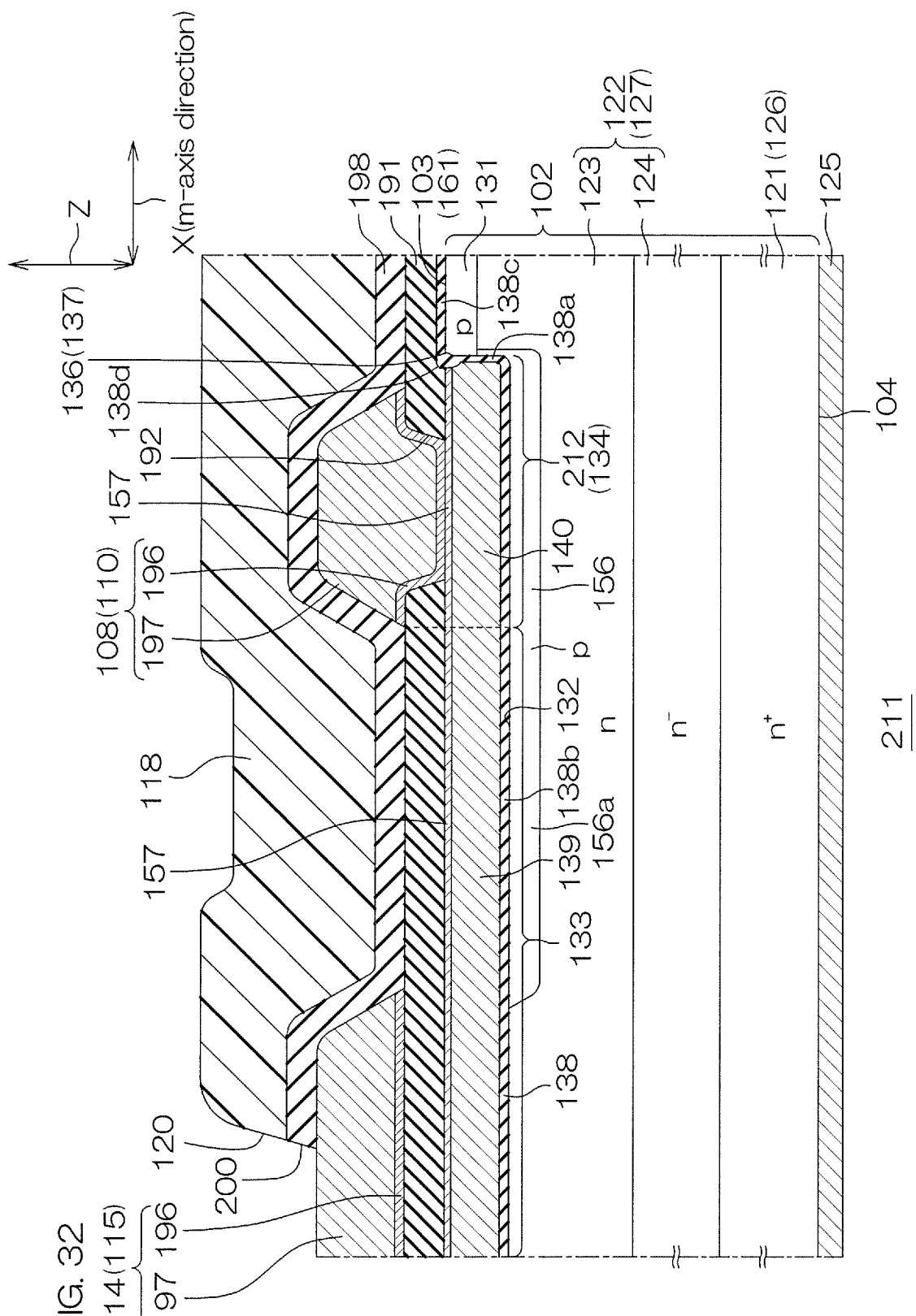
FIG. 32 is a cross-sectional view taken along line XXXII-XXXII in FIG. 31.

FIG. 31 is an enlarged view of a region corresponding to FIG. 24, showing an SiC semiconductor device 211 according to a ninth preferred embodiment of the present invention. FIG. 32 is a cross-sectional view taken along line XXXII-XXXII in FIG. 31. The structures corresponding to those described for the SiC semiconductor device 101 will hereinafter be designated by the same reference signs to omit the description thereof.

With reference to FIG. 31 and FIG. 32, the SiC semiconductor device 211 includes an outer gate trench 212 formed in the first main surface 103 in the active region 106. The outer gate trench 212 extends in a band shape along the peripheral edge portion of the active region 106. The outer gate trench 212 is formed in a region directly below the outer gate finger 110 in the first main surface 103. The outer gate trench 212 extends along the outer gate finger 110.

More specifically, the outer gate trench 212 is formed along the three side surfaces 105A, 105B, 105D and demarcates the inner region of the active region 106 from three directions. The outer gate trench 212 may be formed in an endless shape (e.g. a quadrilateral annular shape) that surrounds the inner region of the active region 106.

The outer gate trench 212 is in communication with the contact trench portion 134 of each gate trench 132. The outer gate trench 212 and the gate trench 132 are thereby formed by a single trench.

The gate wiring layer 140 is embedded in the outer gate trench 212. The gate wiring layer 140 is connected to the gate electrode layer 139 at a communication portions between the gate trenches 132 and the outer gate trench 212.

The low resistance electrode layer 157 covering the gate wiring layer 140 is formed in the outer gate trench 212. In this case, the low resistance electrode layer 157 covering the gate electrode layer 139 and the low resistance electrode layer 157 covering the gate wiring layer 140 are positioned inside the single trench.

As described above, the SiC semiconductor device 211 can exhibit the same advantageous effects as those described for the SiC semiconductor device 101. Also, in the SiC semiconductor device 211, there is no need to lead out the gate wiring layer 140 onto the first main surface 103. The gate wiring layer 140 can thereby be suppressed from opposing the SiC semiconductor layer 102 across the gate insulating layer 138 at the opening edge portions 136 of the gate trenches 132 (the outer gate trench 212). As a result, the concentration of the electric field in the opening edge portion 136 of the gate trench 132 (outer gate trench 212) can be suppressed.

Figure 33:
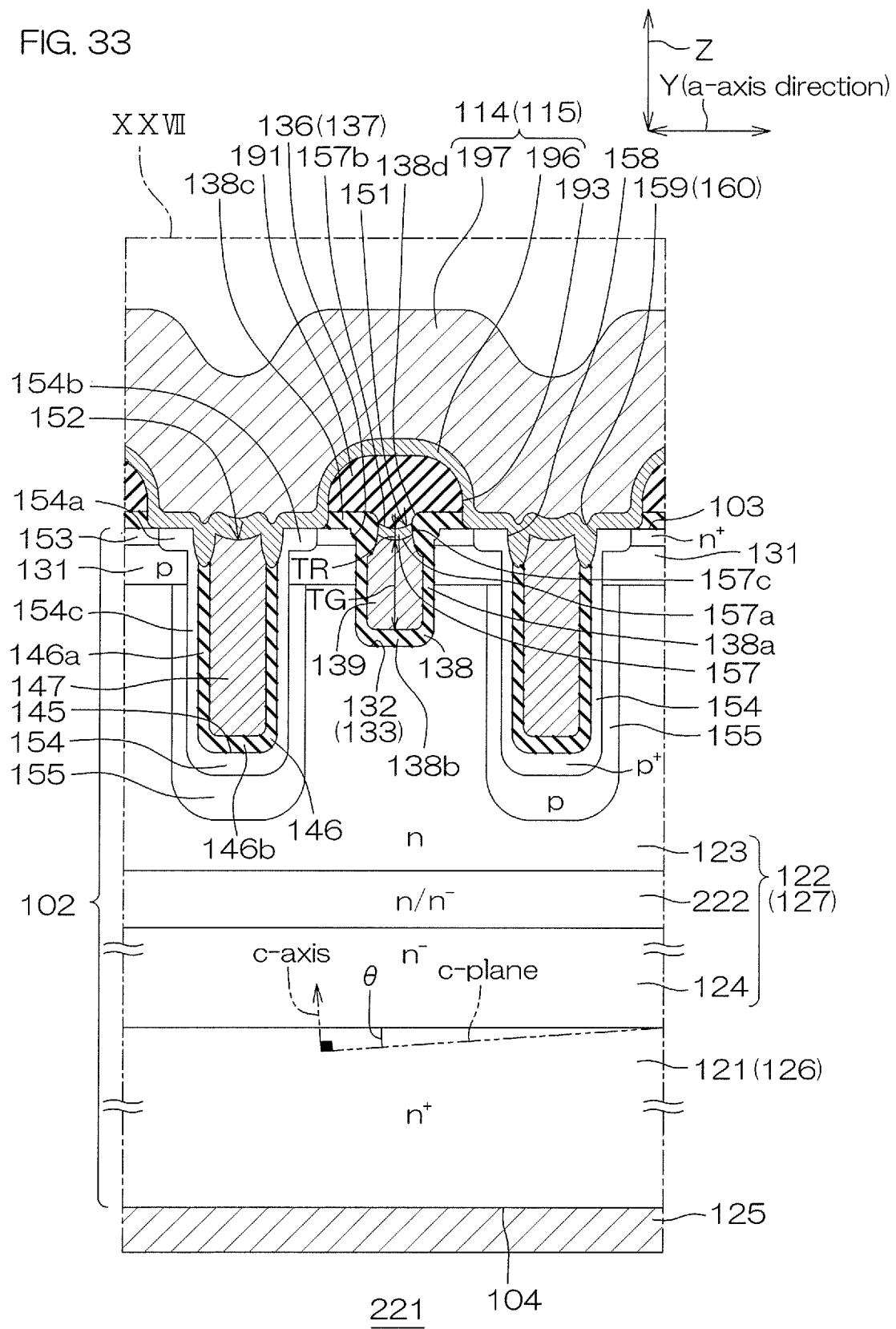
FIG. 33 is an enlarged view of a region corresponding to FIG. 27, showing an SiC semiconductor device according to a tenth preferred embodiment of the present invention.

FIG. 33 is an enlarged view of a region corresponding to FIG. 27, showing an SiC semiconductor device 221 according to a tenth preferred embodiment of the present invention. The structures corresponding to those described for the SiC semiconductor device 101 will hereinafter be designated by the same reference signs to omit the description thereof.

With reference to FIG. 33, in this embodiment, the SiC epitaxial layer 122 includes the high concentration region 123, the low concentration region 124, and a concentration gradient region 222 interposed between the high concentration region 123 and the low concentration region 124. The concentration gradient region 222 is formed not only in the active region 106 but also in the outer region 107 in the SiC epitaxial layer 122. The concentration gradient region 222 is formed in the entire SiC epitaxial layer 122.

The concentration gradient region 222 has a concentration gradient with which the n type impurity concentration decreases gradually from the high concentration region 123 toward the low concentration region 124. That is, the concentration gradient region 222 has a concentration gradient with which the n type impurity concentration increases gradually from the low concentration region 124 toward the high concentration region 123. The concentration gradient region 222 suppresses a rapid change in the n type impurity concentration in a region between the high concentration region 123 and the low concentration region 124.

When the SiC epitaxial layer 122 includes the concentration gradient region 222, the high concentration region 123 preferably has the n type impurity concentration of not less than 1.5 times and not more than 5 times the n type impurity concentration of the low concentration region 124. The high concentration region 123 may have the n type impurity concentration of not less than 3 times and not more than 5 times the n type impurity concentration of the low concentration region 124.

The concentration gradient region 222 may have a thickness of not less than 0.5 μm and not more than 2.0 μm. The concentration gradient region 222 may have a thickness of not less than 0.5 μm and not more than 1.0 μm, not less than 1.0 μm and not more than 1.5 μm, or not less than 1.5 μm and not more than 2.0 μm.

The gate trenches 132, the source trenches 145, the deep well regions 155, the outer deep well region 172, and the like aforementioned are formed in the high concentration region 123, though not specifically described. That is, the gate trenches 132, the source trenches 145, the deep well regions 155, the outer deep well region 172, and the like aforementioned are formed in a region at the first main surface 103 side with respect to the boundary region between the high concentration region 123 and the concentration gradient region 222 in the SiC semiconductor layer 102.

As described above, the SiC semiconductor device 221 can exhibit the same advantageous effects as those described for the SiC semiconductor device 101.

Figure 34:
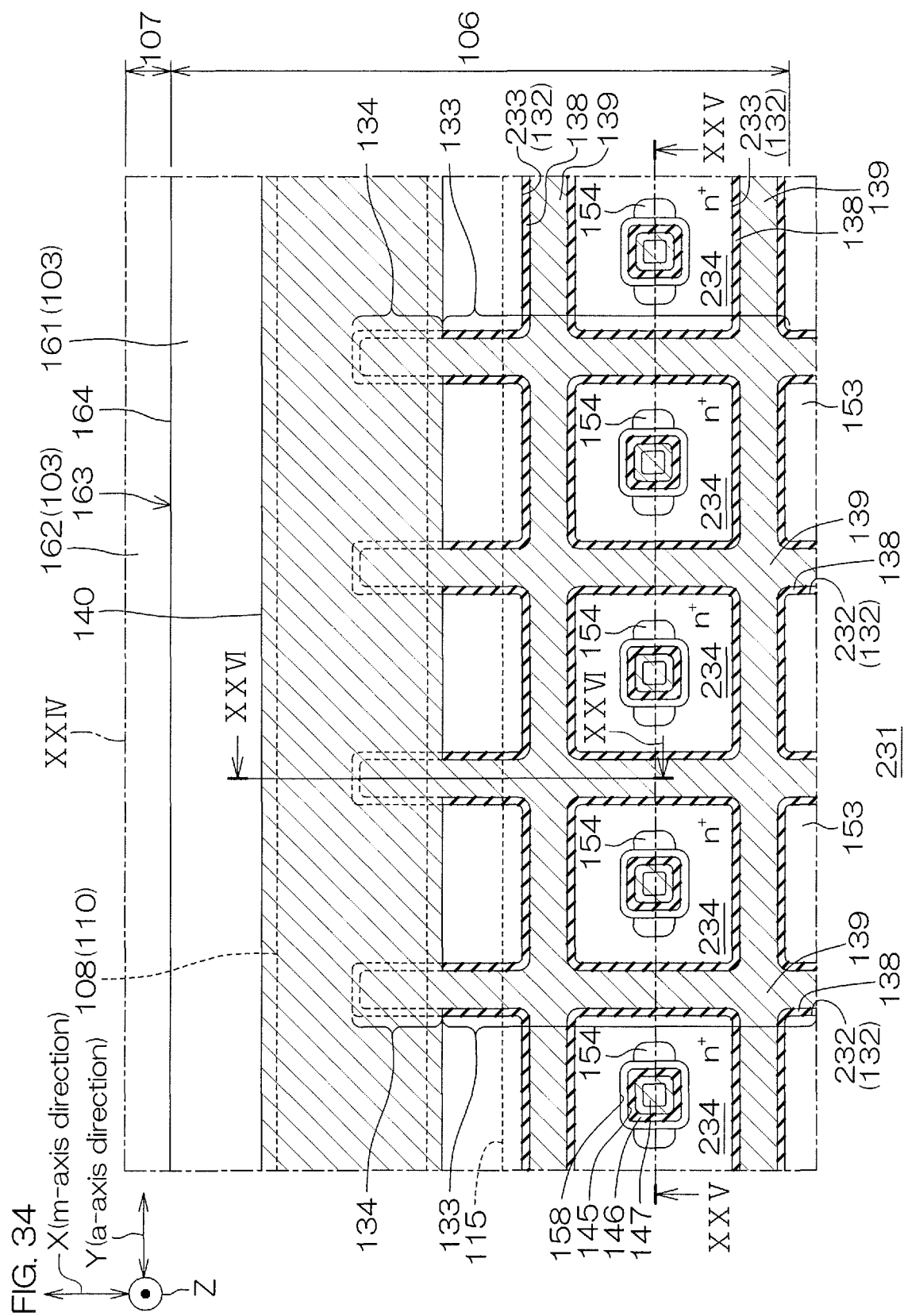
FIG. 34 is an enlarged view of a region corresponding to FIG. 24, showing an SiC semiconductor device according to an eleventh preferred embodiment of the present invention.

FIG. 34 is an enlarged view of a region corresponding to FIG. 24, showing an SiC semiconductor device 231 according to an eleventh preferred embodiment of the present invention. The structures corresponding to those described for the SiC semiconductor device 101 will hereinafter be designated by the same reference signs to omit the description thereof.

With reference to FIG. 34, in this embodiment, the gate trench 132 is formed in a grid shape in plan view. The gate trench 132 includes, more specifically, a plurality of first gate trenches 232 and a plurality of second gate trenches 233. The plurality of first gate trenches 232 and the plurality of second gate trenches 233 form the active trench portion 133.

The plurality of first gate trenches 232 are each formed in a band shape extending in the first direction X (the m-axis direction of the SiC monocrystal) and formed at an intervals in the second direction Y (the a-axis direction of the SiC monocrystal). The plurality of first gate trenches 232 are formed in a striped manner extending in the first direction X in plan view. The side walls forming long sides of each first gate trench 232 are formed by the a-planes of the SiC monocrystal. The side walls forming short sides of each first gate trench 232 are formed by the m-planes of the SiC monocrystal.

The plurality of second gate trenches 233 are each formed in a band shape extending in the second direction Y (the a-axis direction of the SiC monocrystal) and formed at intervals in the first direction X (the m-axis direction of the SiC monocrystal). The plurality of second gate trenches 233 are formed in a striped manner extending in the second direction Y in plan view. The side walls forming long sides of each second gate trench 233 are formed by the m-planes of the SiC monocrystal. The side walls forming short sides of each second gate trench 233 are formed by the a-planes of the SiC monocrystal.

The plurality of second gate trenches 233 intersect with the plurality of first gate trenches 232. The single grid-shaped gate trench 132 is thereby formed in plan view. Plurality of cell regions 234 are demarcated in regions surrounded by the gate trench 132.

The plurality of cell regions 234 are arranged in a matrix form at an intervals in the first direction X and the second direction Y in plan view. The plurality of cell regions 234 are each formed in a quadrilateral shape in plan view. The gate trench 132 may be formed in a honeycomb shape as an aspect of the grid shape in plan view. In this case, the plurality of cell regions 234 may each be formed in a hexagonal shape in plan view. In this case, the plurality of cell regions 234 may also be arranged in a staggered form at intervals in the first direction X and the second direction Y.

In each cell region 234, the body region 131 is exposed from the side walls of the gate trench 132. The body region 131 is exposed from the side walls of the gate trench 132 that is formed by the m-planes and the a-planes of the SiC monocrystal.

Each source trench 145 is formed in a central portion of each cell region 234 in plan view. Each source trench 145 is formed in a pattern in which a single source trench 145 appears in a cross-section along the first direction X of each cell region 234. Each source trench 145 is also formed in a pattern in which the single source trench 145 appears in a cross-section along the second direction Y of each cell region 234. The side walls of each source trench 145 are formed by the m-planes and the a-planes of the SiC monocrystal.

More specifically, each source trench 145 is formed in a quadrilateral shape in plan view. The planar shape of each source trench 145 is arbitrary. Each source trench 145 may be formed in polygonal shape such as a triangular shape, a pentagonal shape, a hexagonal shape, or a circular shape or an elliptical shape in plan view.

The cross-sectional view taken along line XXV-XXV in FIG. 34 corresponds to the cross-sectional view shown in FIG. 25. The cross-sectional view taken along line XXVI-XXVI in FIG. 34 corresponds to the cross-sectional view shown in FIG. 26.

As described above, the SiC semiconductor device 231 can exhibit the same advantageous effects as those described for the SiC semiconductor device 101.

The preferred embodiments of the present invention may be implemented in yet other embodiments.

With each of the preferred embodiments described above, the examples in which the SiC semiconductor layer 2, 102 have the layered structure including the SiC semiconductor substrate 21, 121 and the SiC epitaxial layer 122 are described. However, the SiC semiconductor layer 2, 102 may have a single layer structure consisting of the SiC semiconductor substrate 21, 121. The SiC semiconductor layer 2, 102 may have a single layer structure consisting of the SiC epitaxial layer 22, 122.

With each of the preferred embodiments described above, the examples that the plurality of gate trenches 32, 132 (the first gate trenches 33, 232) are formed extending in the m-axis direction ([1-100] direction) of the SiC monocrystal are described. However, the plurality of gate trenches 32, 132 (first gate trenches 33, 232) may be formed extending in the a-axis direction ([11-20] direction) of the SiC monocrystal. In this case, the plurality of source trenches 63, 145 are formed extending in the a-axis direction ([11-20] direction) of the SiC monocrystal.

With each of the preferred embodiments described above, the examples that the source electrode layer 67, 147 are embedded in the source trenches 63, 145 with the source insulating layer 66, 146 therebetween are described. However, the source electrode layer 67, 147 may be embedded in the source trenches 63, 145 directly without the source insulating layer 66, 146 therebetween.

With each of the preferred embodiments described above, the examples that the source insulating layer 66, 146 are formed along the side walls and the bottom wall of the source trenches 63, 145. However, the source insulating layer 66, 146 may expose the bottom wall of the source trenches 63, 145. In this case, the source insulating layer 66, 146 may be formed along the side walls and the bottom wall of the source trenches 63, 145 such as to expose a part of the bottom wall of the source trenches 63, 145.

The source insulating layer 66, 146 may expose the side walls of the source trenches 63, 145. In this case, the source insulating layer 66, 146 may be formed along the side walls and the bottom wall of the source trenches 63, 145 such as to expose parts of the side walls of the source trenches 63, 145.

With each of the eighth to eleventh preferred embodiments described above, the examples that the gate electrode layer 139 and the gate wiring layer 140 each including the p type polysilicon are formed. However, if less significance is placed on the increase in the gate threshold voltage Vth, the gate electrode layer 139 and the gate wiring layer 140 may each include the n type polysilicon doped with n type impurities, alternatively or additionally to the p type polysilicon.

In this case, the low resistance electrode layer 157 may be formed by siliciding, by a metal material, the portions of the gate electrode layers 139 (n type polysilicon) forming the surface layer portions. That is, the low resistance electrode layer 157 may include an n type polycide. With such a structure, reduction of gate resistance can be achieved.

In the preferred embodiments described above, a structure in which the conductivity types of the respective semiconductor portions are inverted may be adopted. That is, a p type portion may be made to be of an n type and an n type portion may be made to be of a p type.

In the preferred embodiments described above, a p$^+$-type SiC semiconductor substrate (21, 121) may be employed instead of the n$^+$ type SiC semiconductor substrate 21, 121. According to this structure, IGBT (Insulated Gate Bipolar Transistor) can be provided instead of MISFET. In this case, in the preferred embodiments described above, the "source" of the MISFET is replaced by an "emitter" of the IGBT and the "drain" of the MISFET is replaced by a "collector" of the IGBT.

The respective preferred embodiments described above can also be applied to a semiconductor device using a semiconductor material differing from SiC. The semiconductor material differing from SiC may be a compound semiconductor material. The compound semiconductor material may be either or both of gallium nitride (GaN) and gallium oxide ($Ga_2O_3$).

In a compound semiconductor MISFET, magnesium may be employed as p type impurities (acceptors). Also, germanium (Ge), oxygen (O), or silicon (Si) may be employed as n type impurities (donors).

The description does not restrict any combined configuration of the features illustrated in the first to eleventh preferred embodiments. The first to eleventh preferred embodiments may be combined with each other in any aspect or any mode. That is, SiC semiconductor devices may be employed in which the features illustrated in the first to eleventh preferred embodiments are combined in any aspect and any mode.

Example features extracted from the description and the accompanying drawings will hereinafter be denoted. The following examples each denote an SiC semiconductor device in which an aging degradation of a gate threshold voltage Vth can be suppressed.

[A1] An SiC semiconductor device comprising: an SiC semiconductor layer having a first main surface on one side and a second main surface on the other side and including an active region and an outer region outside the active region; a trench formed in the first main surface in the active region; a gate insulating layer formed on an inner wall of the trench; a gate electrode embedded in the trench with the gate insulating layer therebetween; a source region of a first conductivity type formed in a surface layer portion of the first main surface in the active region and positioned at the side of the trench; a body region of a second conductivity type formed in the surface layer portion of the first main surface in the active region and positioned at a region at the second main surface side with respect to the source region; a drift region of the first conductivity type formed in the surface layer portion of the first main surface at the active region and the outer region, and including a portion positioned at a region at the second main surface side with respect to the body region; an impurity region of the second conductivity type formed in the surface layer portion of the first main surface in the outer region and forming a pn junction diode with the drift region; and a contact region of the second conductivity type formed in the surface layer portion of the first main surface in the active region, positioned at a region at an opposite side of the trench with respect to the source region, and having a second conductivity type impurity concentration of not more than $1.0 \times 10^{20}$ $cm^{-3}$.

[A2] The SiC semiconductor device according to A1, wherein the contact region has the second conductivity type impurity concentration of not less than $1.0 \times 10^{17}$ $cm^{-3}$.

[A3] The SiC semiconductor device according to A1 or A2, wherein the contact region has the second conductivity type impurity concentration of less than $1.0 \times 10^{20}$ $cm^{-3}$.

[A4] The SiC semiconductor device according to any one of A1 to A3, wherein the impurity region has a second conductivity type impurity concentration of not more than $1.0 \times 10^{20}$ $cm^{-3}$.

[A5] The SiC semiconductor device according to A4, wherein the impurity region has the second conductivity type impurity concentration of not less than $1.0 \times 10^{17}$ $cm^{-3}$.

[A6] The SiC semiconductor device according to any one of A1 to A3, wherein the impurity region has a second conductivity type impurity concentration exceeding $1.0 \times 10^{20}$ $cm^{-3}$.

[A7] The SiC semiconductor device according to A6, wherein the impurity region has the second conductivity type impurity concentration of not more than $1.0 \times 10^{21}$ $cm^{-3}$.

[A8] The SiC semiconductor device according to any one of A1 to A3, wherein the impurity region has a second conductivity type impurity concentration equal to that of the contact region.

[A9] The SiC semiconductor device according to any one of A1 to A8, wherein the impurity region has a thickness equal to the thickness of the contact region.

[A10] The SiC semiconductor device according to any one of A1 to A9, wherein the impurity region extends in a band shape along the active region.

[A11] The SiC semiconductor device according to any one of A1 to A10, wherein the impurity region surrounds the active region.

[A12] The SiC semiconductor device according to any one of A1 to A11, further comprising: an electrode layer formed on the first main surface, forming an Ohmic contact with the source region, and forming a Schottky junction with the contact region.

[A13] The SiC semiconductor device according to A1, further comprising: an electrode layer formed on the first main surface, forming an Ohmic contact with the source region, forming a Schottky junction with the contact region, and forming an Ohmic contact with the impurity region.

[A14] The SiC semiconductor device according to A1, further comprising: an electrode layer formed on the first main surface, forming an Ohmic contact with the source region, forming a Schottky junction with the contact region, and forming a Schottky junction with the impurity region.

[A15] The SiC semiconductor device according to any one of A1 to A14, wherein the SiC semiconductor layer includes a hexagonal SiC monocrystal.

[A16] The SiC semiconductor device according to A15, wherein the SiC semiconductor layer includes a 2H (Hexagonal)—SiC monocrystal, a 4H—SiC monocrystal, or a 6H—SiC monocrystal.

[A17] The SiC semiconductor device according to A15 or A16, wherein the first main surface faces a c-plane of the SiC monocrystal.

[A18] The SiC semiconductor device according to any one of A15 to A17, wherein the trench has a side wall facing an m-plane of the SiC monocrystal, a side wall facing an a-plane of the SiC monocrystal, and a bottom wall facing a c-plane of the SiC monocrystal.

[A19] The SiC semiconductor device according to A18, wherein the source region is exposed from the side wall of the trench facing the a-plane of the SiC monocrystal and the body region is exposed from the side wall of the trench facing the a-plane of the SiC monocrystal.

[A20] The SiC semiconductor device according to any one of A15 to A19, wherein the first main surface has an off angle inclined at an angle of not less than 0 degrees and not more than 10 degrees with respect to a c-plane of the SiC monocrystal.

[A21] The SiC semiconductor device according to A20, wherein the off angle is not more than 5 degrees.

[A22] The SiC semiconductor device according to A20 or A21, wherein the off angle is more than 0 degrees and less than 4 degrees.

[A23] The SiC semiconductor device according to any one of A1 to A22, further comprising: a second trench formed in the first main surface at an interval from the trench in the active region, wherein the contact region is formed in a side of the second trench.

[A24] The SiC semiconductor device according to A23, further comprising: a source electrode layer embedded in the second trench.

[A25] The SiC semiconductor device according to A23 or A24, wherein the contact region is exposed from a side wall of the second trench.

[A26] The SiC semiconductor device according to any one of A23 to A25, wherein the contact region is exposed from a side wall and a bottom wall of the second trench.

[A27] The SiC semiconductor device according to any one of A23 to A26, wherein the trench is formed in a grid shape in plan view, and the second trench is formed in a region surrounded by the trench in plan view.

[A28] The SiC semiconductor device according to any one of A23 to A27, wherein the trench extends in a band shape in plan view, and the second trench extends in a band shape along the trench in plan view.

[A29] The SiC semiconductor device according to any one of A23 to A28, wherein the second trench is deeper than the trench.

[B1] An SiC semiconductor device comprising: an SiC semiconductor layer having a first main surface on one side and a second main surface on the other side and including an active region and an outer region outside the active region; a trench formed in the first main surface in the active region;

a gate insulating layer formed on an inner wall of the trench; a gate electrode embedded in the trench with the gate insulating layer therebetween; a source region of a first conductivity type formed in a surface layer portion of the first main surface in the active region and positioned at a side of the trench; a body region of a second conductivity type formed in the surface layer portion of the first main surface in the active region and positioned at a region at the second main surface side with respect to the source region; a drift region of the first conductivity type formed in the surface layer portion of the first main surface at the active region and the outer region, and including a portion positioned at a region at the second main surface side with respect to the body region; an impurity region of the second conductivity type formed in the surface layer portion of the first main surface in the outer region and forming a pn junction diode with the drift region; and a contact region of the second conductivity type formed in the surface layer portion of the first main surface in the active region, positioned at a region at an opposite side of the trench with respect to the source region, and including first conductivity type impurities and second conductivity type impurities, in which portions of the second conductivity type impurities are cancelled/compensated for by the first conductivity type impurities.

[B2] The SiC semiconductor device according to B1, wherein the contact region has a second conductivity type impurity concentration exceeding a first conductivity type impurity concentration of the source region.

[B3] The SiC semiconductor device according to B1 or B2, wherein the contact region has a second conductivity type impurity concentration less than a second conductivity type impurity concentration of the impurity region.

[B4] The SiC semiconductor device according to any one of B1 to B3, wherein the contact region has a second conductivity type impurity concentration of not less than $1.0 \times 10^{20}$ cm$^{-3}$.

[B5] The SiC semiconductor device according to B4, wherein the contact region has the second conductivity type impurity concentration of not more than $1.0 \times 10^{21}$ cm$^{-3}$.

[B6] The SiC semiconductor device according to any one of B1 to B5, wherein the impurity region has a second conductivity type impurity concentration of not less than $1.0 \times 10^{20}$ cm$^{-3}$.

[B7] The SiC semiconductor device according to B6, wherein the contact region has the second conductivity type impurity concentration of not more than $1.0 \times 10^{21}$ cm$^{-3}$.

[B8] The SiC semiconductor device according to any one of B1 to B7, wherein the contact region has a thickness exceeding a thickness of the source region.

[B9] The SiC semiconductor device according to B8, wherein the contact region includes a surface layer region positioned at a region at the first main surface side with respect to a bottom portion of the source region, in which portions of the second conductivity type impurities are cancelled/compensated for by the first conductivity type impurities, and a bottom portion region positioned at a region at the second main surface side of the SiC semiconductor layer with respect to the bottom portion of the source region, the second conductivity type impurities are not cancelled/compensated for by the first conductivity type impurities.

[B10] The SiC semiconductor device according to any one of B1 to B9, wherein the impurity region extends in a band shape along the active region.

[B11] The SiC semiconductor device according to any one of B1 to B10, wherein the impurity region surrounds the active region.

[B12] The SiC semiconductor device according to any one of B1 to B11, wherein the SiC semiconductor layer includes a hexagonal SiC monocrystal.

[B13] The SiC semiconductor device according to B12, wherein the SiC semiconductor layer includes a 2H (Hexagonal) —SiC monocrystal, a 4H—SiC monocrystal, or a 6H—SiC monocrystal.

[B14] The SiC semiconductor device according to B12 or B13, wherein first main surface faces a c-plane of the SiC monocrystal.

[B15] The SiC semiconductor device according to any one of B12 to B14, wherein the trench has a side wall facing an m-plane of the SiC monocrystal, a side wall facing an a-plane of the SiC monocrystal, and a bottom wall facing a c-plane of the SiC monocrystal.

[B16] The SiC semiconductor device according to B15, wherein the source region is exposed from the side wall of the trench facing the a-plane of the SiC monocrystal and the body region is exposed from the side wall of the trench facing the a-plane of the SiC monocrystal.

[B17] The SiC semiconductor device according to any one of B12 to B16, wherein the first main surface has an off angle inclined at an angle of not less than 0 degrees and not more than 10 degrees with respect to a c-plane of the SiC monocrystal.

[B18] The SiC semiconductor device according to B17, wherein the off angle is not more than 5 degrees.

[B19] The SiC semiconductor device according to B17 or B18, wherein the off angle is more than 0 degrees and less than 4 degrees.

[B20] The SiC semiconductor device according to any one of B1 to B19, further comprising: a second trench formed in the first main surface at an interval from the trench in the active region, wherein the contact region is formed in a side of the second trench.

[B21] The SiC semiconductor device according to B20, further comprising: a source electrode layer embedded in the second trench.

[B22] The SiC semiconductor device according to B20 or B21, wherein the contact region is exposed from a side wall of the second trench.

[B23] The SiC semiconductor device according to any one of B20 to B22, wherein the contact region is exposed from a side wall and a bottom wall of the second trench.

[B24] The SiC semiconductor device according to any one of B20 to B23, wherein the trench is formed in a grid shape in plan view, and the second trench is formed in a region surrounded by the trench in plan view.

[B25] The SiC semiconductor device according to any one of B20 to B24, wherein the trench extends in a band shape in plan view, and the second trench extends in a band shape along the trench in plan view.

[B26] The SiC semiconductor device according to any one of B20 to B25, wherein the second trench is deeper than the trench.

[C1] An SiC semiconductor device comprising: an SiC semiconductor layer having a first main surface on one side and a second main surface on the other side and including an active region and an outer region outside the active region; a trench formed in the first main surface in the active region; a gate insulating layer formed on an inner wall of the trench; a gate electrode embedded in the trench with the gate insulating layer therebetween; a source region of a first conductivity type formed in the surface layer portion of the first main surface in the active region and positioned at a side of the trench; a body region of a second conductivity type formed in the surface layer portion of the first main surface in the active region and positioned at a region at the second main surface side with respect to the source region; a drift region of the first conductivity type formed in the surface layer portion of the first main surface at the active region and the outer region, and including a portion positioned at a region at the second main surface side with respect to the body region; an impurity region of the second conductivity type formed in the surface layer portion of the first main surface in the outer region and forming a pn junction diode with the drift region; a contact region of the second conductivity type formed in the surface layer portion of the first main surface in the active region and positioned at a region at an opposite side of the trench with respect to the source region; and an electrode layer formed on the first main surface, forming an Ohmic contact with the source region, and forming a Schottky junction with the contact region.

[C2] The SiC semiconductor device according to C1, wherein the electrode layer forms a Schottky junction with the impurity region.

[C3] The SiC semiconductor device according to C2, wherein the impurity region has a second conductivity type impurity concentration of not more than $1.0 \times 10^{20}$ cm$^{-3}$.

[C4] The SiC semiconductor device according to C3, wherein the impurity region has the second conductivity type impurity concentration of not less than $1.0 \times 10^{17}$ cm$^{-3}$.

[C5] The SiC semiconductor device according to C1, wherein the electrode layer forms an Ohmic contact with the impurity region.

[C6] The SiC semiconductor device according to C5, wherein the impurity region has a second conductivity type impurity concentration exceeding $1.0 \times 10^{20}$ cm$^{-3}$.

[C7] The SiC semiconductor device according to C6, wherein the impurity region has the second conductivity type impurity concentration of not more than $1.0 \times 10^{21}$ cm$^{-3}$.

[C8] The SiC semiconductor device according to any one of C1 to C7, wherein the impurity region extends in a band shape along the active region.

[C9] The SiC semiconductor device according to any one of C1 to C8, wherein the impurity region surrounds the active region.

[C10] The SiC semiconductor device according to any one of C1 to C9, wherein the SiC semiconductor layer includes a hexagonal SiC monocrystal.

[C11] The SiC semiconductor device according to C10, wherein the SiC semiconductor layer includes a 2H (Hexagonal) —SiC monocrystal, a 4H—SiC monocrystal, or a 6H—SiC monocrystal.

[C12] The SiC semiconductor device according to C10 or C11, wherein first main surface faces a c-plane of the SiC monocrystal.

[C13] The SiC semiconductor device according to any one of C10 to C12, wherein the trench has a side wall facing an m-plane of the SiC monocrystal, a side wall facing an a-plane of the SiC monocrystal, and a bottom wall facing a c-plane of the SiC monocrystal.

[C14] The SiC semiconductor device according to C13, wherein the source region is exposed from the side wall of the trench facing the a-plane of the SiC monocrystal and the body region is exposed from the side wall of the trench facing the a-plane of the SiC monocrystal.

[C15] The SiC semiconductor device according to any one of C10 to C14, wherein the first main surface has an off angle inclined at an angle of not less than 0 degrees and not more than 10 degrees with respect to a c-plane of the SiC monocrystal.

[C16] The SiC semiconductor device according to C15, wherein the off angle is not more than 5 degrees.

[C17] The SiC semiconductor device according to C15 or C16, wherein the off angle is more than 0 degrees and less than 4 degrees.

[C18] The SiC semiconductor device according to any one of C1 to C17, further comprising a second trench formed in the first main surface at an interval from the trench in the active region, wherein the contact region is formed in a side of the second trench.

[C19] The SiC semiconductor device according to C18, further comprising: a source electrode layer embedded in the second trench.

[C20] The SiC semiconductor device according to C18 or C19, wherein the contact region is exposed from a side wall of the second trench.

[C21] The SiC semiconductor device according to any one of C18 to C20, wherein the contact region is exposed from a side wall and a bottom wall of the second trench.

[C22] The SiC semiconductor device according to any one of C18 to C21, wherein the trench is formed in a grid shape in plan view, and the second trench is formed in a region surrounded by the trench in plan view.

[C23] The SiC semiconductor device according to any one of C18 to C22, wherein the trench extends in a band shape in plan view, and the second trench extends in a band shape along the trench in plan view.

[C24] The SiC semiconductor device according to any one of C18 to C23, wherein the second trench is deeper than the trench.

[D1] An SiC semiconductor device comprising: an SiC semiconductor layer having a first main surface on one side and a second main surface on the other side; a trench formed in the first main surface; a gate insulating layer formed on an inner wall of the trench; a gate electrode embedded in the trench with the gate insulating layer therebetween; a source region of a first conductivity type formed in a side of the trench in the surface layer portion of the first main surface; a body region of a second conductivity type formed in a region at the second main surface side with respect to the source region in the surface layer portion of the first main surface; a drift region of the first conductivity type formed in a region at the second main surface side with respect to the body region in the SiC semiconductor layer; and a contact region of the second conductivity type having a second conductivity type impurity concentration exceeding a second conductivity type impurity concentration of the body region and less than a first conductivity type impurity concentration of the source region.

[E1] An SiC semiconductor device comprising: an SiC semiconductor layer having a first main surface on one side and a second main surface on the other side; a trench formed in the first main surface; a gate insulating layer formed on an inner wall of the trench; a gate electrode embedded in the trench with the gate insulating layer therebetween; a source region of a first conductivity type formed in a side of the trench in the surface layer portion of the first main surface; a body region of a second conductivity type formed in a region at the second main surface side with respect to the source region in the surface layer portion of the first main surface; a drift region of the first conductivity type formed in a region at the second main surface side with respect to the body region in the SiC semiconductor layer; and a contact region of the second conductivity type formed in a region at an opposite side of the trench with respect to the source region in the surface layer portion of the first main surface and having a thickness exceeding a thickness of the source region in a normal direction of the first main surface; wherein the contact region includes a surface layer region positioned at a region at the first main surface side with respect to a bottom portion of the source region, in which portions of second conductivity type impurities are cancelled/compensated for by first conductivity type impurities, and a bottom portion region positioned at a region at the second main surface side of the SiC semiconductor layer with respect to the bottom portion of the source region, in which the second conductivity type impurities are not cancelled/compensated for by the first conductivity type impurities.

[F1] An SiC semiconductor device comprising: an SiC semiconductor layer having a first main surface on one side and a second main surface on the other side; a trench formed in the first main surface; a second trench formed in the first main surface at an interval from the trench; a gate insulating layer formed on an inner wall of the trench; a gate electrode embedded in the trench with the gate insulating layer therebetween; a source region of a first conductivity type formed in a side of the trench in the surface layer portion of the first main surface; a body region of a second conductivity type formed in a region at the second main surface side with respect to the source region in the surface layer portion of the first main surface; a drift region of the first conductivity type formed in a region at the second main surface side with respect to the body region in the SiC semiconductor layer; and a contact region of the second conductivity type formed along the second trench in the surface layer portion of the first main surface and having a second conductivity type impurity concentration of not more than $1.0 \times 10^{20}$ cm$^{-3}$.

[F2] The SiC semiconductor device according to F1, further comprising: a deep well region of the second conductivity type formed along the second trench such as to cover the contact region in the surface layer portion of the first main surface.

[F3] The SiC semiconductor device according to F2, wherein the deep well region has a second conductivity type impurity concentration less than the second conductivity type impurity concentration of the contact region.

[F4] The SiC semiconductor device according to any one of F1 to F3, wherein the second trench is deeper than the trench.

[G1] An SiC semiconductor device comprising: an SiC semiconductor layer having a first main surface on one side and a second main surface on the other side; a trench formed in the first main surface; a second trench formed in the first main surface at an interval from the trench; a gate insulating layer formed on an inner wall of the trench; a gate electrode embedded in the trench with the gate insulating layer therebetween; a source region of a first conductivity type formed in a side of the trench in the surface layer portion of the first main surface; a body region of a second conductivity type formed in a region at the second main surface side with respect to the source region in the surface layer portion of the first main surface; a drift region of the first conductivity type formed in a region at the second main surface side with respect to the body region in the SiC semiconductor layer; and a contact region of the second conductivity type formed along the second trench in the surface layer portion of the first main surface and including first conductivity type impurities and second conductivity type impurities, in which portions of the second conductivity type impurities are cancelled/compensated for by the first conductivity type impurities.

[G2] The SiC semiconductor device according to G1, wherein the contact region includes a surface layer region positioned at a region at the first main surface side with respect to a bottom portion of the source region and a bottom portion region positioned at a region at the second main surface side of the SiC semiconductor layer with respect to the bottom portion of the source region.

[G3] The SiC semiconductor device according to G2, wherein the surface layer region of the contact region is arranged such that the portions of the second conductivity type impurities are cancelled/compensated for by the first conductivity type impurities.

[G4] The SiC semiconductor device according to G2 or G3, wherein the bottom portion region of the contact region is free from the first conductivity type impurities.

[G5] The SiC semiconductor device according to any one of G1 to G4, further comprising: a deep well region of the second conductivity type formed along the second trench such as to cover the contact region in the surface layer portion of the first main surface.

[G6] The SiC semiconductor device according to G5, wherein the deep well region has a second conductivity type impurity concentration less than a second conductivity type impurity concentration of the contact region.

[G7] The SiC semiconductor device according to any one of G1 to G6, wherein the second trench is deeper than the trench.

[H1] An SiC semiconductor device comprising: an SiC semiconductor layer having a first main surface on one side and a second main surface on the other side; a trench formed in the first main surface; a second trench formed in the first main surface at an interval from the trench; a gate insulating layer formed on an inner wall of the trench, a gate electrode embedded in the trench with the gate insulating layer therebetween; a source region of a first conductivity type formed in a side of the trench in the surface layer portion of the first main surface; a body region of a second conductivity type formed in a region at the second main surface side with respect to the source region in the surface layer portion of the first main surface; a drift region of the first conductivity type formed in a region at the second main surface side with respect to the body region in the SiC semiconductor layer; a contact region of the second conductivity type formed along the second trench in the surface layer portion of the first main surface; and an electrode layer formed on the first main surface, forming an Ohmic contact with the source region, and forming a Schottky junction with the contact region.

[H2] The SiC semiconductor device according to H1, further comprising: a deep well region of the second conductivity type formed along the second trench such as to cover the contact region in the surface layer portion of the first main surface.

[H3] The SiC semiconductor device according to H2, wherein the deep well region has a second conductivity type impurity concentration less than a second conductivity type impurity concentration of the contact region.

[H4] The SiC semiconductor device according to any one of H1 to H3, wherein the second trench is deeper than the trench.

This application corresponds to Japanese Patent Application No. 2018-148646 filed on Aug. 7, 2018 with the Japan Patent Office, the disclosure of which is incorporated herein by reference in its entirety. While the preferred embodiments of the present invention have heretofore been described in detail, these are merely specific examples used to clarify the technical contents of the present invention, and the present invention should not be interpreted as being limited only to these specific examples. The scope of the present invention shall be limited only by the appended claims.

REFERENCE SIGNS LIST

1: SiC semiconductor device
2: SiC semiconductor layer
3: First main surface
4: Second main surface
6: Active region
7: Outer region
25: Drift region
31: Body region
32: Gate trench (trench)
38: Gate insulating layer
39: Gate electrode layer (gate electrode)
41: Source region
42: Contact region
45: Diode region
61: SiC semiconductor device
62: SiC semiconductor device
67: Source electrode layer
63: Source trench (second trench)
71: SiC semiconductor device
72: SiC semiconductor device
75: SiC semiconductor device
85: SiC semiconductor device
101: SiC semiconductor device
102: SiC semiconductor layer
103: First main surface
104: Second main surface
106: Active region
107: Outer region
127: Drift region
131: Body region
132: Gate trench (trench)
138: Gate insulating layer
139: Gate electrode layer (gate electrode)
145: Source trench (second trench)
147: Source electrode layer
153: Source region
154: Contact region
171: Diode region
211: SiC semiconductor device
221: SiC semiconductor device
231: SiC semiconductor device
θ: Off angle

The invention claimed is:

1. An SiC semiconductor device comprising:
a SiC semiconductor layer having a first main surface on one side and a second main surface on the other side;
an active region having an active surface as a part of the first main surface;
an outer region defined outside the active region and including an outer surface as a part of the first main surface;
a trench gate structure disposed in the active surface in the active region;
a plurality of field regions disposed in a surface layer portion of the outer surface in the outer region at intervals toward a periphery of the outer region side from the active region side, wherein intervals among the plurality of field regions are increased toward the periphery of the outer region from the active region; and
an interlayer insulating layer disposed on the first main surface extending towards the trench gate structure in the active region and covering the field regions in the outer region, wherein
the interlayer insulating layer has an oblique portion facing an active side wall on the first main surface and a first flat portion facing the field regions,
the oblique portion has a thickness approximately equal to a thickness of the first flat portion,
the interlayer insulating layer includes a second flat portion extending from the oblique portion towards the trench gate structure, and
the interlayer layer extends continuously from the oblique portion to the second flat portion.

2. The SiC semiconductor device of claim 1, wherein a thickness of the second flat portion is approximately equal to the thickness of the first flat portion and the oblique portion.

3. The SiC semiconductor device according to claim 1, wherein
the SiC semiconductor layer includes a hexagonal SiC monocrystal.

4. The SiC semiconductor device according to claim 3, wherein
the SiC semiconductor layer includes a 2H (Hexagonal)—SiC monocrystal, a 4H—SiC monocrystal, or a 6H—SiC monocrystal.

5. The SiC semiconductor device according to claim 3, wherein
the first main surface is formed by a c-plane of the SiC monocrystal.

6. The SiC semiconductor device according to claim 5, wherein
the trench gate structure has a side wall formed by an m-plane of the SiC monocrystal, a side wall formed by an a-plane of the SiC monocrystal, and a bottom wall formed by a c-plane of the SiC monocrystal.

7. The SiC semiconductor device according to claim 3, wherein
the first main surface has an off angle inclined at an angle of not less than 0 degrees and not more than 10 degrees with respect to a c-plane of the SiC monocrystal.

8. The SiC semiconductor device according to claim 1, wherein
the trench gate structure is formed in a grid shape in plan view.

9. The SiC semiconductor device according to claim 1, wherein
the trench gate structure is formed in a band shape in a plan view.

10. The SiC semiconductor device according to claim 1, further comprising:
an outer well region formed in the surface layer portion of the outer surface in the outer region, wherein
the field regions have a same conductivity type as a conductivity type of the outer well region and are formed in a region between the periphery of the outer region and the outer well region.

11. The SiC semiconductor device according to claim 10, wherein
the outer well region has a bottom portion that is positioned on the second main surface side with respect to a depth position of a bottom wall of the trench gate structure.

12. The SiC semiconductor device according to claim 1, wherein
the field regions each has a bottom portion positioned on the second main surface side with respect to a depth position of a bottom wall of the trench gate structure.

13. The SiC semiconductor device according to claim 1, wherein
the field regions have depths equal to each other.

14. The SiC semiconductor device according to claim 1, wherein
the active surface is formed at an interval from a periphery of the first main surface, and
the outer surface surrounds the active surface.

15. The SiC semiconductor device according to claim 1, wherein
the field regions each extends in a band shape along the active surface.

16. The SiC semiconductor device according to claim 1, wherein
the field regions each surrounds the active surface.

17. The SiC semiconductor device according to claim 1, further comprising:
a drift region formed in the surface layer portion of the outer surface, wherein
the field regions have a conductivity type different from a conductivity type of the drift region and are formed in a surface layer portion of the drift region in the outer region.

18. The SiC semiconductor device according to claim 1, wherein
an inclined angle that is formed between the active surface and the active side wall in the SiC semiconductor layer is more than 90 degrees and not more than 135 degrees.

* * * * *